United States Patent [19]

Marks, II

[11] Patent Number: 5,373,460

[45] Date of Patent: Dec. 13, 1994

[54] METHOD AND APPARATUS FOR GENERATING SLIDING TAPERED WINDOWS AND SLIDING WINDOW TRANSFORMS

[76] Inventor: Robert J. Marks, II, 1131 199th St. S.W., Lynnwood, Wash. 98036

[21] Appl. No.: 29,629

[22] Filed: Mar. 11, 1993

[51] Int. Cl.⁵ .................. G06F 15/31; G06F 15/00
[52] U.S. Cl. .................. 364/724.01; 364/724.07; 364/724.17; 364/726
[58] Field of Search .............. 364/724.01, 724.07, 364/724.11, 724.17, 724.2, 725, 726

[56] References Cited

U.S. PATENT DOCUMENTS

| | | | |
|---|---|---|---|
| 5,214,672 | 5/1993 | Eyuboglu et al. | 375/34 |
| 5,230,038 | 7/1993 | Fielder et al. | 395/2 |
| 5,297,557 | 3/1994 | Reichl | 128/707 |

*Primary Examiner*—Tan V. Mai
*Assistant Examiner*—Chuong D. Ngo

[57] ABSTRACT

A method and apparatus for the computation of sliding windows and sliding window Fourier transforms and spectrograms requiring fewer operations in comparison with the current art. The sliding windows are realized using infinite impulse response filters. If the impulse response of one filter is equal to the impulse response of a second filter after a period of time, the impulse responses can be canceled thereby resulting in a composite filter with an impulse response of finite length. In certain realizations, the infinite impulse filters have identical components. These components can be combined into a single component in the composite filter thereby reducing the required number of computational operations. Sliding windows thus realized are employed in the generation of sliding window Fourier transforms and spectrograms. The windows can be modulated or unmodulated. For unmodulated windows, the signal to be processed is first multiplied by a discrete oscillator tuned to the desired frequency of the sliding window Fourier transform or spectrogram. Modulated windows are realized with infinite impulse filters containing high frequency components and therefore do not require use of oscillators when used in sliding window Fourier transform and spectrogram circuitry. Sliding window Fourier transform and spectrogram circuitry, connected in parallel for evaluation of a number of frequency lines, can also share common circuitry, thereby significantly reducing computational and architectural overhead. Methods and apparatus for evaluation of temporally decimated sliding window Fourier transforms and spectrogram is achieved through iterative accumulation of intermediate results and downsampling.

21 Claims, 37 Drawing Sheets

Fig. 1.
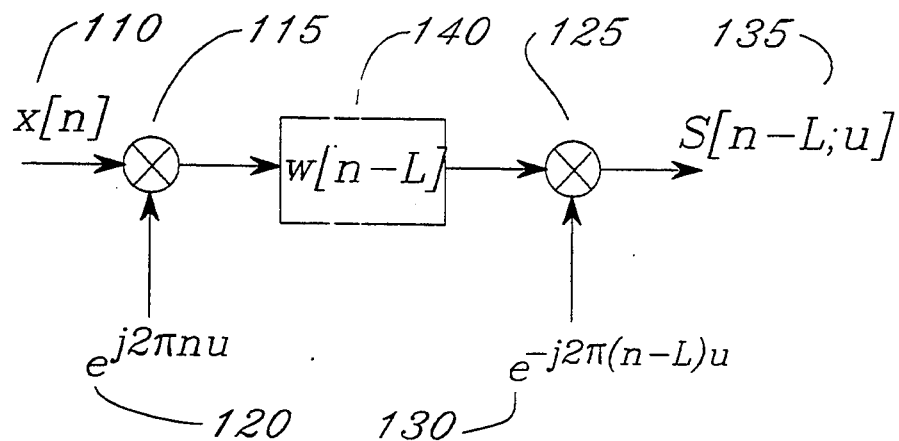
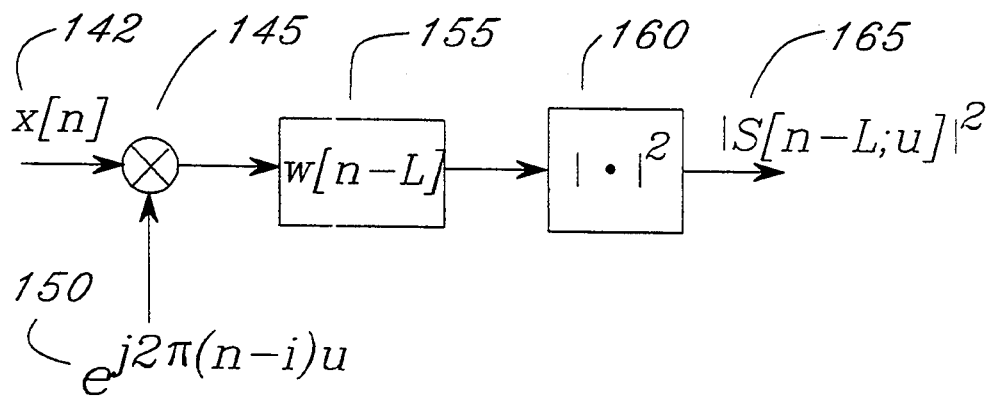
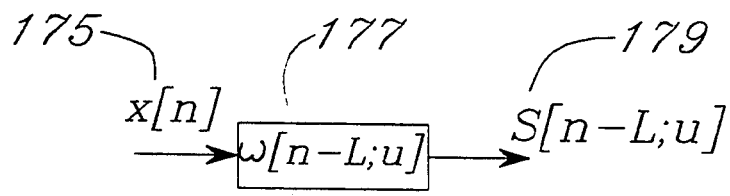
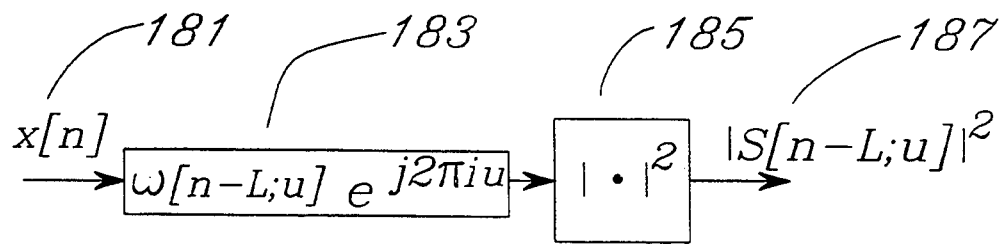

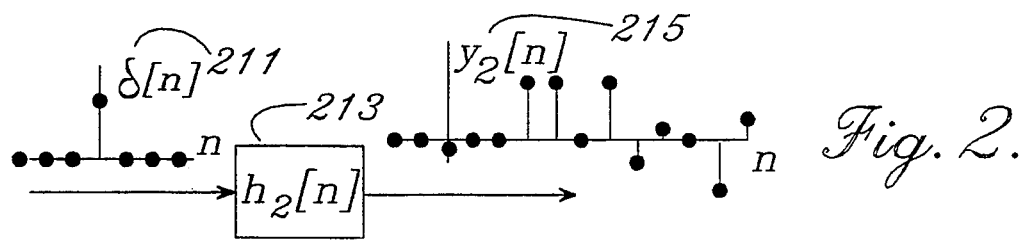
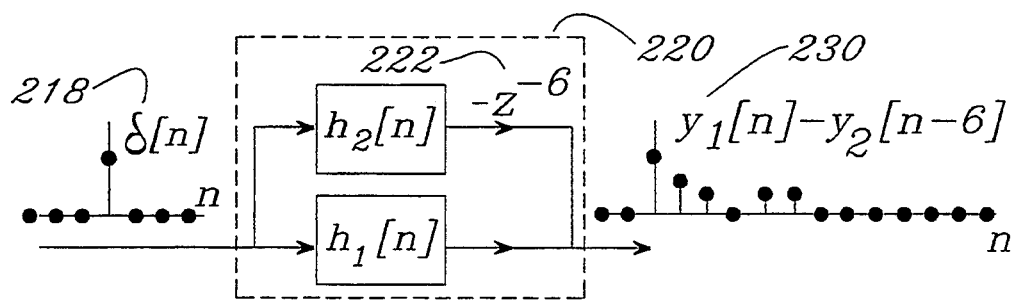
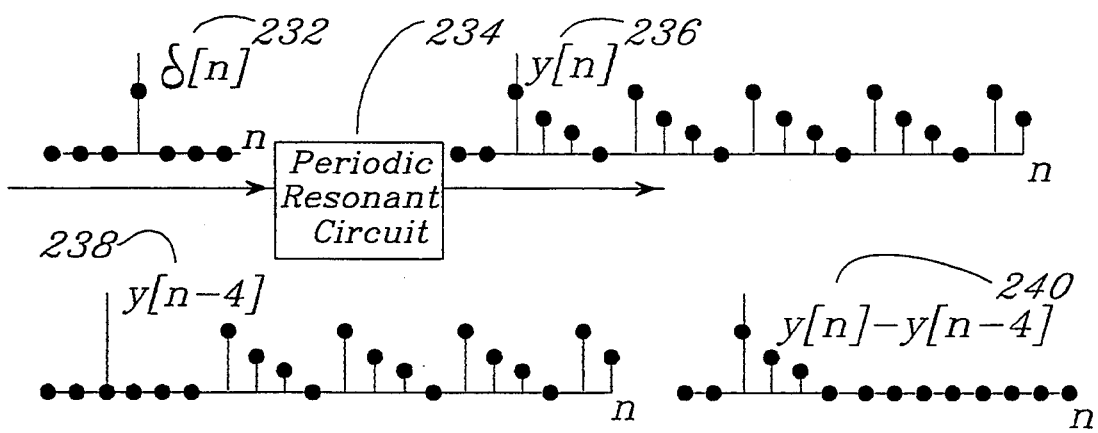
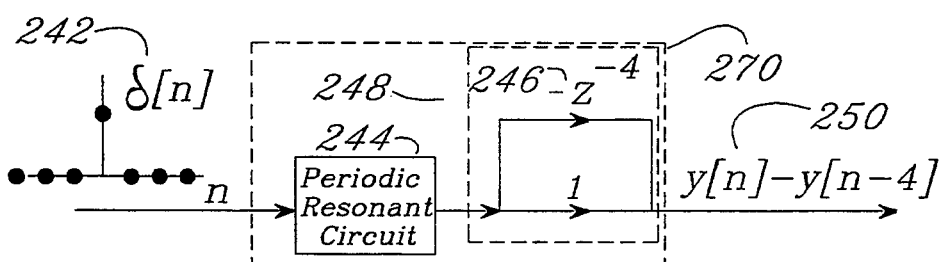
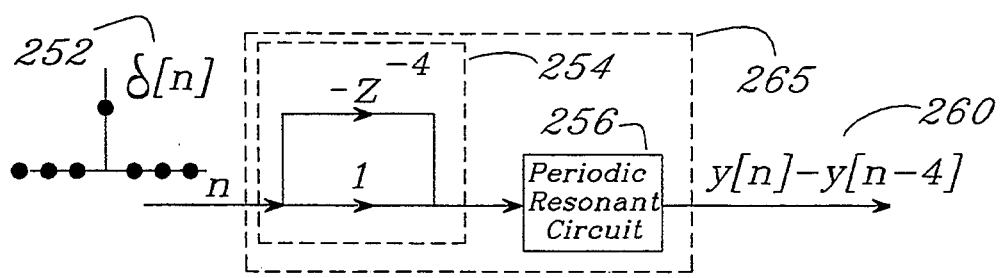
Fig. 2.

Fig. 7.
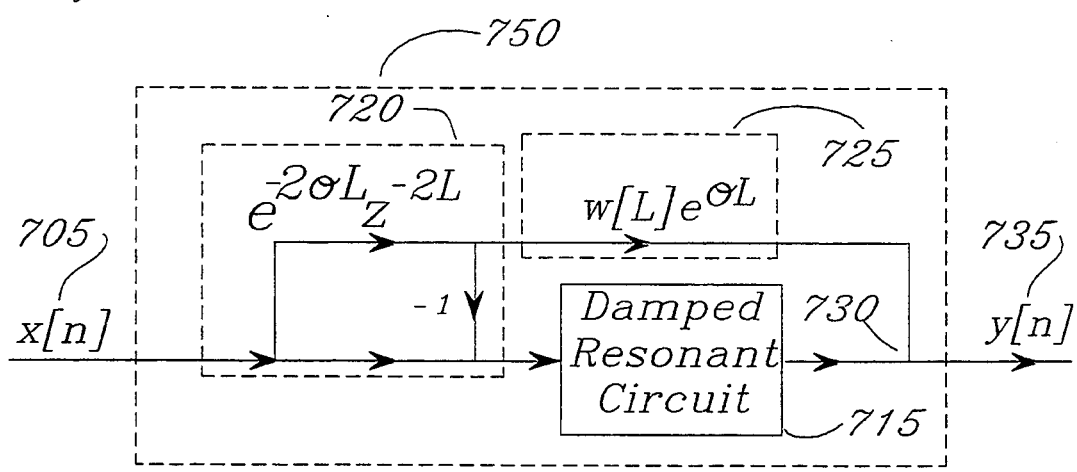
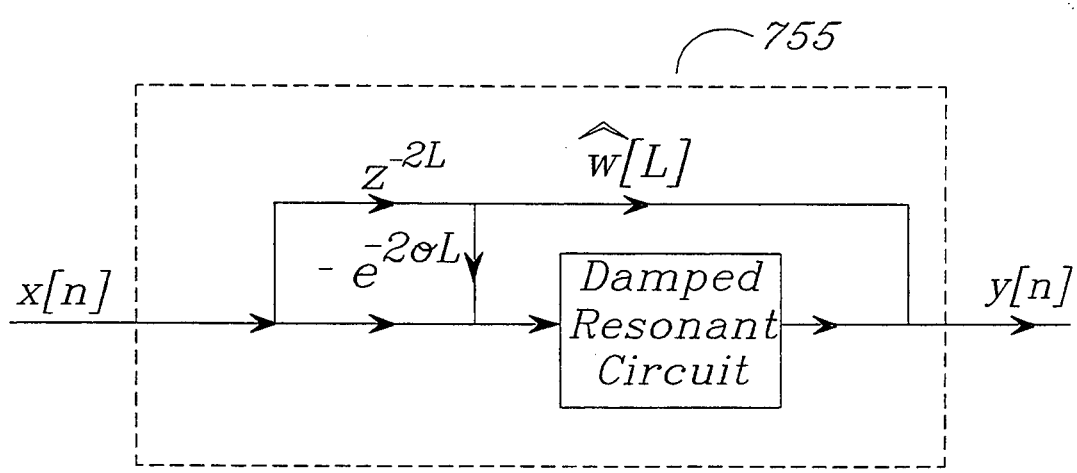

*Fig. 8.*
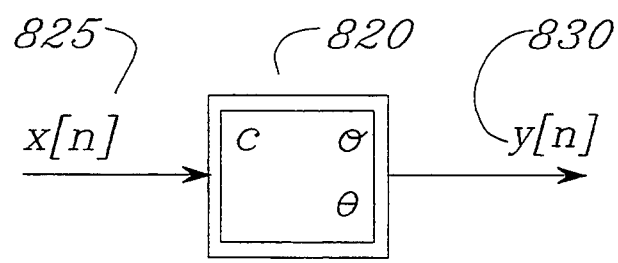
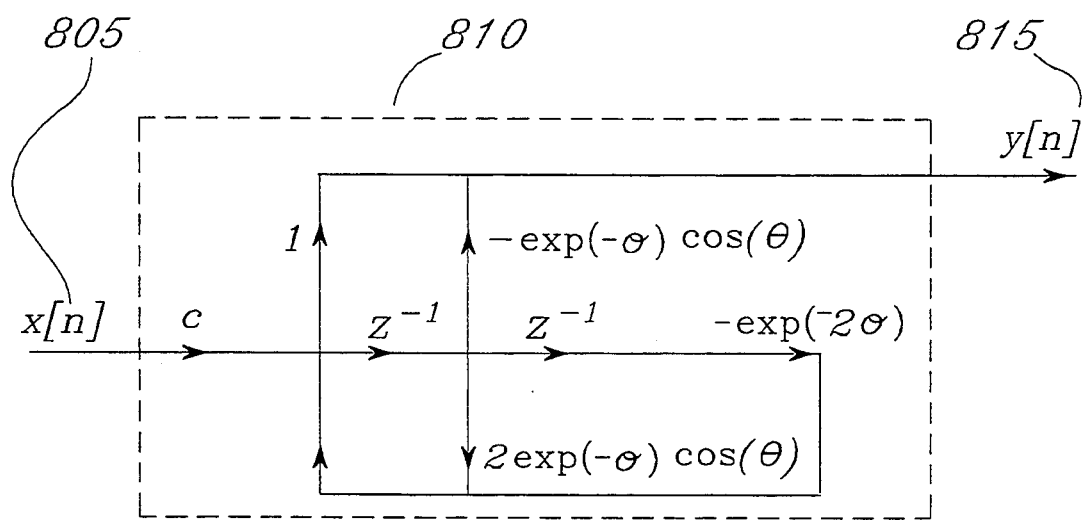

*Fig. 12.*
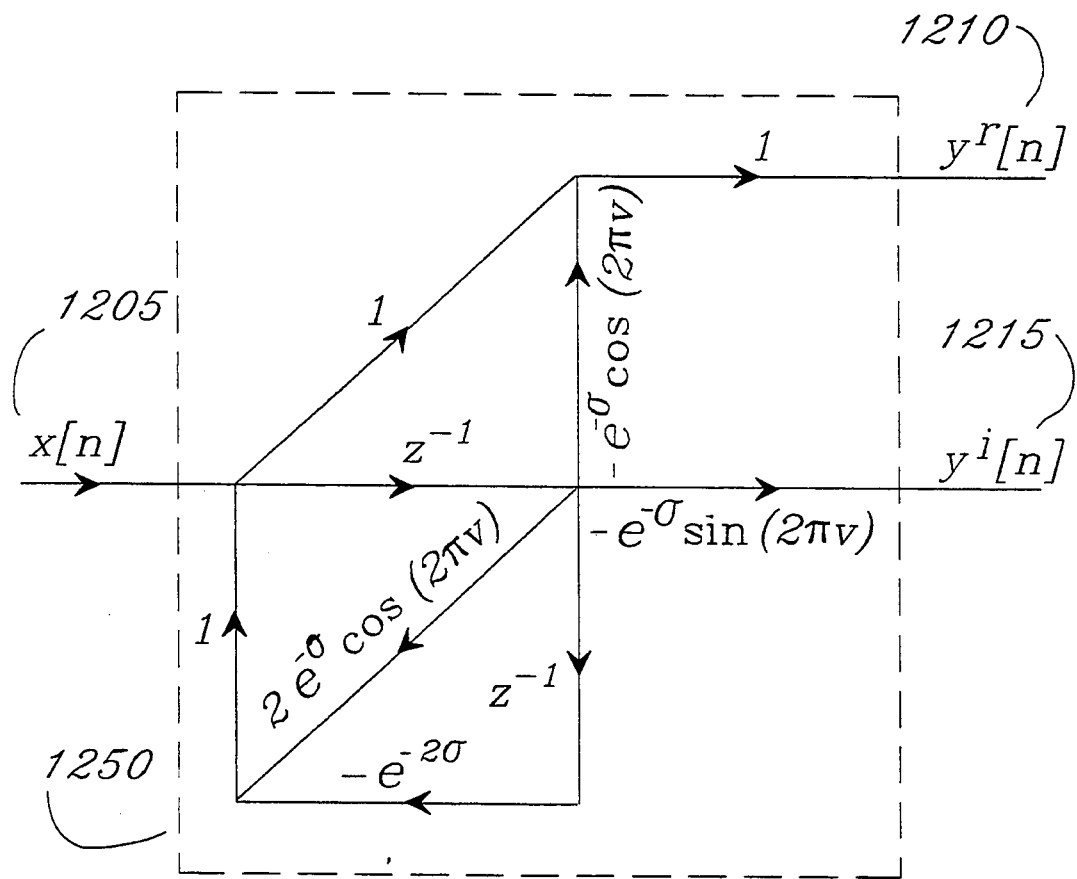
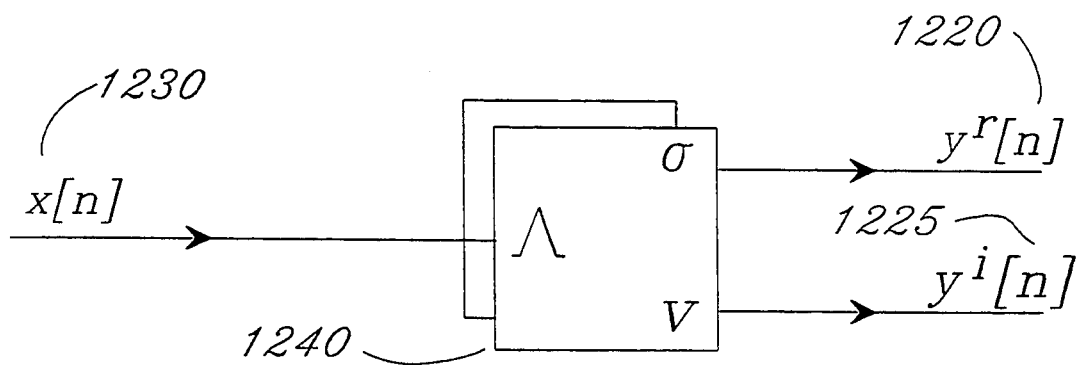

METHOD AND APPARATUS FOR GENERATING SLIDING TAPERED WINDOWS AND SLIDING WINDOW TRANSFORMS

TECHNICAL FIELD

This invention relates to methods and architectures for generating sliding window Fourier transforms and spectrograms, to methods and architectures for generating digital sliding tapered windows and similar impulse responses and to corresponding applications of these methods and architectures. Spectrograms and sliding window Fourier transforms are a common mode for representation of the frequency content of a temporal signal as a function of time. Windows are used in numerous digital signal processing (DSP) applications including architectures for spectrograms as well as for data smoothing and spectral estimation.

BACKGROUND OF THE INVENTION

Background Description

The theory of Fourier transformation is fundamental to many undergraduate engineering and science curricula. The Fourier transform is a method of transferring a time domain signal into the frequency domain. A time function can be represented by x(t) where t represents time (e.g., in seconds). If u represents the corresponding frequency variable, with units of cycles per second or Hertz, then X(u) is the representation of x(t) in the frequency domain. The most common way to obtain X(u) from x(t) is by the process of Fourier transformation. In human speech, for example, the Fourier transform of a man's voice will typically contain lower frequency components than a child's voice. Thus, the Fourier transform of a man's voice as represented, for example, by an electronic signal from a microphone would generally have a larger magnitude at lower frequencies than that of a child's voice. The concept of frequency applies to numerous other types of signals also. Electromagnetic waves in the visible spectrum have different colors corresponding to the frequency of the electromagnetic wave frequency (vibration). Thus, the magnitude of the Fourier transform of the temporal electromagnetic vibrations will, in the visible range, result in a plot of the color components of the signal.

As explained in the tutorial, by L. Cohen in "Time-frequency distributions—a review", *Proceedings of the IEEE,* vol. 77, pp. 941–981 (1989), there are many instances where there is a need to monitor the frequency components (or the Fourier transform) of a signal with respect to time. This is especially important when the character of the signal is changing with respect to time. Such signals are referred to as nonstationary signals. Common speech and music are both examples of nonstationary signals. A sound which does not change in time, such as an elongated tone or the roar from a waterfall, are examples of stationary signals. The temporally changing (i.e. nonstationarity) of colors during a sun set is an example of an electromagnetic nonstationary signal. The fundamental Fourier transform does not allow for the straightforward analysis of nonstationary signals. Other techniques, collectively called time-frequency representations (hereinafter TFR's), are required.

Note that humans perceive sound in both time and frequency. Music, for example, is written as a TFR. Notes can be viewed as a frequency representation. The placement of these notes side by side then represents a temporal sequence of frequency. Spectrograms are probably the most commonly used scientific TFR's for representation of signals. L. Cohen in "Time-frequency distributions—a review", *Proceedings of the IEEE,* vol. 77, pp. 941–981 (1989) discusses a class of generalized TFR's (hereinafter GTFR's). The zamogram of Zhao, Atlas and Marks reported in "Application of the generalized time-frequency representation to speech signals analysis", *Proceedings of the IEEE Pacific Rim Conference on Communications, Computers and Signal Processing,* pp. 517–519, Victoria, B. C. Canada, June 4–5, 1987 and in "The use of cone-shape kernels for generalized time-frequency representations of nonstationary signals", *IEEE Transactions on Acoustics, Speech and Signal Processing,* Vol. 38, pp. 1084–1091 (1990) is a GTFR with quite good resolution in both time and frequency that can be architecturally configured to use the sliding window Fourier transform as a component.

As discussed, for example, in A. Papoulis, Signal Analysis, McGraw Hill, New York (1977), sliding window Fourier transforms and spectrograms are conventionally computed using windows, such as Hanning, Hamming or Blackman windows. The choice of the window determines the properties of the sliding window Fourier transform or spectrogram well known to those skilled in the art. This patent contains computationally efficient methods and corresponding architectures for generating sliding window Fourier transforms and spectrograms.

Signals can either be continuous functions of time or can be a sequence of number generated from sampling a continuous time signal or a processed version thereof. Methods and architectures for processing continuous and discrete time signals are parallel topics. Indeed, the topics are many times taught simultaneously at the undergraduate electrical engineering level. Thus, although the methods and architectures of the present invention are described herein with respect to discrete time signals, they can be straight-forwardly extended to continuous time by one skilled in the art.

The sliding window Fourier transform of a discrete signal x[n], corresponding to a window, ω[k], is $$S[n;u] = \sum_{k=-L}^{L} w[k]x[n-k]e^{-j2\pi ku} \quad (1)$$

where u is the frequency variable and L parameterizes the duration of the window. The function $|S[n;u]|^2$ is called the spectrogram.

Temporally sliding windows can be viewed as filter impulse responses that are typically of finite duration. Windowing is used in other applications including data smoothing and finite impulse response (FIR) filter design.

Digitally, the Fourier transform can be computed using a discrete Fourier transform (DFT). DFT's can be used to generate short term Fourier transforms. When the duration of a signal to be transformed is long, the fast Fourier transform (FFT) computes the Fourier transform in significantly fewer operations (i.e. multiplications and additions). The FFT is also used in the generation of sliding window Fourier transforms and spectrograms. Typically, the sliding window Fourier transform or spectrogram is decimated in time. In other words, the output is not computed at each point in discrete time. Rather, the output is computed every few points in discrete time.

Recursive generation of rectangularly windowed sliding window Fourier transforms has been disclosed in U.S. Pat. No. 4,023,028 issued to Dillard on May 10, 1977. The basic ides of the sliding rectangular window is best introduced by the following example. Consider the series of numbers . . . 2,4,1,3,0,1,4,1,2,0. The sum of the bold numbers in the series . . . 2,4,1,3,0,1,4,1,2,0 is 14. The window is moved over one unit and the result is . . . 2,4,1,3,0,1,4,1,2,0. The new sum can, of course, be generated by adding the numbers again. More efficiently, however, the odd numbers (4) can be subtracted from the sum and the new number (2) added. This is the basic concept used in the sliding rectangular window generation of the sliding window Fourier transform. With slight modification, exponentially shaped windows can also be thus computed.

Both rectangular and exponential windows have limited application. As is summarized by W. S. Wu, K. F. Cheung and R. J. Marks II, "Multidimensional projection windows", *IEEE Transactions on Circuits and Systems*, vol. 35, pp. 1186–1172 (1988), the performance of a window is dictated by its resolution versus leakage tradeoff. The most commonly used windows display a balanced trade off between good time and frequency resolution. The rectangular and exponential windows do not. The rectangular window, for example, displays quite poor frequency leakage properties. More typically, the numbers within the window are multiplied by a symmetric array of numbers prior to summation. This array of numbers is referred to as a window. Commonly used windows are Hanning, Hamming and Blackman windows referred to above. This patent claims recursive computational methods and architectures for generation of such sliding window Fourier transforms using tapered windows.

SUMMARY OF THE INVENTION

The present invention is directed to methods and corresponding architectures for generating sliding tapered windows and similar impulse responses and their use in generating sliding window Fourier transforms and spectrograms. The sliding window, an impulse response of finite duration, is generated using two infinite impulse response (IIR) filters. The second filter, postponed through a delay line, cancels the response of the first to yield a composite impulse response that is finite in duration. The two filters may contain common processing elements. A specific embodiment of this architecture occurs when the second IIR filter is simply a delayed and possible weighted version of the first. Then a single IIR filter can be factored from each processor. The IIR filter, appropriately augmented with delay circuitry to coherently cancel the response of the filter beyond a specified time, can be used to generate the composite window impulse response. Such is the case when the required impulse response can be expressed as the superposition of causal, possibly damped, sinusoids with arbitrary phase.

A tapered window is herein defined as any window other than one consisting of a single exponential over a finite window or a window constructed through a cascading of two or more of these filters. Included in the definition are exponentials with zero exponent, corresponding to rectangular (or box car) windows. Such windows are known to have poor spectral leakage problems. Tapers are used on windows to improve spectral leakage properties.

When used as components in (non-temporally decimated) sliding window Fourier transform and spectrogram architectures, the sliding windows come in two types: modulated and unmodulated. Reference to a window herein without specification of type, either specifically or in context, will be to the unmodulated window. The IIR and delay components of the windows can be either joined or disjoint in the architecture. In all of the methods and embodiments described herein, the sliding window Fourier transforms or spectrogram processor may be used to monitor a single frequency line or generate frequency lines sequentially. The window shape can be changed in real time simply by an alteration of the filter parameters. Alternately, the processors can be placed in an array to generate the sliding window Fourier transform or spectrogram frequency lines in parallel with arbitrary (e.g. logarithmic) frequency bin spacing. The window shape and/or type can be changed from frequency line to frequency line or can be changed in real time. In this application, for example constant Q-type sliding window Fourier transforms and spectrograms can be generated.

In parallel embodiments, common circuitry, such as delay line and weightings, may be factored from the array so that a single circuit, common to each of the processor lines, can serve the entire array thereby reducing the overall computational requirements of the processor. The specific embodiments wherein the sliding window Fourier transform's or spectrogram's frequency spacings are uniform and/or integer multiples of the reciprocal of the window's duration require even less computation.

In the case where a periodic replication is canceled after one or more periods using a weighted delay, the output contribution corresponding to the end point of the window will not be forthcoming. Circuitry for end point correction can be applied to compensate for the final point of the window's contribution to the sliding window Fourier transform or spectrogram. In certain cases, however, end point correction need not be used in the architectures sine the contribution to the overall sliding window Fourier transform or spectrogram may be nonexistent (i.e. in the case where the window's end points are zero) or negligible.

The previously described methods are also applicable to the generation of time-decimated sliding window Fourier transforms and spectrograms. Data common to both of two temporally adjacent time decimated sliding window Fourier transform or spectrogram points in time is used to update the sliding window Fourier transform or spectrogram, as before, using weighted delay circuitry. The contribution of the new data introduced into the window and the old data which exits the window is evaluated using sliding window Fourier processing techniques some embodiments of which are in the public domain. Parallel embodiments using this method when the sliding window Fourier transform or spectrogram's frequency spacings are uniform result in architectural simplification since one component filter can contribute to more than one frequency line.

Any of the embodiments of the sliding window Fourier transform architecture can be used to generate the spectrogram. The term architecture is used in the most general sense, and includes not only hardware, but to the underlying method of computation. In certain instances, a particular architecture is presented to illustrate the application of the present invention in a family of architectures.

The sliding window Fourier transform and spectrogram generation methods and corresponding architectures described herein are applicable to the evaluation and display of sliding window Fourier transforms and spectrograms for acoustic, biological, electric, electromagnetic, electrochemical, mechanical and electromechanical waves. Such waves are used in fault detection, radar, speech analysis and synthesis, sonar, seismology, communication systems and medical diagnosis. Electromagnetic waves include those in the visible spectrum used, for example, in fiber optics communication. Other electromagnetic waves include those used in radio, computer, video and other communication signals; radar and lidar; and the outputs from electromagnetic imaging systems, such as microscopes or imaging systems found in cameras. Signals originating from biological waves include, but are not limited to, those from the cardiovascular and neurological systems of man and animal. Acoustic waves include those found in ultrasound imaging, speech and sonar. Sliding window Fourier transforms and spectrograms resulting from use of this method can also be used as templates for pattern recognition or as components in other signal processing architectures, such as architectures for computing TFR's whose evaluation requires the computation of a spectrogram.

Use of the methods described herein for software simulations and hardware or firmware implementations of sliding window Fourier transforms, spectrograms or other processors using sliding windows can result in simplification of computational and hardware requirements. Previous simulations, hardware and firmware make use either of discrete Fourier transform (DFT) methods, fast Fourier transform (FFT) methods or a bank of bandpass filters. The methods described herein fall into latter category. The infinite impulse response character of the methods described herein require significantly fewer operations than corresponding finite impulse response filters to implement filter banks, yet generate sliding window Fourier transforms and spectrograms that are numerically equivalent.

The resulting parallel character of the methods described herein allow for pipe line modular implementation in firmware and software. The reduction of the required number of operations results in a corresponding decrease in computational complexity for software, firmware and hardware. In addition, as discussed elsewhere herein, the methods described herein are more flexible in terms of window choices and frequency bin spacings. Although DFT methods have these two advantages, the computational overhead can be prohibitively high.

BRIEF DESCRIPTION OF THE DRAWINGS

The foregoing and advantages of the present invention will be more readily appreciated as the same become better understood from the detailed description of the preferred embodiments when taken in conjunction with the following drawings, wherein:

FIG. 1 is a schematic representation of methods for generating sliding window Fourier transform and spectrograms using either unmodulated or modulated windows.

FIG. 2 is a schematic representation of methods by which a window or finite duration can be obtained by coherent cancellation of the response of an IIR circuit beyond a certain point in time.

FIG. 7 is a schematic representation of methods for generating a sliding window Fourier transform using a filter with the impulse response of a damped window as taught by the present invention.

FIG. 8 is a schematic representation of a digital circuit for generating a damped cosinusoidal response.

FIG. 12 is a schematic representation of a Λ filter using real multiples for real inputs.

using an disjoint unmodulated window and a single delay line.

Figure 29:
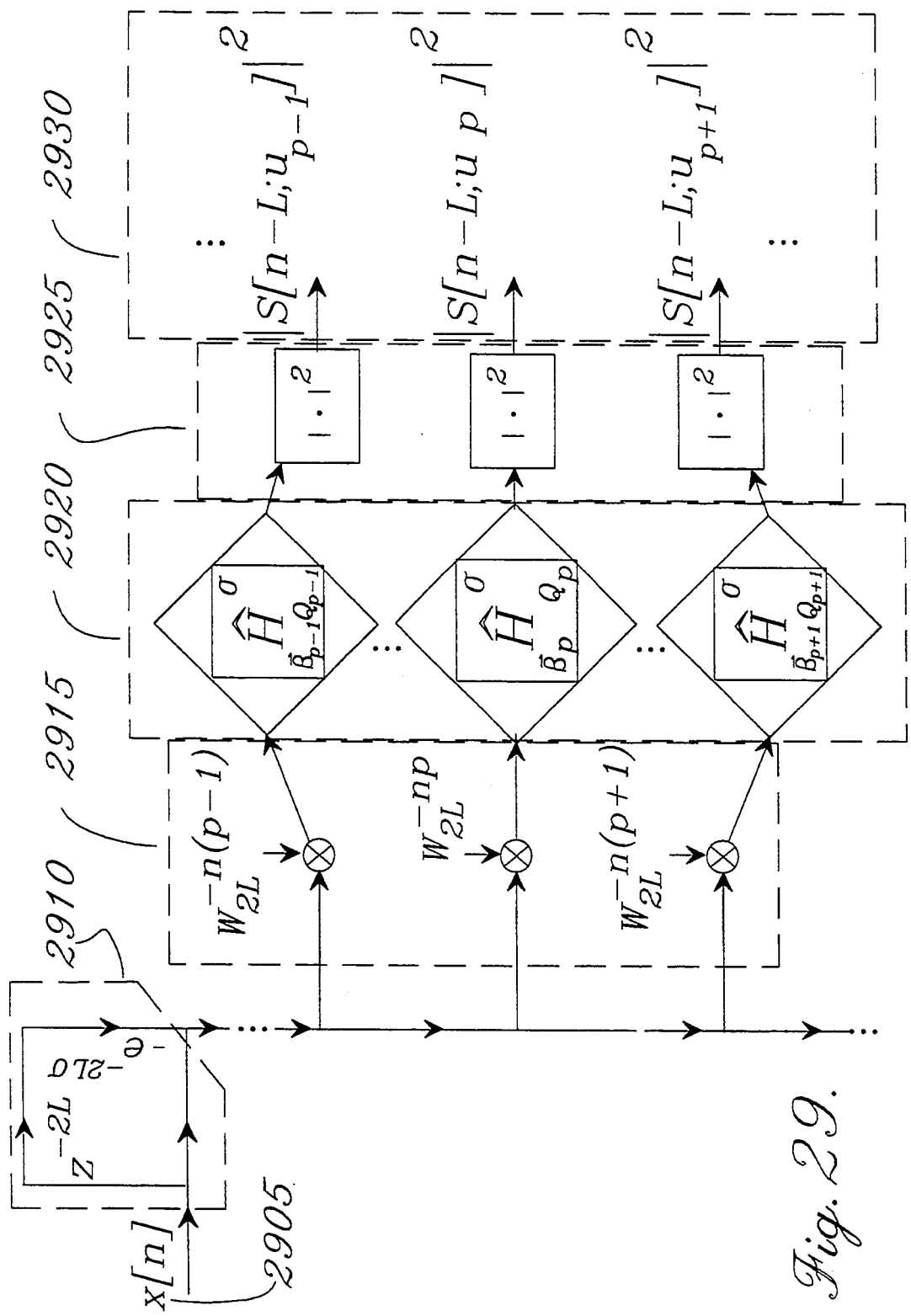

FIG. 29 is a schematic representation of the parallel generation of a spectrogram without end point correction when the frequency bins are at $$u_p = \frac{p}{2L}$$

using a disjoint unmodulated window and a single delay line.

Figure 30:
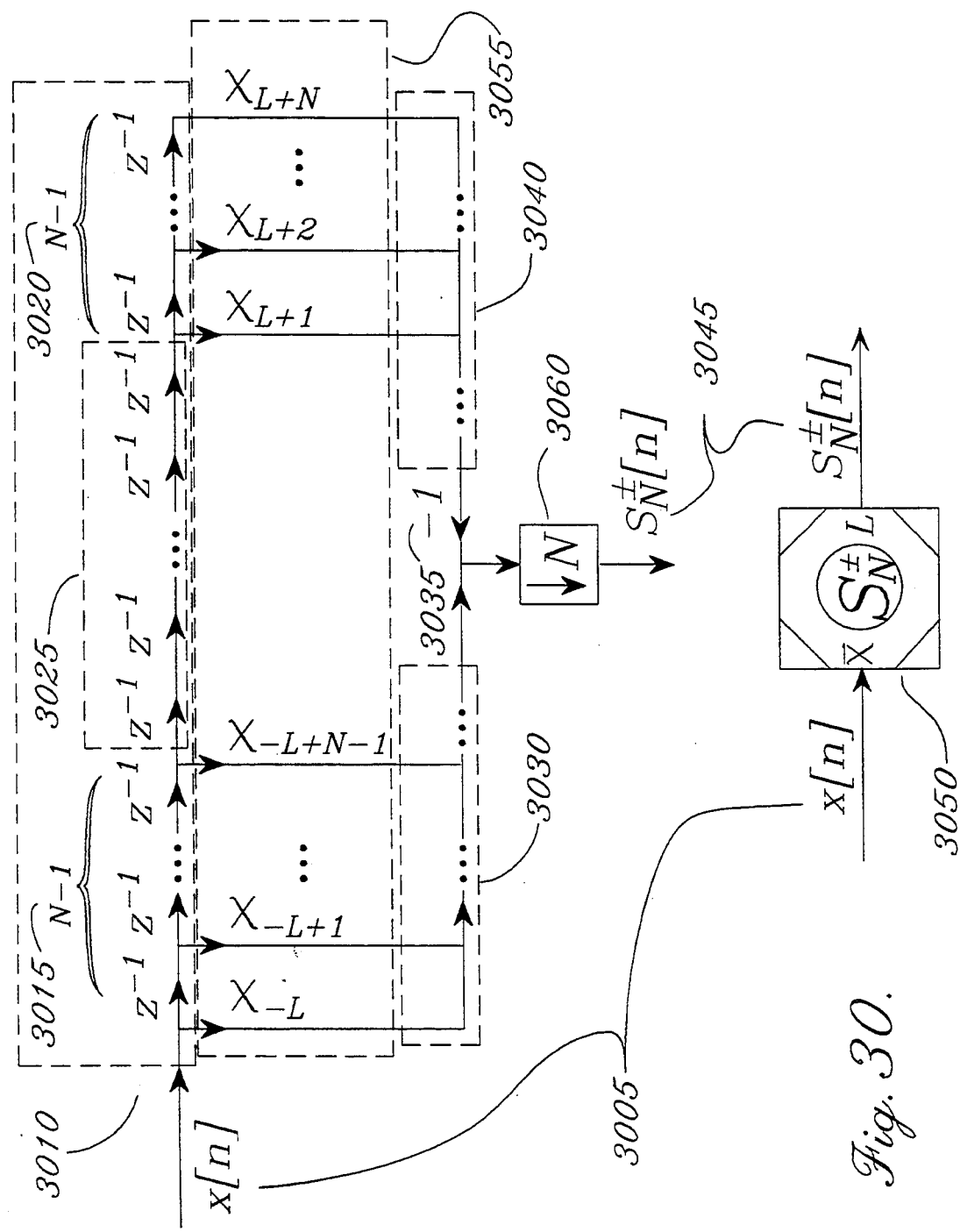

FIG. 30 is a schematic representation of a sliding window Fourier analysis digital signal processor to add the contributions of new data to and subtract the contributions of old data from a time decimated sliding window Fourier transform processor.

Figure 31:
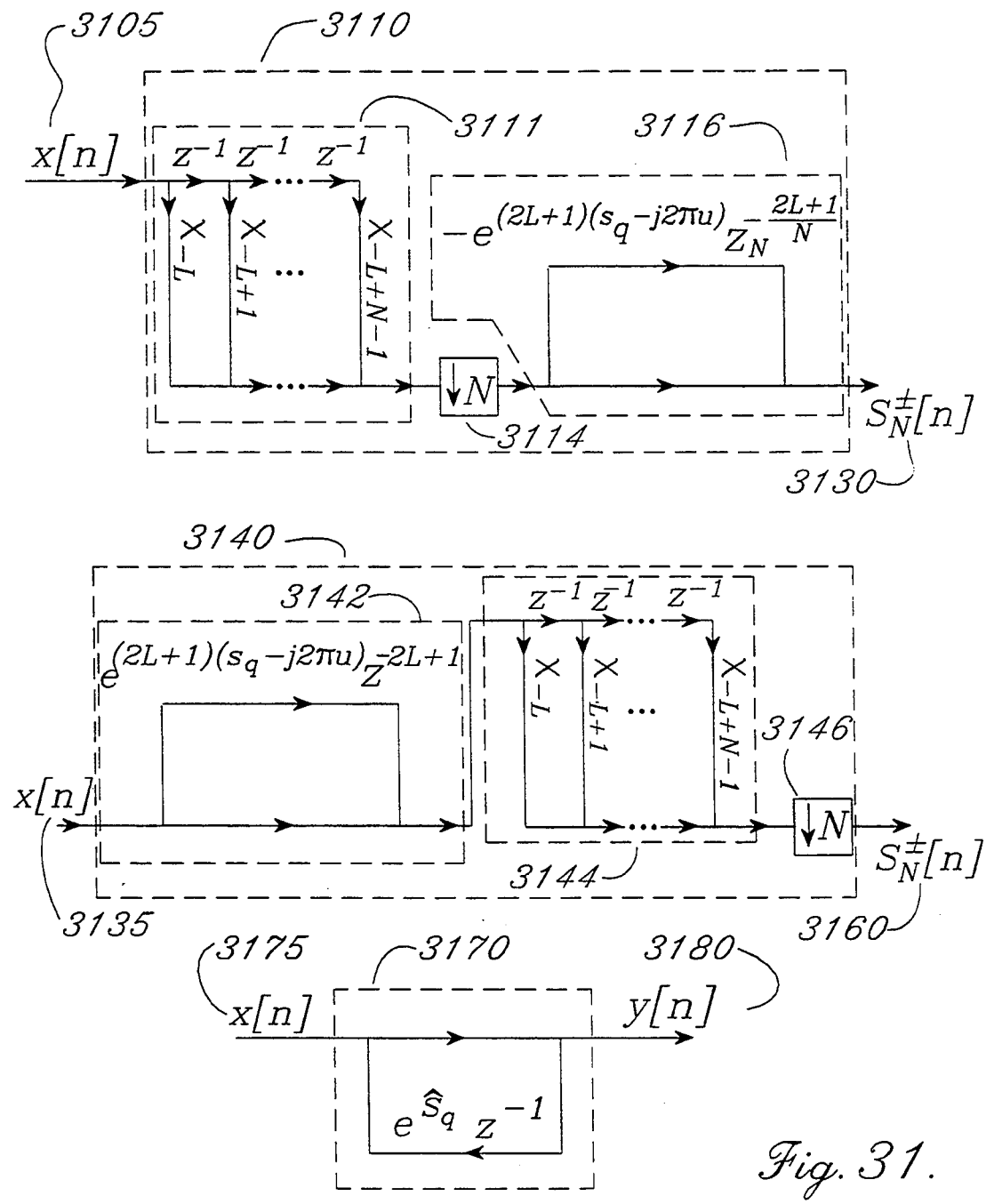

FIG. 31 is a schematic representation of IIR filter embodiments for sliding window Fourier analysis digital signal processors to add the contributions of new data to and subtract the contributions of old data from a time decimated sliding window Fourier transform processor. Here $\hat{s}_q = s_q = j2\pi u$.

Figure 32:
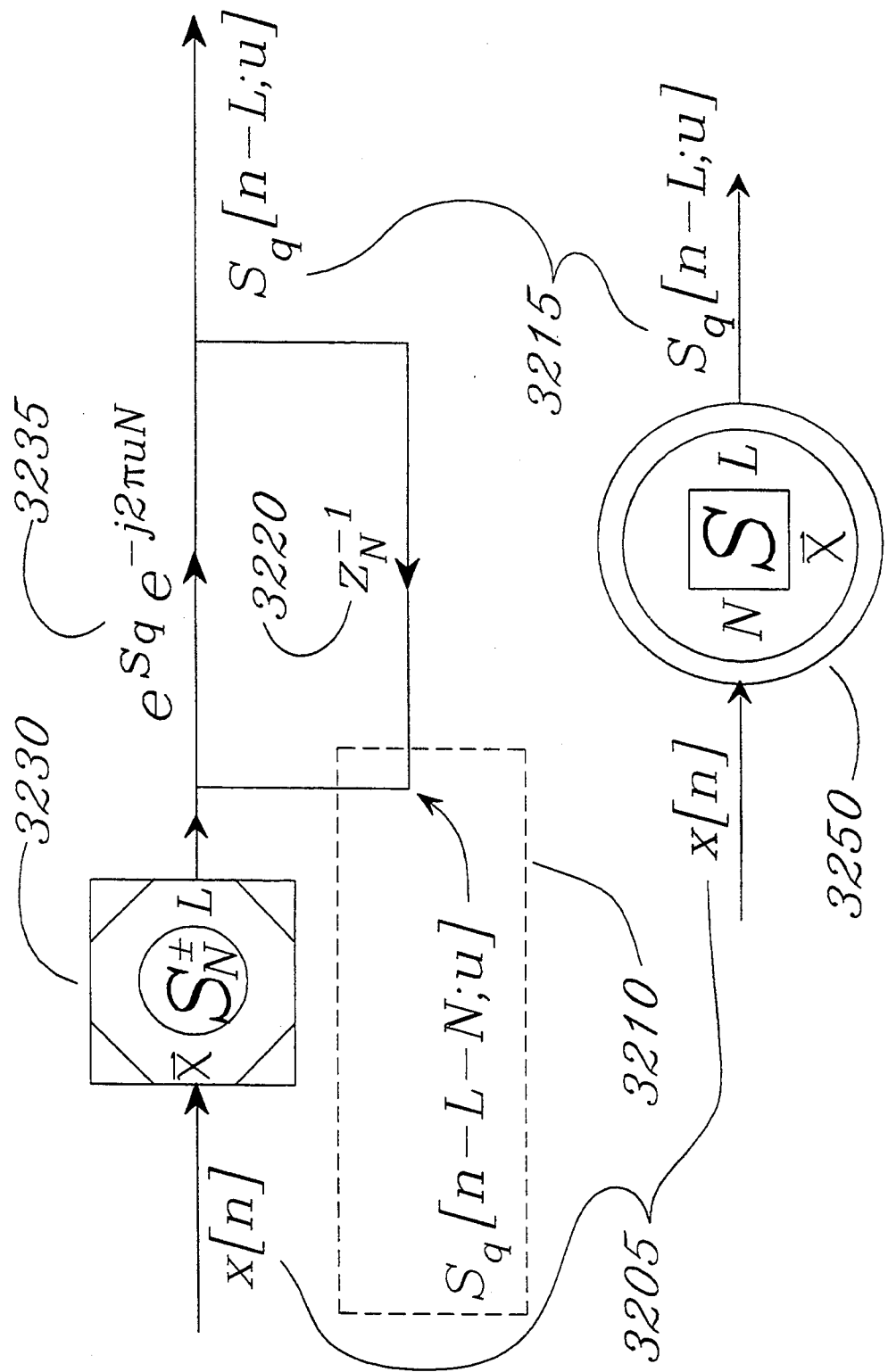

FIG. 32 is a schematic representation of an architecture for the generation of Szasz component of time decimated sliding window Fourier transform using sliding window Fourier analysis processors and weighted delay circuitry. The schematic representation of the operation is shown.

Figure 33:
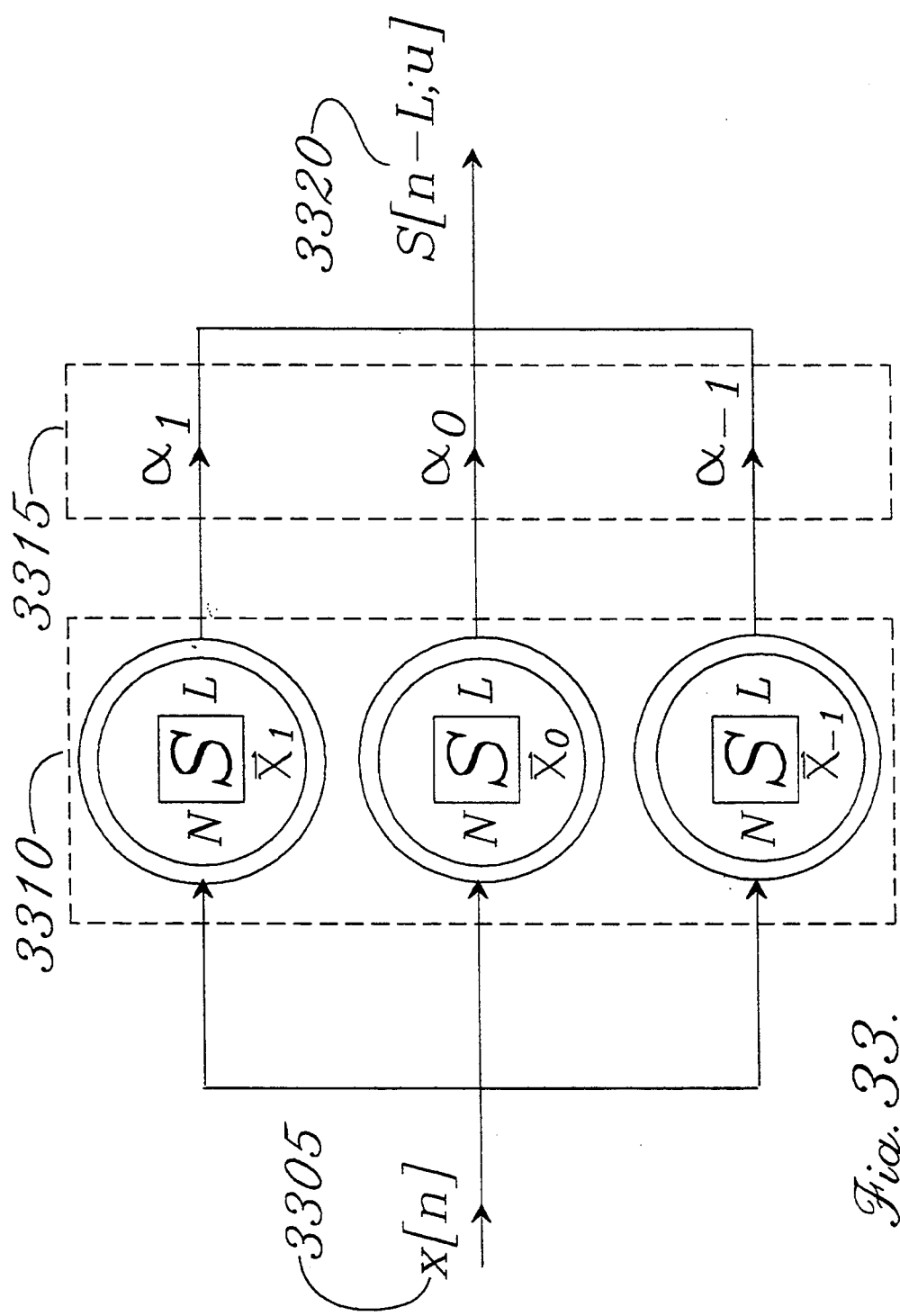

FIG. 33 is a schematic representation of a parallel connection of three weighted Szasz sliding window Fourier transform components to generate a spectrogram line when the window is a Q=1 Szasz series (e.g. Hamming and Hanning windows).

Figure 34:
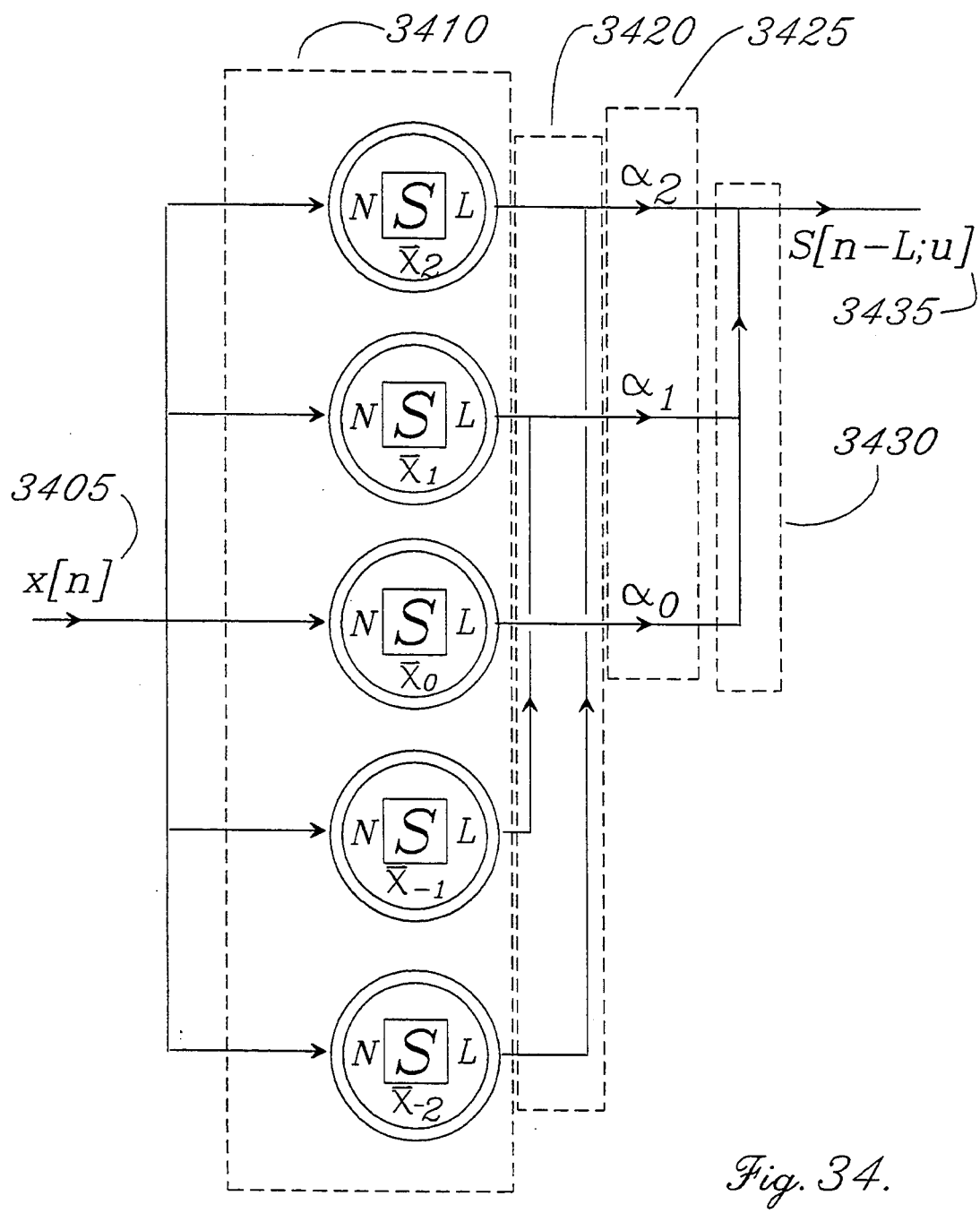

FIG. 34 is a schematic representation of a parallel connection of three weighted Szasz sliding window Fourier transform components to generate a sliding window Fourier transform line when the window is a Q=1 Szasz series wherein the symmetry of the Szasz coefficients is used to reduce the computational requirements over a nonsymmetric case.

Figure 35:
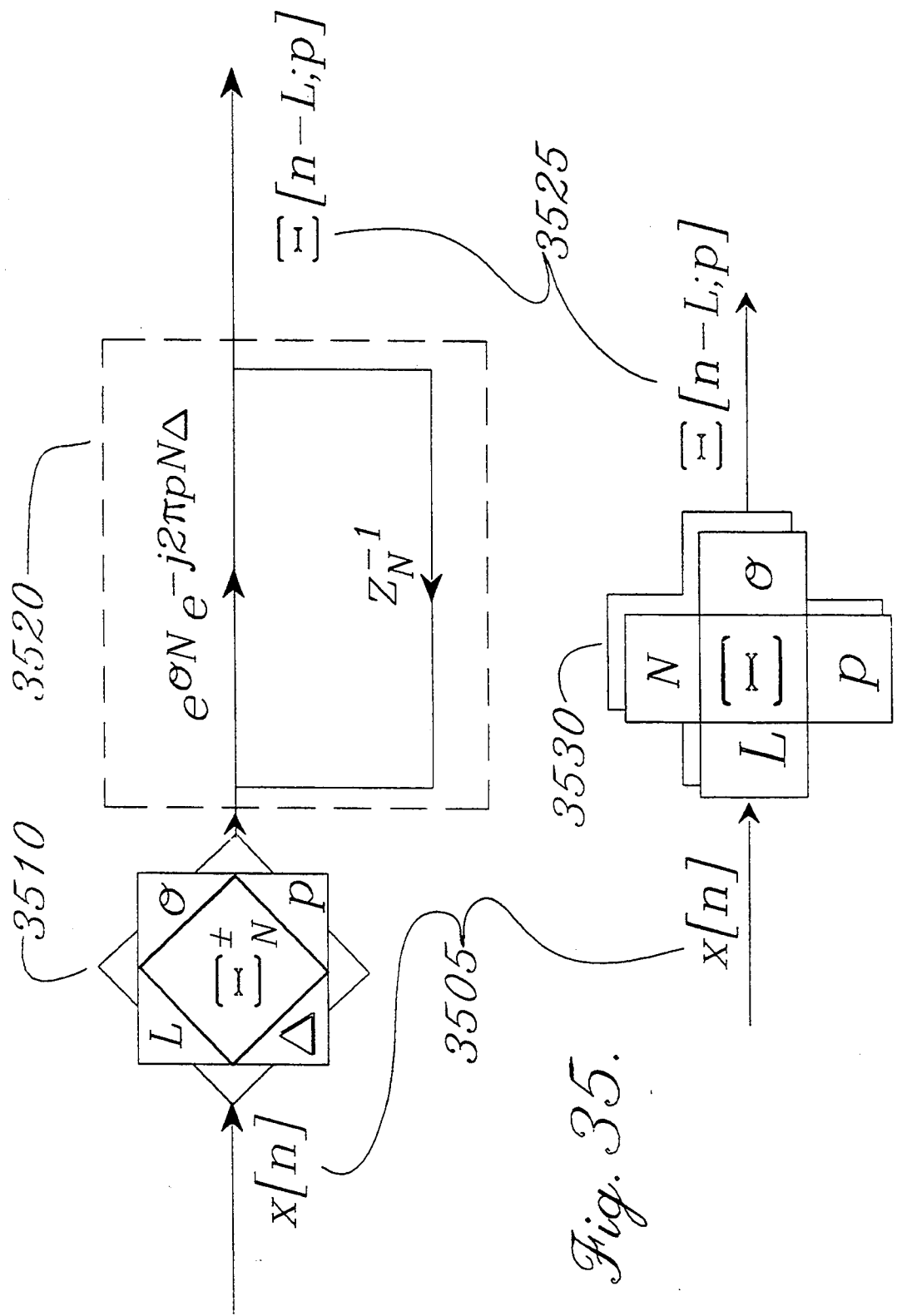

FIG. 35 is a schematic representation of an architecture for a $\Xi$ (xi) filter and its schematic representation.

Figure 36:
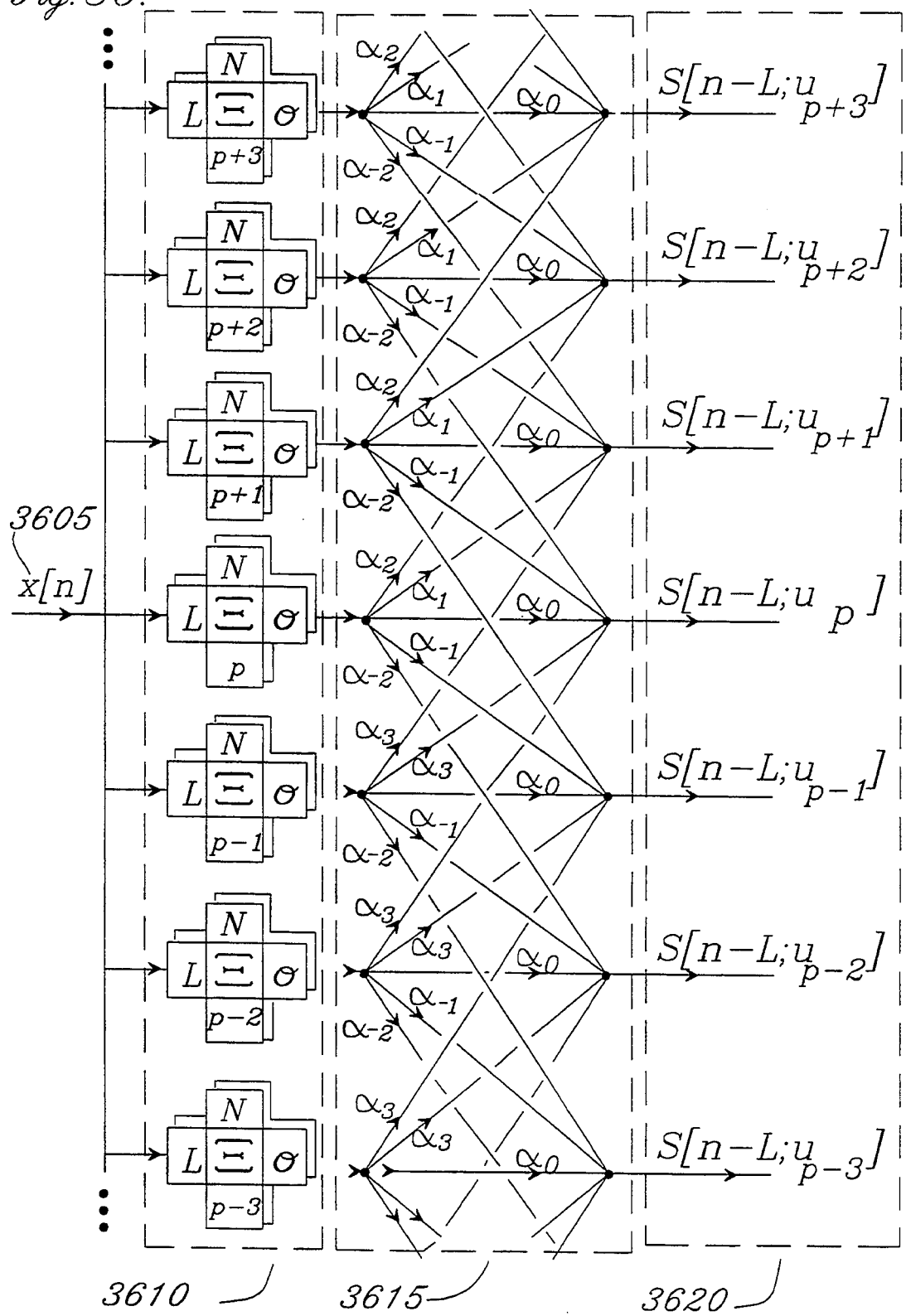

FIG. 36 is a schematic representation of a bank of $\Xi$ filters to generate output sliding window Fourier transform lines when the frequencies are equally spaced and the desired window if a Szasz series of order Q=2.

Figure 37:
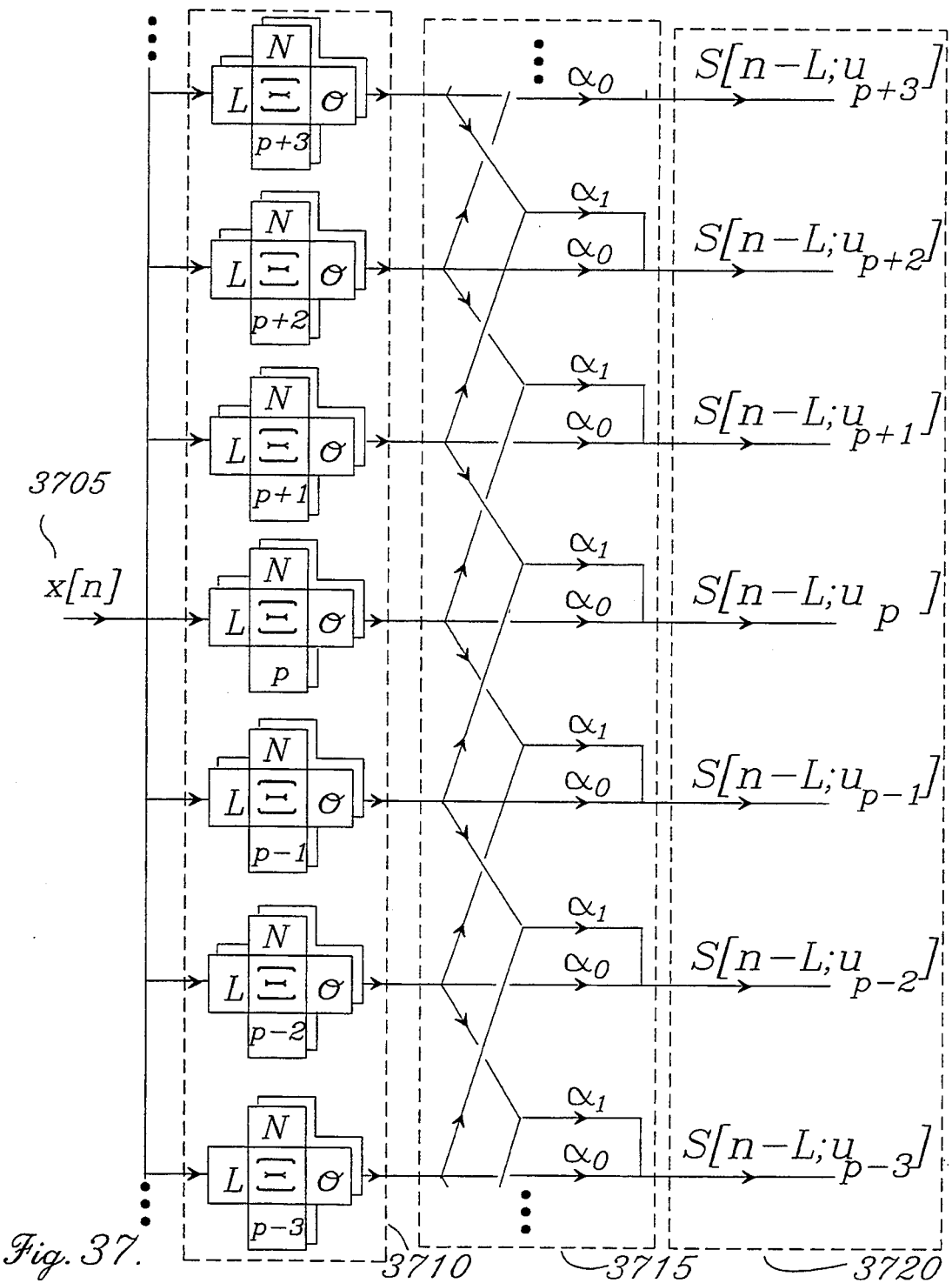

FIG. 37 is a schematic representation of a bank of $\Xi$ filters to generate output sliding window Fourier transform lines when the frequencies are equally spaced and the desired window if a Szasz series of order Q=1 and the Szasz series coefficients are symmetric.

DETAILED DESCRIPTION OF THE INVENTION

Representative embodiments of the methods and architectures formed in accordance with the present invention for generating impulse responses of finite duration are depicted and described herein. The resultant impulse responses of finite duration generated in accordance with the present invention by using coherent cancellation of the response of an infinite impulse response (IIR) filter after a given interval of time are customarily referred to as windows when applied to generating sliding window Fourier transforms and spectrograms. Methods of using such filtering in generation of sliding window Fourier transforms and spectrograms are also described.

Interpretation of Schematics for Signal Flow. A number of signal flow diagrams in schematic representation that are used to characterize digital signal processing (DSP) computational architectures. Signals flow in the direction of the arrows. A number, a variable or a combination thereof, written directly adjacent to an arrow means that the signal is weighted (multiplied) by that quantity with two exceptions. One exception is the notation $Z^{-J}$ which, from the theory of z transforms, means that the signal is delayed for J time units. The second exception is at the input or the output of the processor when the notation by the arrow is, respectively, the processor's input and output signal. In subprocessors, the input will typically be denoted by the sequence, x[n], and the output by y[n]. Also, x[n] will generally denote the signal for which the sliding window Fourier transform or spectrogram is computed.

At other than the input and output, a combination, such as $(1+j)z^{-3}$, where j is the square root of $-1$, means that the signal is multiplied by the complex number $1+j$ and is delayed by 3 units of time. This, or course, is equivalent to the weighing and then delaying. If no number, variable, shift or combination thereof appears adjacent to an arrow, then the signal is unaffected (i.e. multiplied by 1). The signal coming from a node (a point where two or more signals meet) is equal to the sum of signals going into a node. If more than one signal comes from a node, each has a value of the sum of the signals coming into the node. Time decimation is denoted by a boxed $\downarrow$ N where N is the decimation order. Repeatedly used circuits will be defined as appropriately parameterized block processing elements. Portions of processors may be isolated using a dashed line closed curve, such as a box or circle, in order to be referenced in the text. These and other computational components of the description will be described as circuitry or a circuit. These terms are used in their broadest sense and are hereby deemed to refer not only the to physical hardware associated with the computation, but to the underlying method as well.

Manners of implementation of these flow diagrams are well know to those well versed in the art. Arithmetic operations are straightforwardly performed on commercially available APU's (arithmetic processor units) and DSP (digital signal processing) chips. Delay lines can be straightforwardly performed using digital shift registers, as is required in commonly used finite impulse response (FIR) and infinite impulse response (IIR) digital filters. Alternately, custom VLSI (very large scale integration) integration chips can be designed to perform the operations taught by this patent.

Sliding window Fourier Transforms and Spectrograms Using Filters. The sliding window Fourier transform in Eq. 1 can be written as $$S[n;u] = e^{-j2\pi nu} \sum_{k=-L}^{L} w[k]x[n-k]e^{j2\pi(n-k)u}$$
$$= e^{-j2\pi nu} \times \{(x[n]e^{j2\pi nu})*w[n]\} \quad (2)$$

where * denotes the convolution operation and the window is implicitly assumed to be zero outside of the interval $-L \leq n \leq L$. As written in Eqs. 1 and 2, the operations are not causal. Causality can be achieved by delaying the output L units in which case Eq. 2 is altered to $$S[n-L;u] = e^{-j2\pi(n-L)u}\{(x[n]e^{j2\pi nu})*\omega[n-L]\} \quad (3)$$

A method of performing this operation using complex arithmetic is shown at the top of FIG. 1. The input signal, x[n] 110, is multiplied 115 by a complex sinusoid 120. The produce then serves as the input into a digital filter 140 with impulse response, $\omega[n-L]$. For reasons which will be made clear, this impulse response will be referred to as an unmodulated window. The filter output is multiplied 125 by a temporally varying complex sinusoid 130 to produce the sliding window Fourier transform 135. The post multiplication term 130 is $\exp(-j2\pi(n-L)u) = \exp(-j2\pi nu) \times \exp(j2\pi Lu)$. The term $\exp(j2\pi Lu)$ term, could be moved from the postmultiplication 125 term 130 to the premultiplication 115 term 120, or, for that matter, could be a weight at any point in the signal flow.

In many cases of interest, the spectrogram is needed. The square of the magnitude of Eq. 3 can be written as $$|S[n-L;u]|^2 = |(\omega[n-L]e^{j2\pi(n-i)u})* x[n]|^2 \quad (4)$$

where, if s=e+jk, and both e and k are real, then $|s|^2=e^{2}$ $k^2$. The real number i is arbitrary. It's effect along with the post multiplying complex sinusoid 130 is annihilated by the magnitude squared operation since, for real $\rho$, the relation $|\exp(-j2\pi n\rho)|=1$ follows. When only the spectrogram is required, a processor shown in FIG. 1 can be used. An input 142 is again premultiplied 145 by a complex sinusoid 150. The product is fed into a digital filter 155, the impulse response of which is the desired shifted window, $\omega[n-L]$. The magnitude squared operation 160 is performed on the filter's output. The result of this operation is the spectrogram 165 as given in Eq. 4

The sliding window Fourier transform in Eq. 1 can also be written as $$S[n;u] = \omega[n;u]*x[n] \quad (5)$$

where the modulated window, $\omega[n;u]$, is $$\omega[n;u] = \omega[n]e^{-j2\pi nu} \quad (6)$$

By shifting the output L units, the operation is made causal. Then, Eq. 5 becomes $$S[n-L;u] = \omega[n-L;u]*x[n] \quad (7)$$

As shown in FIG. 1, an embodiment of architecture to generate the sliding window Fourier transform corresponding to Eq. 7 simply requires that the input 175 be fed into a digital filter the impulse response of which is the modulated window 177. The output 179 is then the desired sliding window Fourier transform.

The spectrogram corresponding to Eq. 7 is $$|S[n-L;u]|^2 = |(\omega)n-L;u]e^{j2\pi iu})*x[n]|^2 \quad (8)$$

where, as before, i is an arbitrary phase term. The input 181 is fed into a filter 183 with impulse response $\omega[n;u]\exp(j2\pi iu)$. The filter's output is magnitude squared 185 to generate the spectrogram 187.

Windows From Coherent IIR Cancellation. The present invention is directed to methods for generating the windows and similar filters with finite temporal duration whose impulse responses are generated by the coherent cancellation of the response of an IIR filter beyond a certain point in time. A general overview of this operation is shown at the top of FIG. 2. A discrete impulse (or Kronecker delta), $\delta[n]$, is one for n=0 and is zero otherwise. The response 209, $y_1[n]$, to a Kronecker delta 205 input into a digital filter 207 with impulse response $h_1[n]$, is shown and, appropriately, is termed the filter's impulse response. Clearly, $y_1[n] = h_1[n]$. A filter will either be referred to by its impulse response or by its transfer function. If the filter's impulse response is not finite in duration, it is appropriately termed an IIR filter.

Consider a second IIR filter 213, $h_2[n]$, whose response 215 to a Kronecker delta 211 is $y_2[n] = h_2[n]$. Furthermore, assume that, for $n \geq 6$, $$y_2[n-6] = y_1[n] \quad (9)$$

In other words, shifting $y_2[n]$ six units to the right in discrete time yields an identical signal to $y_1[n]$ for $n \geq 6$.

Two filters can then be connected together in parallel with $h_2[n]$ connected in series with a delay line 222 of six units. The delay line, as shown, also inverts the signal (i.e. multiplies it by $-1$). The result, then, is a composite filter 220 whose response 230 to an impulse 218 is equal to $y_1[n]$ for $n<6$ and is zero for $n \geq 6$. The response of $h_1[n]$ has been coherently canceled by the delayed response of $h_2[n]$.

As an example, consider the impulse response of the following IIR filter.

$$h_1[n] = \sum_{r=1}^{R} \phi_r n^{i_r} e^{s_r n} \mu[n] \quad (10)$$

where the $\rho_r$'s and $s_r$'s are constants, possibly complex, the $i_r$'s are finite nonnegative integers and $\mu[n]$ is the unit step function (=1 for $n \geq 0$ and 0 otherwise). Such a filter can straightforwardly be crafted by one skilled in the art. An IIR filter with impulse response $$h_2[n] = \sum_{r=1}^{R} \phi_r(n+N)^{i_r} e^{s_r(n+N)} \mu[n],\qquad(11)$$

can likewise be constructed. Indeed, some of the same circuitry used in Eq. 10 can be made common to both $h_1[n]$ and $h_2[n]$. Both $h_1[n]$ and $h_2[n]$ are fed the same input. The output of $h_2[n]$ is placed into a delay line of duration N. The delay line output is subtracted from the output of $h_1[n]$ to produce a filter the composite impulse response of which is $$h[n]=h_1[n]-h_2[n-N].\qquad(12)$$

The impulse response, $h[n]$, is equal to that of $h_1[n]$ for $0 \leq n \leq N-1$ and is zero thereafter.

Periodic impulse responses. Coherent cancellation can be straightforwardly achieved if the filter $h_1[n]$ has a causal periodic response. The filter is then referred to as a periodic resonant circuit. To illustrate use of this method, suppose that, in FIG. 2, the response 236 to an impulse input 232 to a periodic resonant circuit 234 has a period, as shown, of four. Thus, for $n \geq N$ and N an integer, $y[n-4N]=y[n]$. To cancel this impulse response for $n \geq 4$, and second filter, $h_2[n]$, is required whose impulse response is $y[n-4]$ 238. This can be done by delaying the response of the periodic resonant circuit 234 by four units. Therefore, the periodic resonant circuit 244 can be connected in cascade with delay line circuitry 248 (containing an inverting four unit delay line 246) so that its impulse response coherently combines with a delay of the same impulse response. The result is a circuit whose response 250 to an impulse 242 is the desired $y[n]-y[n-4]$. As shown, the composite impulse response 240 is finite in duration. The specific case of $y[n]=$constant (corresponding to a rectangular window) has been reported in the open literature.

Since both the delay circuitry 248 and the periodic resonant circuit 244 are linear time invariant circuits, their order may be reversed without affecting the composite impulse response. In other words, as illustrated at the bottom of FIG. 2, if the delay circuitry 254 is placed prior to the periodic resonant circuit 256 then the response 260 of the composite filter to an input of a Kronecker delta 252 is the same 250 as when the order is reversed.

There may exist in the impulse response other symmetries that allow variations on such coherent cancellation. For example, an impulse response of $$h[n]=\sin(\pi n/N)\mu[n]\qquad(13)$$

added to the same impulse response deleted N units results in a composite impulse response that is the first positive half cycle of the sin only.

Figure 3:
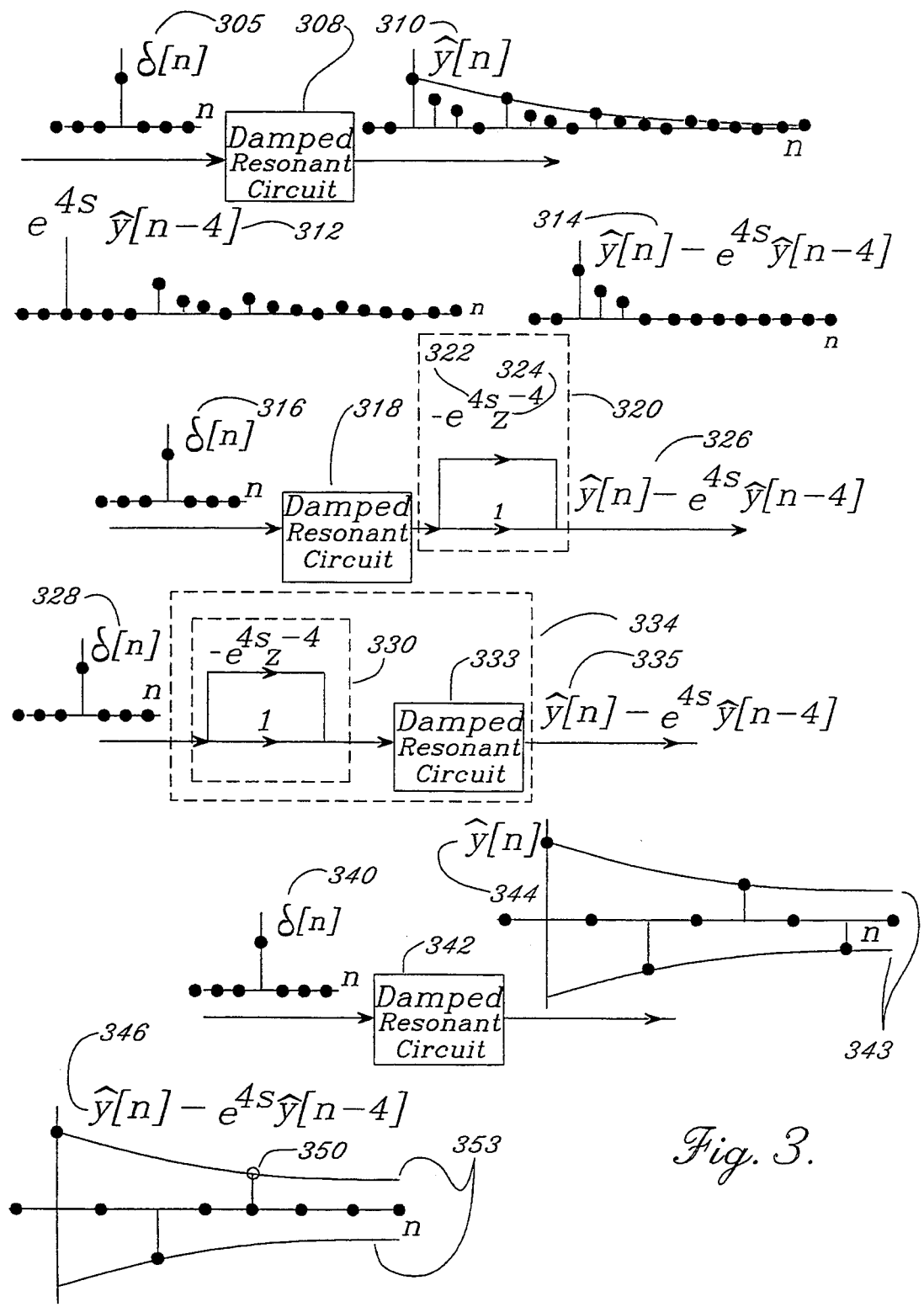
FIG. 3 is a schematic representation of coherent cancellation of a damped resonant circuit beyond a specified point in time using weighted delay circuitry.

Damped periodic impulse responses. Coherent cancellation can also be performed using delay lines with digital filters, whose responses are damped periodic functions. As illustrated in FIG. 3, consider the example where the response 310 of a damped resonant circuit 308 to an input Kronecker delta 305 ($=\delta[n]=1$ when $n=0$ and zero for $n\neq 0$) is $$\hat{y}[n]=y[n]e^{sn}\qquad(14)$$

where $y[n]$ is the periodic function 236 in FIG. 2 and s is a (possibly complex) constant. In the specific illustration 310, s is clearly a negative real number. Note then, that for $n \geq 4$, $$\hat{y}[n-4]=y[n]e^{-4s}\qquad(15)$$

Therefore, the first damped period 314 of $\hat{y}[n]$ can be generated by shifting the impulse response four units in time and weighting the delay by $\exp(4s)$ to achieve the output 312 $\exp(4s)\hat{y}[n-4]$. This is accomplished by placing the output of the damped resonant circuit 318 into delay circuitry 320 which appropriately weights 322 and delays 324 the response to the impulse 316 so that, when coherently superimposed, the desired composite impulse response 326 which is finite in duration is generated.

As before, both the delay circuitry 320 and the damped resonant circuit 318 are linear and time invariant and can therefore be interchanged in the order of cascading. An impulse input 328 can be fed first to the delay circuitry 330 and then to the damped resonant circuit 333 to generate a composite response 335 that is the same as before 326.

Note that coherent cancellation in the undamped case can be considered a special case of cancelation in the damped case when $s=0$. If s is imaginary, then there is no damping in the conventional sense of the word. In the discussion above and below, however, since the same principals of cancellation apply, the instance of s being imaginary in the damped case is also claimed.

The real part of s will generally be denoted by $-\sigma$. Since two or more periods of a periodic function can be considered a single period, the procedure can be extended to multiple periods.

As in the undamped case, damped versions of sinusoids can be coherently cancelled at half periods. Damping the impulse response in Eq. 13, for example, gives $$h[n]=\sin(\pi n/N)e^{-\sigma n}\mu[n]$$

Running the output of such a filter through a delay line of duration N, multiplying the delay line output by $\exp(-\sigma n)$, and adding to the original filter output gives a composite impulse response, $\hat{h}[n]+\exp(-\sigma n)\hat{h}[n-N]$, which is equal to $\hat{h}[n]$ for $n<N$ and is zero for $n \geq N$.

When dealing with coherent cancellation of certain periodic functions, it may be advisable to use end point correction. Such occurs, for example, when certain symmetry aspects of the desired impulse response are needed. Consider, for example, the damped resonant circuit 342 in FIG. 3 whose response 344 to an impulse 340 is $$\hat{y}[n]=\cos(\pi n/2)e^{-\sigma n}\mu[n].\qquad(16)$$

The envelope 343 of the response is shown. Application of coherent cancellation after the first period of the cosine will result in the response shown 346. In certain cases, such as windowing, the end point of the period which the cancellation circuitry places to zero is desired. The end point, rather, on the envelope 353 at the point shown by the hollow dot 350 is desired. Addition of this point to the impulse response is referred to as end point correction.

Parallel and cascade generalizations. A number of coherent cancellation circuits of the type just described can be placed in cascade and/or parallel to achieve even greater flexibility in the design of impulse responses.

Reference to single component coherent cancellation circuits being connected in cascade and/or parallel is allowed in order to permit the degenerate case of a single circuit to be subsumed.

In certain instances common circuitry can be factored from combinations of cascade and/or parallel to yield a reduction in overall computational requirements. Windows expressed in a finite cosine series can be shown, for example, to be able to be synthesized by a parallel combination of second order IIR filters and that the delay circuitry can be factored so that a single delay circuit serves the entire array.

Consider, as an example, any window fabricated using a composite circuit consisting of two circuits, one with an impulse response that cancels the other after a delay. Placing two of these composite circuits in cascade will result in an impulse response equal to the autoconvolution of the impulse response of one. Indeed, from the central limit theorem, cascading a number of such circuits will result in a window with a gaussian shape. Cascading two rectangular windows results in a triangular window. Cascading two triangular windows results in a Parzen window, etc.

Fourier Series Synthesis of Resonant Circuitry. For one skilled in the art, there exists numerous methods to design circuitry for a given causal impulse response. One approach is use of a Fourier series synthesis of the impulse response. In the most general case, digital circuitry can be designed corresponding to impulse responses of the form $$h[n] = \sum_{q=0}^{Q} h_q[n] \tag{17}$$

where
$$h_q[n] = \gamma_q n^{l_q} e^{j2\pi n u_q} e^{-\sigma_q n} \mu[n] \tag{18}$$

Such circuitry can be designed with the standard digital filter components which are multipliers (including inverters), adders and unit delays. The quantitative values of the multipliers and the topology of all of the components are dictated by the parameters $Q$, $\gamma_q$, $u_q$, and $\sigma_q$. There exist numerous computational topologies for a given set of parameters. Such circuitry can be designed straightforwardly by those skilled in the art.

The method of coherent cancelation can be nicely illustrated for $l_q = 0$ in which case, for $n \geq M_q$, $$h_q[n - M_q] = e^{-j2\pi M_q u_q} e^{-\sigma_q M_q} h_q[n], \tag{19}$$

Define $$\bar{\omega}_q[n] = h_q[n] - e^{j2\pi M_q u_q} e^{-\sigma_q M_q} h_q[n - M_q]. \tag{20}$$

Clearly, $\omega_q[n]$ is zero for $n \geq M_q$ and the composite IIR filter $$\bar{w}[n] = \sum_{q=0}^{Q} w_q[n] \tag{21}$$

has a response that is finite in extent.

As has been illustrated in a previous example, the result can be extended to the case where the $l_q$'s are nonnegative integers. Window components of the type in Eq. 20 can be realized using an IIR filter with weighted delay line circuitry. The sum in Eq. 21 is achieved by simply placing these component circuits in parallel.

Common windows. Many commonly used windows (Hanning, Hamming and Blackman) are special cases of the cosine series $$w[n] = \sum_{q=0}^{Q} \beta_q \cos(\pi n q/L) \Pi\left[\frac{n}{2L}\right] \text{ where } \Pi\left[\frac{n}{2L}\right] = 1 \tag{22}$$

for $-L \leq n \leq L$ and is zero otherwise. The Hanning and Hamming windows require $Q = 1$ and the Blackman window $Q = 2$ terms.

Motivated by causality, the shifted version of the cosine series window is written as $$w[n - L] = \sum_{q=0}^{Q} (-1)^q \beta_q \cos(\pi n q/L) \Pi\left[\frac{n - L}{2L}\right] \tag{23}$$

Compare this with the special case of the real part Eqs. 17 and 18 with $l_q = 0$.

$$h[n] = \sum_{q=0}^{Q} (-1)^q \beta_q \cos(\pi n q/L) \mu[n] \tag{24}$$

The window in Eq. 23 is recognized as the first period of Eq. 24 except at the end point, $n - L = L$. Indeed, $$\omega[n-L] = h[n] - h[n-2L] + \omega[L]\delta[n-2L] \tag{25}$$

A periodic resonant circuit can be straightforwardly designed with an impulse response give by Eq. 24. Delay line circuitry is cascaded with this circuit to achieve the desired composite window filter. The window's end point can be inserted with the use of a weighted delay line or can be ignored if the end point correction is numerically zero or, otherwise, if the resulting error is deemed negligible.

One straightforward way to design the resonant circuit in Eq. 24 is by designing circuitry for each of the $Q+1$ stages and connecting them in parallel. Equation 24 is rewritten as $$h[n] = \sum_{q=0}^{Q} h_q[n] \tag{26}$$

where
$$h_q[n] = c_q \cos(n\theta_q) \mu[n] \tag{27}$$

where $\theta_q = \pi q/L$ and $c_q = (-1)^q \beta_q$. For $q \neq 0$, the z transform of this equation is $$H_q(z) = \sum_{n=0}^{\infty} h_q[n] z^{-n}$$
$$= \frac{c_q[1 - z^{-1}\cos(\theta_q)]}{1 - 2z^{-1}\cos(\theta_q) + z^{-2}} \tag{28}$$

Figure 4:
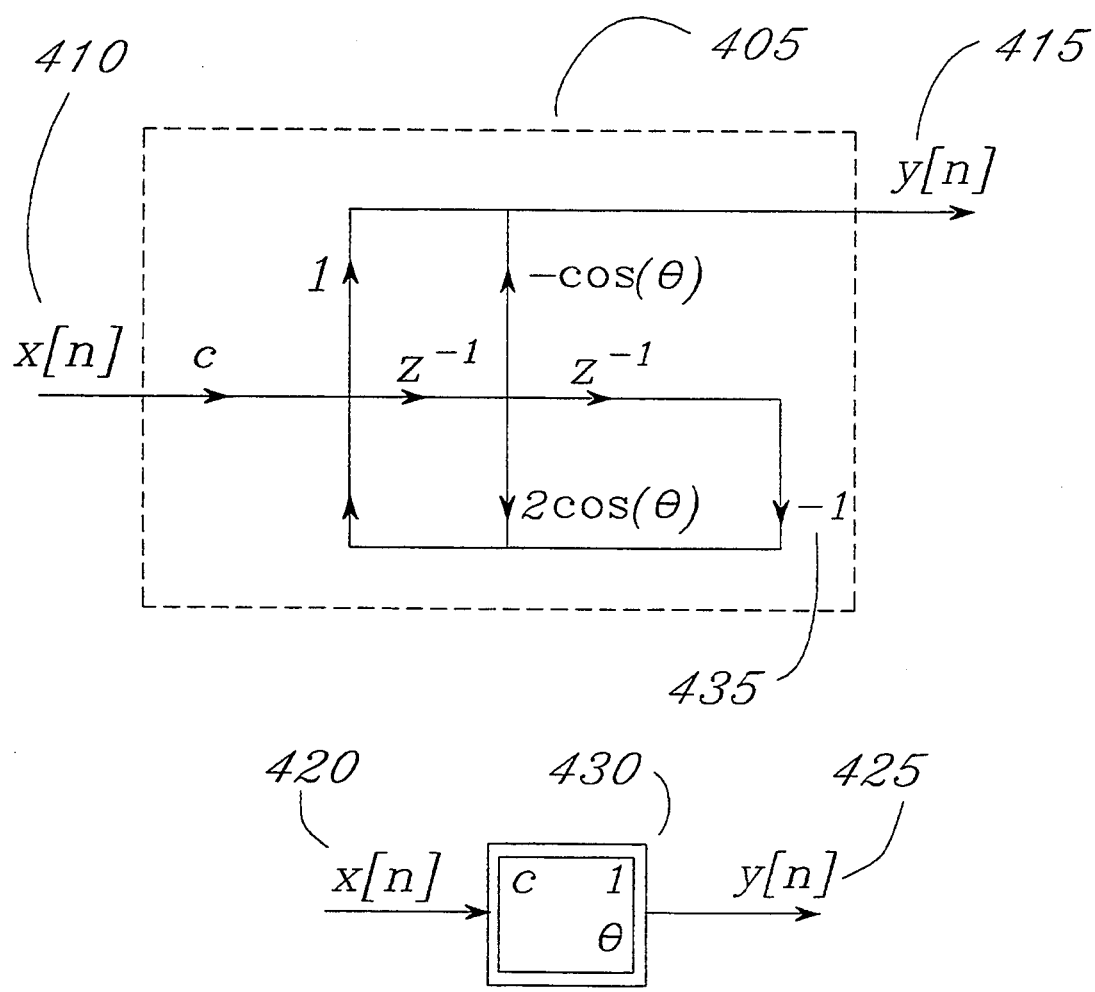
FIG. 4 is a schematic representation of a digital circuit for generating a cosinusoidal response and its schematic abstraction.

Using standard design procedures, a digital circuit 405 with this transfer function can be generated as in FIG. 4. The output 415 of the filter 405 is equal to the discrete convolution of the input 410 with the impulse response in Eq. 27 with $c = c_q$ and $\theta = \theta_q$. Recognizing there exists a number of other digital filter architectures to generate the same operation, the input 410, 420 output 415, 425 relationship of this operation will schematically be represented by a solidly outlined box 430 inscribed with parameters c and $\theta$. For $q=0$ in Eq. 27, $h_0[n]=c_0=\beta_0$. This operation can be performed by a simple multiply.

Architecture examples. Consider the $Q=1$ example for Hanning and Hamming windows of length $2L+1$. For Hanning windows, $\beta_0\beta_1=0.5$. For Hamming windows, $\beta_0=0.54$ and $\beta_1=0.46$. For these parameter choices, both the Hanning and Hamming $\omega[n]$'s can be realized by the architecture in FIG. 5 which is a special case of the delay to periodic resonant circuit cascading 265 shown in FIG. 2 addended with end point correction. The input 505 is fed into the delay circuitry 510. The output of the delay circuitry is fed into the $q=0$ and the $q=1$ stages 515 520 of the composite circuitry 595. The end point correction is obtained by an additional weighted delay 540 of the signal. The outputs of all stages are added 525 to obtain the windowed output 530. Note that, for Hanning windows, $\omega[L]=0$ and the end point correction is not needed. Indeed, for any window, the effect of not using end point correction diminishes as L increases. In such cases, one may choose not to use the end point correction in the computational architecture.

Figure 6:
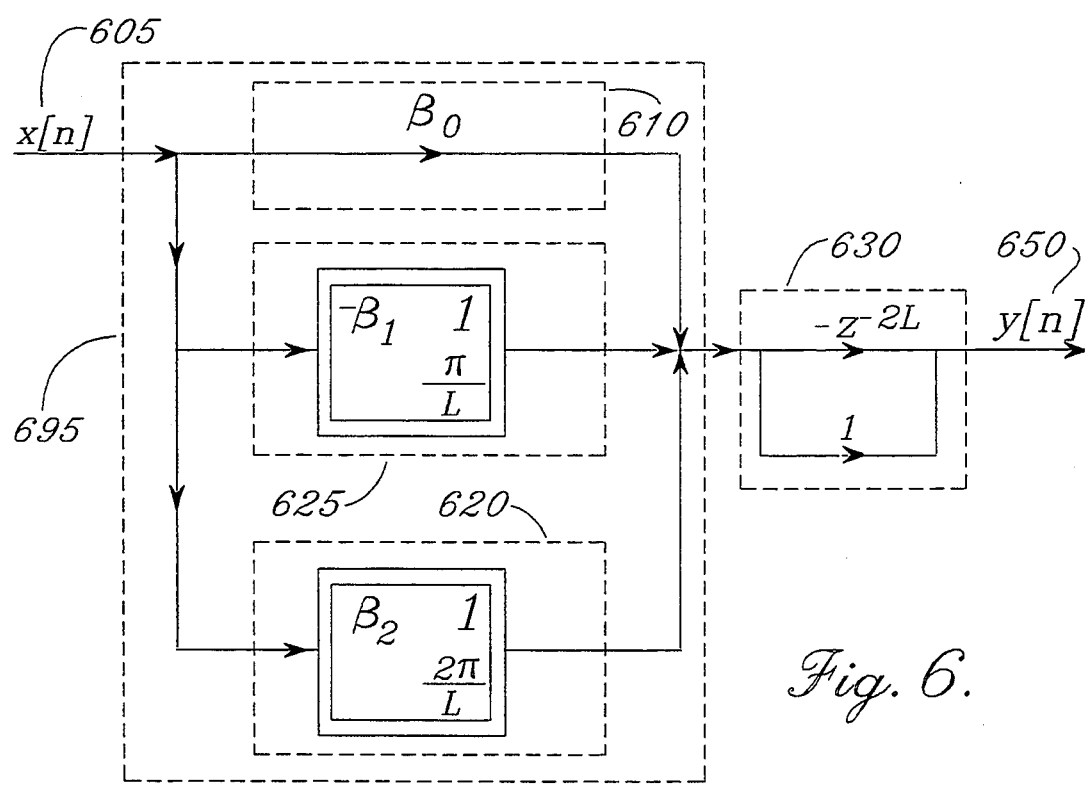
FIG. 6 is a schematic representation of periodic resonant and delay circuitry to generate a class of sliding window Fourier transforms, including Blackman windowed transforms, without end point correction.

A $Q=2$ example of an embodiment of this method will be given for the Blackman window for the case where end point correction is not used. Here, $\beta_0=0.42$, $\beta_1=0.5$ and $\beta_2=0.08$. The architecture in FIG. 6 is a special case of the periodic resonant to delay processing 270 shown in FIG. 2. The input 605 is fed to the $q=0,1$ and 2 stages 610 625 620 of the composite circuitry 695. The outputs of each stage are summed and fed into the delay circuitry 630 the result of which is the windowed output 650. No end point correction is used here.

Stability Assurance. The window architectures presented to this point are marginally stable. All of the circuits poles lie on the unit circle of the complex z plane. Numerous modifications can be applied to the fundamental architecture to assure stability. Each feedback iteration sum, for example, can be rounded towards zero.

Refreshing can also be incorporated into the circuitry to assure stability. In this approach, two circuits are identically configured. The input, for a period of time, is fed to the first circuit. It is then switched to the second circuit. The outputs of the two circuits are added to give the desired output. When the first circuit is emptied of data, all of the signal components remaining are due to cumulative noise, and are thus set to zero. The first circuit is refreshed. The input is then switched back from the second circuit to the first, and the second circuit is emptied and refreshed. By occasionally setting the cumulative error to zero, the circuit is made stable. The various implementations refreshing will be evident to those well trained in the art.

Alternately, stability can be assured by slightly perturbing the design to include slight damping that will move all of the circles strictly within the unit circle on the complex z plane. In other words, the source of the marginal stability in the circuitry is unit feedback (e.g. 435 in FIG. 4). Damping feedback slightly will insure stability. Similarly, entirely stable windowing circuitry can be designed for windows that are multiplied by a taper proportional to $\exp(-\sigma n)$. Define $$\hat{\omega}[n]=\omega[n]e^{-\sigma n} \tag{29}$$

If one wishes to keep the window shape as close to the $\sigma=0$ case as possible, $\sigma$ is chosen to be a positive number just slightly greater than zero.

Let $\hat{h}[n]$ denote a damped periodic causal impulse response.

$$\hat{h}[n]=h[n]e^{-\sigma(n-L)} \tag{30}$$

where h[n], given by Eq. 24, has a period 2L. Then, for $n>2L$, $$\hat{h}[n-2L]=e^{2\sigma L}\hat{h}_q[n] \tag{31}$$

The damped window can therefore be generated as $$\hat{w}[n-L] = w[n-L]e^{-\sigma(n-L)} = \hat{h}[n] - e^{-2\sigma L}\hat{h}[n-2L] + \hat{w}[L]\delta[n-2L] \tag{32}$$

where
$$\hat{w}[L] = w[L]e^{-\sigma L} \tag{33}$$

is the value of the end correction factor.

An architecture for computing Eq. 32 is shown in FIG. 7. The damped resonant circuit 715 has impulse response $\hat{h}[n]$. The damped window is obtained by cascading this filter with weighted delay line circuitry 720. The end point correction factor is computed 725 and added to the filter output 730 to produce a windowed output 735 to the input 705. The undamped case is a special case of this processing procedure for the case where $\sigma=0$. As in the undamped case, the end point correction factor has less and less effect on the output as L increases. In such cases where the end point correction factor can be omitted, the end point correction factor stage 725 can be omitted. As in the undamped case, when the end point correction factor is deleted, the delay line circuitry becomes commutable with the damped resonant circuit.

There exist variation on the fundamental architecture 750 shown at the top of FIG. 7. The architecture 755 shown at the bottom of FIG. 7, for example, performs identically with the same number of floating point operations (FLOPS). Either architecture 750, 755 can be used in the two architectures in FIG. 1 as the window 140 (with $\hat{\omega}[n]$ replacing $\omega[n]$) to generate sliding window Fourier transforms and spectrograms with damped windows. Specifically, $S[n-L;u]$ is computed using $\omega[n-L]$ instead of the window shown 140 where, now, $$S[n;u] = \sum_{k=-L}^{L} \hat{w}[k]x[n-k]e^{-j2\pi ku} \tag{34}$$

Similar use of $\hat{\omega}[n-L]$ in the squared magnitude architecture instead of $\omega[n-L]$ 155 results in the spectrogram 165 where the corresponding expression for the sliding window Fourier transform is not given by Eq. 34.

A possible architecture for the damped resonant circuit that parallels the undamped case is now discussed. Equation 30 can be written as $$\hat{h}[n] = \sum_{q=0}^{Q} \hat{h}_q[n] \tag{35}$$

where
$$\hat{h}_q[n] = c_q \cos(\pi nq/L)e^{-\sigma(n-L)}\mu[n]. \tag{36}$$

The z transform of this impulse response results in the transfer function $$\hat{H}_q(z) = \frac{c[1 - e^{-\sigma}z^{-1}\cos(\theta)]}{1 - 2e^{-\sigma}z^{-1}\cos(\theta) + e^{-2\sigma}z^{-2}} \qquad (37)$$

where $c = c_q e^{\sigma L}$ and $\theta = \pi q/L$. One of many possible digital filters for this filter is shown in FIG. 8. The input 805 into the circuitry 810 produces an output 815 that is the discrete convolution of the input with the impulse response in Eq. 36. The general class of digital circuits with this response is denoted by the parameterized bold outline box 820 shown in FIG. 8. The input 825 into this parameterized box produces the same output 830 as in the specific damped circuitry 815.

For $q=0$, $$\hat{h}_0[n] = c_0 e^{-\sigma(n-L)} \mu[n]. \qquad (38)$$

An architecture for this impulse response is a single loop feedback circuit with a forward gain of one and a unit delay feedback weighted by $\exp(-\sigma)$ cascaded with a multiply of $c_0\exp(\sigma L)$. For $c_0=\beta_0$ and $\tilde{\beta}_q=\beta_q\exp(\sigma L)$, this circuit is shown as component circuitry 920, 1015 in both FIGS. 9 and 10.

Figure 9:
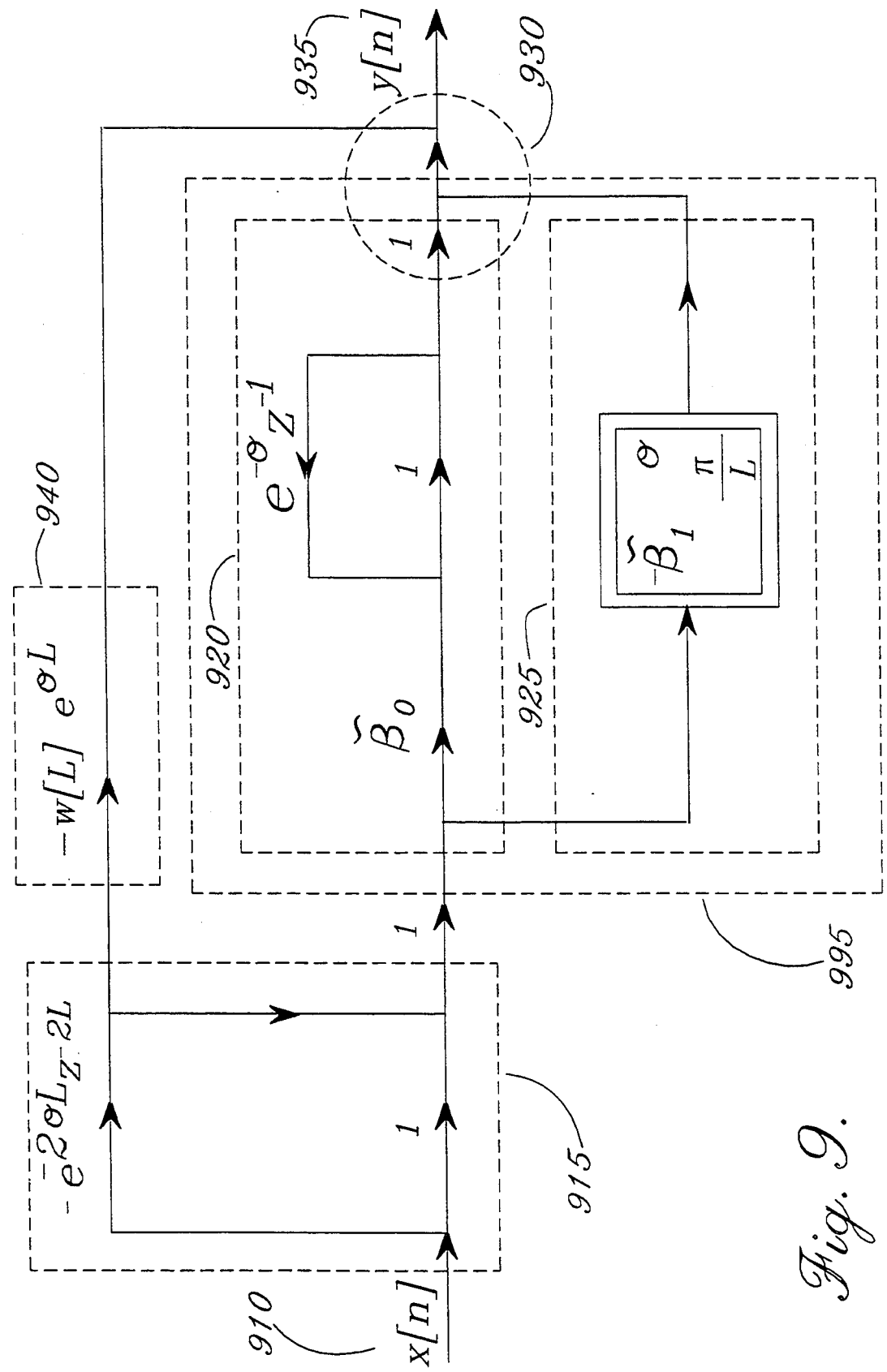
FIG. 9 is a schematic representation of a damped resonant and delay circuitry to generate a class of damped sliding window Fourier transforms, including those with Hamming or Hanning windows.

Architecture examples. A digital filter for $Q=1$ (e.g. Hanning and Hamming) damped windows is shown in FIG. 9 using an end point correction variation of the architecture 334 shown in FIG. 3. The input 910 is fed to the damped delay circuitry 915. The $n=0$ component of Eq. 36 is realized by a first order feedback circuit 920. The output of the delay circuitry is fed into this circuit and the $n=1$ stage 925 ($\tilde{\beta}_q\beta_q\exp(\sigma L)$) and the end point correction factor stage 940. The outputs from all stages 995 are added 930 to produce the damped windowed output 935.

Figure 10:
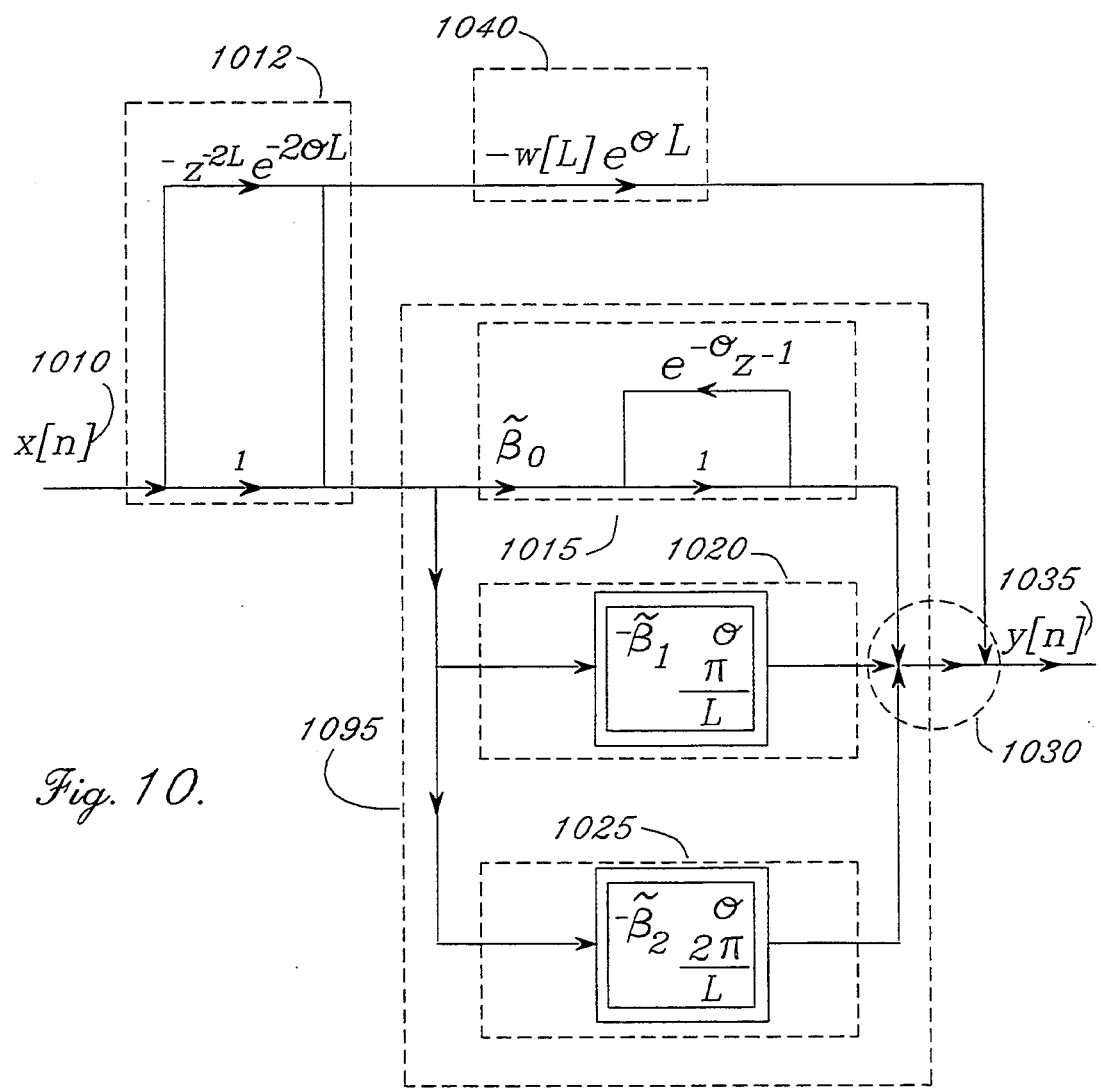
FIG. 10 is a schematic representation of damped resonant and delay circuitry to generate a damped windowed sliding window Fourier transforms, including those with Blackman windows.

A digital filter for $Q=2$ (e.g. Blackman) damped windows is shown in FIG. 10 using a slight variation of the architecture 755 shown on the bottom of FIG. 7. The input 1010 is fed the delay circuitry 1012 and then to 1095 the $q=0,1,2$ stages 1015, 1020, 1025 and the end point correction stage 1040. The outputs of all of the stages are summed 1030 to obtain the damped windowed output 1035.

Sequential and Parallel Embodiments. Although the circuitry thus far described can be used to generate a single spectral line of a sliding window Fourier transform or spectrogram, more typically, a number of parallel lines each corresponding to a different frequency are desired. This can be performed in parallel where a number of sliding window Fourier transform or spectrogram processors are each tuned to different frequencies and all sliding window Fourier transform or spectrogram lines are computed at the same time in parallel. Alternately, the same processor can be exposed to the same signal a number of times. Here, for each presentation, the complex sinusoid(s) are tuned to different frequencies. The lines of the sliding window Fourier transform or spectrogram are thus computed sequentially. In either the parallel or sequential embodiments, the choice of frequencies need not be linear. Logarithmic spacing of frequencies, for example, can be chosen. Similarly, in either case, the window from spectral line can be changed from spectral line to spectral line. For the sequential embodiment, this requires the changing of the window parameters (the $\beta_q$'s and possibly Q) for each presentation of the signal. Other sliding window Fourier transform and spectrogram processors that use common circuitry to feed a parallel bank of processors will be presented later.

Modulated Windows. Also disclosed are computational architectures for modulated windows and their use in the generation of sliding window Fourier transforms and spectrograms. For such architectures, the complex sinusoidal premultiples 115, 145 are no longer required. In parallel embodiments, a single delay line circuit can service the all of the resonant circuits. The damping sliding window Fourier transform is $$S[n;u] = \sum_{k=-L}^{L} x[n-k]\omega[k;u] \qquad (39)$$
$$= x[n] * \omega[n;u]$$

where, henceforth, the modulated window is redefined from Eq. 6 to allow for damping.

$$\omega[n;u] = \hat{\omega}[n]e^{-j2\pi n u} \qquad (40)$$
$$= \sum_{q=0}^{Q} \omega_q[n;u]$$

and $$\omega_q[k;u] = \beta_q\cos(\pi q k/L)e^{-\sigma k}e^{-j2\pi u k}\Pi\left[\frac{k}{2L}\right]. \qquad (41)$$

In discussions concerning modulated windows to follow, both the damped and the undamped case will be included. The undamped case is a special case of the damped case for $\sigma=0$. Motivated by causality, the modulated window is temporally shifted to $$\omega_q[k-L;u] = \qquad (42)$$

$$(-1)^q\beta_q\cos(\pi q k/L)e^{-\sigma(k-L)}e^{-j2\pi u(k-L)}\Pi\left[\frac{k-L}{2L}\right].$$

The synthesis of a resonant circuit with impulse response $$h[k;u] = \sum_{q=0}^{Q} h_q[k;u] \qquad (43)$$

is not motivated where $$h_q[k;u] = (-1)^q\beta_q\cos(\pi q k/L)e^{-\sigma(k-L)}e^{-j2\pi u(k-L)}\mu[k]. \qquad (44)$$

Digital filters with this impulse response can be straightforwardly generated by those skilled in the art. One approach is to analyze the z transform of Eq. 44

$$H_q(z;u) = \sum_{k=0}^{\infty} h_q[k;u]z^{-k} \qquad (45)$$

which gives $$H_q(z;u) = \qquad (46)$$

$$\frac{1}{2}(-1)^q\beta_q e^{\sigma L}e^{j2\pi u L}\left[\Lambda\left(z;u-\frac{q}{2L}\right) + \Lambda\left(z;u+\frac{q}{2L}\right)\right].$$

where

-continued $$\Lambda(z;v) = [1 - e^{-j2\pi v}e^{-\sigma}z^{-1}]^{-1}. \quad (47)$$

Note that, for q=0, $$H_0(z;u) = \beta_0 e^{\sigma L} e^{j2\pi uL} \Lambda(z;u). \quad (48)$$

Figure 11:
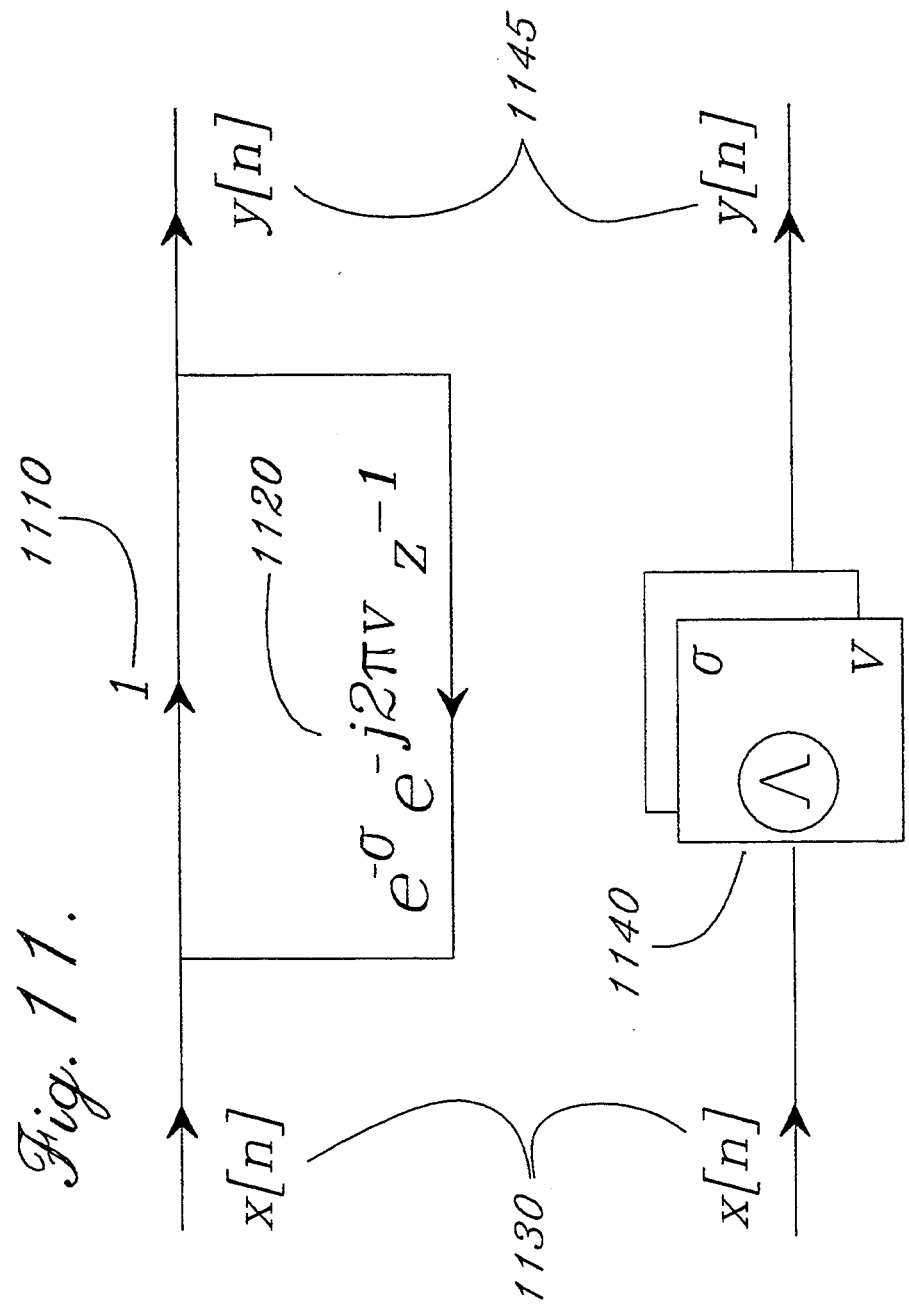
FIG. 11 is a schematic representation of a method for implementation of a Λ (lambda) filter.

The Λ (lambda) filter in Eq. 47 can be implemented using the IIR filter architecture shown in FIG. 11. There is a unit feed forward 1110 and a weighted unit delay feedback 1102. A schematic representation 1140 of the filter, appropriately parameterized with input 1130 and output 1145 corresponding to the IIR filter is also shown in FIG. 11.

In general, Λ filters will have a complex output 1145. The input 1130, however, can be either real or complex depending on the use of the Λ filter. Using real multiplies, the Λ filter can be implemented for real inputs 1205 as is shown in FIG. 12. Equation 47 can be written as $$\Lambda(z;v) = \frac{1 - e^{j2\pi v}e^{-\sigma}z^{-1}}{1 - 2e^{-\sigma}\cos(2\pi v)z^{-1} + e^{-2\sigma}z^{-2}} \quad (49)$$

$$= \Lambda^r(z;v) + j\Lambda^i(z;v)$$

where $\Lambda^r(z;v)$ and $\Lambda^i(z;v)$ are the transfer functions that generate the real and imaginary output components, respectively, of the Λ filter. The real input 1205 is the stimulus to the IIR filter circuitry. The real 1210 and imaginary 1215 outputs are, respectively, $y^r[n]$ and $y^i[n]$ corresponding to the complex output 1145 $y[n] = y^r[n] + jy^i[n]$. The output $y^r[n]$ is equivalent to the output of a filter with transfer function $\Lambda^r(z;u)$ for a real input, x[n] 1205. Similarly, $y^i[n]$ is equivalent to the output of a filter with transfer function $\Lambda^i(z;u)$ for real input, x[n] 1205. The schematic 1240 for the depiction of the real 1220 and imaginary 1225 components for a real input 1230 is also shown in FIG. 12.

Figure 13:
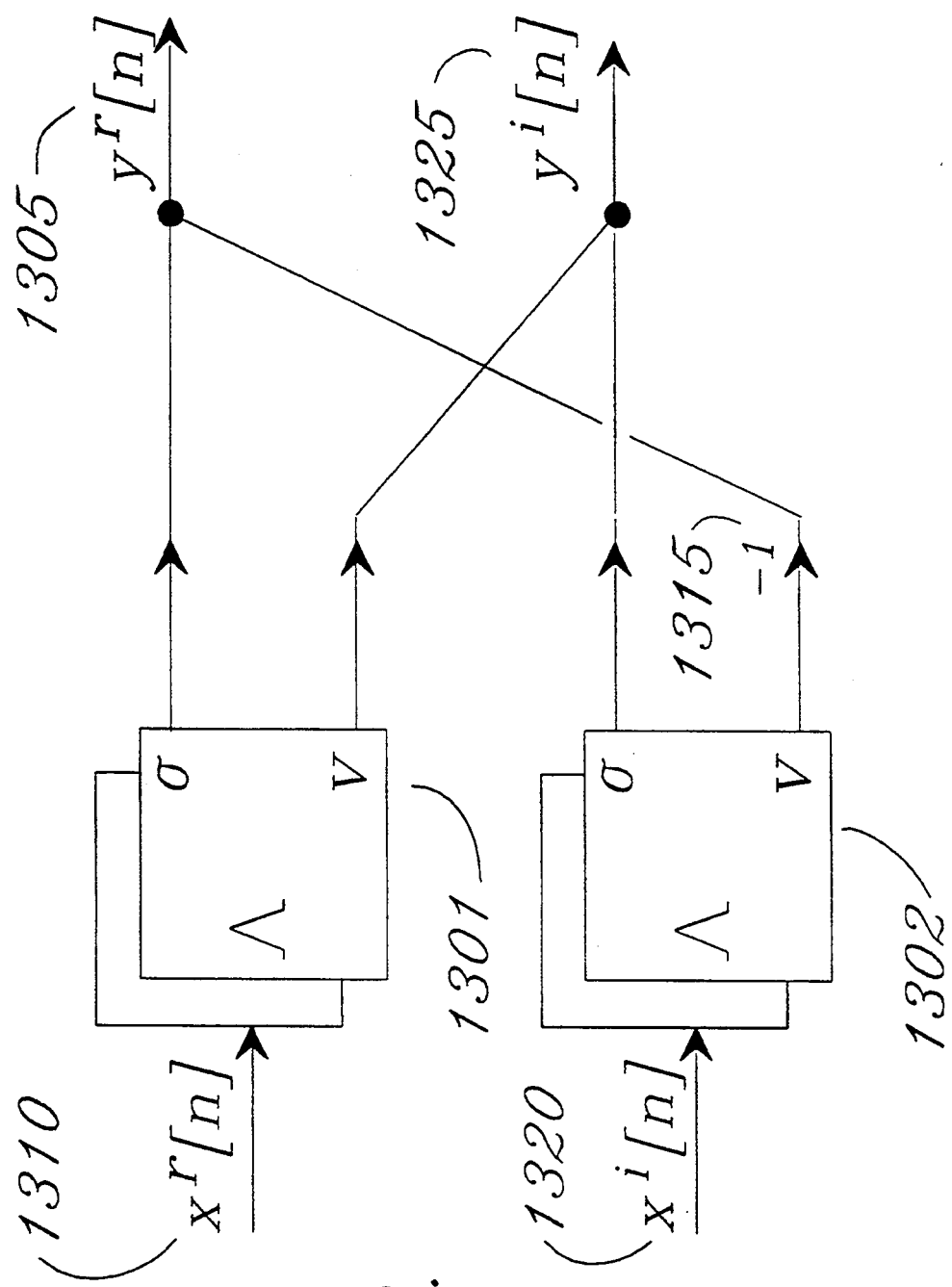
FIG. 13 is a schematic representation of a Λ filter when the input is complex.

For real inputs, the Λ filter representations 1140, 1240 in FIGS. 11 and 12 are identical. If, however, the input 1130 is complex, (i.e. $x[n] = x^r[n] + jx^i[n]$), then the Λ filter characterization 1140 in FIG. 11 requires more computational circuitry. One such embodiment, shown in FIG. 13, uses the depiction 1240 in FIG. 12 as components 1301, 1302. The real output 1305, $y^r[n]$, is the sum of the real response of the real input 1310 and the negated 1315 imaginary response to the imaginary input 1320. Similarly, the imaginary response 1325 is the sum of the imaginary response of the real input 1310 and the real response of the imaginary input 1320.

Figure 14:
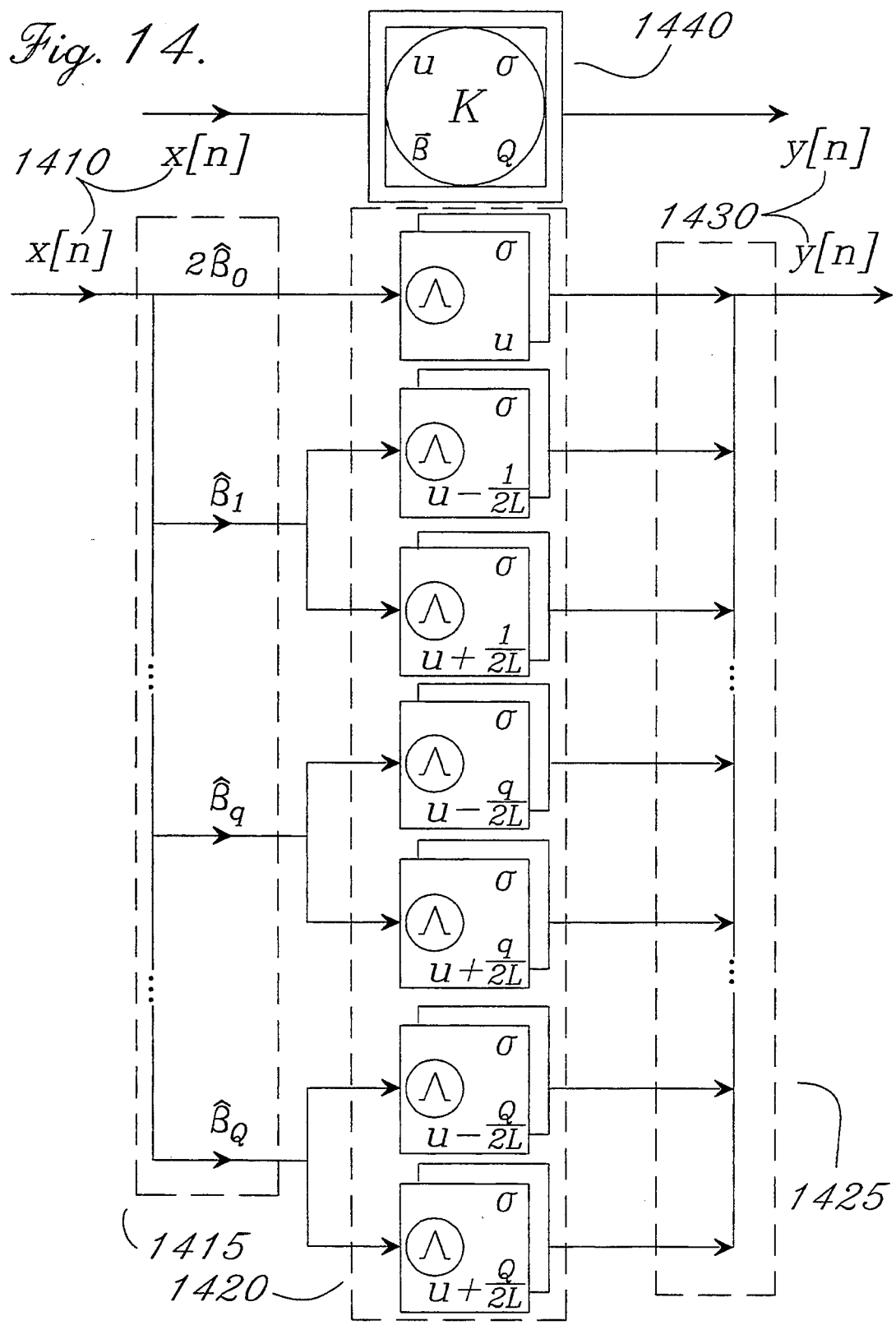
FIG. 14 is a schematic representation of a K filter using a bank of Λ filters and a K filter.

A bank of Λ filters, as shown in FIG. 14, can be used to realize filters with transfer functions $$K(z;u) = H(z;u)e^{-j2\pi uL} \quad (50)$$

$$= \beta_0 e^{\sigma L}\Lambda(z;u) + \frac{1}{2} e^{\sigma L} \sum_{q=1}^{Q} (-1)^q \beta_q \times$$

$$\left[ \Lambda\left(z;u - \frac{q}{2L}\right) + \Lambda\left(z;u + \frac{q}{2L}\right) \right]$$

where H(z;u) is the z transform of h[n;u] in Eq. 43.

$$H(z;u) = \sum_{n=0}^{\infty} h[n;u]z^{-n} \quad (51)$$

$$= \sum_{n=0}^{Q} H_q(z;u)$$

An input 1410 is weighted proportional to Fourier coefficients 1415 ($\hat{\beta}_q = \frac{1}{2}(-1)^q\exp(\sigma L)\beta_q$) which in turn are fed into a bank of appropriately tuned Λ filters 1420. The outputs of the Λ filters are summed 1425 to yield an output 1430 which is equivalent to the response of the input 1410 to a digital filter with transfer function K(z;u) in Eq. 50. Schematically, the K filter will be depicted by the representation 1440 shown in FIG. 14. Note that the architecture can be construed for either real or complex inputs 1410 depending on whether the Λ filters are constructed for real or complex inputs. In either case, the K filter is parameterized by the frequency u, damping coefficient $\sigma$, filter order Q, and vector of Fourier coefficients $\vec{\beta}$. The vector $\vec{\beta}$ is of length Q+1.

The circuitry for the modulated window can be implemented with delay line circuitry and the K filter 1440. From Eqs. 40 through 43, the following identity can be established $$\omega[n-L;u] = h[n;u] - e^{-j4\pi uL}e^{-2\sigma L}h[n-2L;u] + \omega[-L;u]\delta[n-2L] \quad (52)$$

where ω[L;u] is the value of the end point correction factor. The corresponding modulated window transfer function results from a z transform of Eq. 52. Define $$\Omega(z;u) = \sum_{n=0}^{\infty} \omega[n;u]z^{-n}. \quad (53)$$

The z transform of Eq. 52 is then $$\Omega(z;u)z^{-L} = [1 - e^{-j4\pi uL}e^{-2\sigma L}z^{-2L}]H(z;u) + \omega[L;u]z^{-2L} \quad (54)$$

$$= [1 - e^{-j4\pi uL}e^{-2\sigma L}z^{-2L}]e^{j2\pi uL}K(z;u) + \omega[L;u]z^{-2L}$$

where Eq. 50 has been used. From Eq. 39, the output of a filter with this transfer function when presented an input of x[n], is the sliding window Fourier transform line S[n−L;u].

The transfer function for the delay and the exponential shift in Eq. 54 is defined as $$D(z) = [1 - e^{-j4\pi uL}e^{-2\sigma L}z^{-2L}]e^{j2\pi uL} \quad (55)$$

Figure 15:
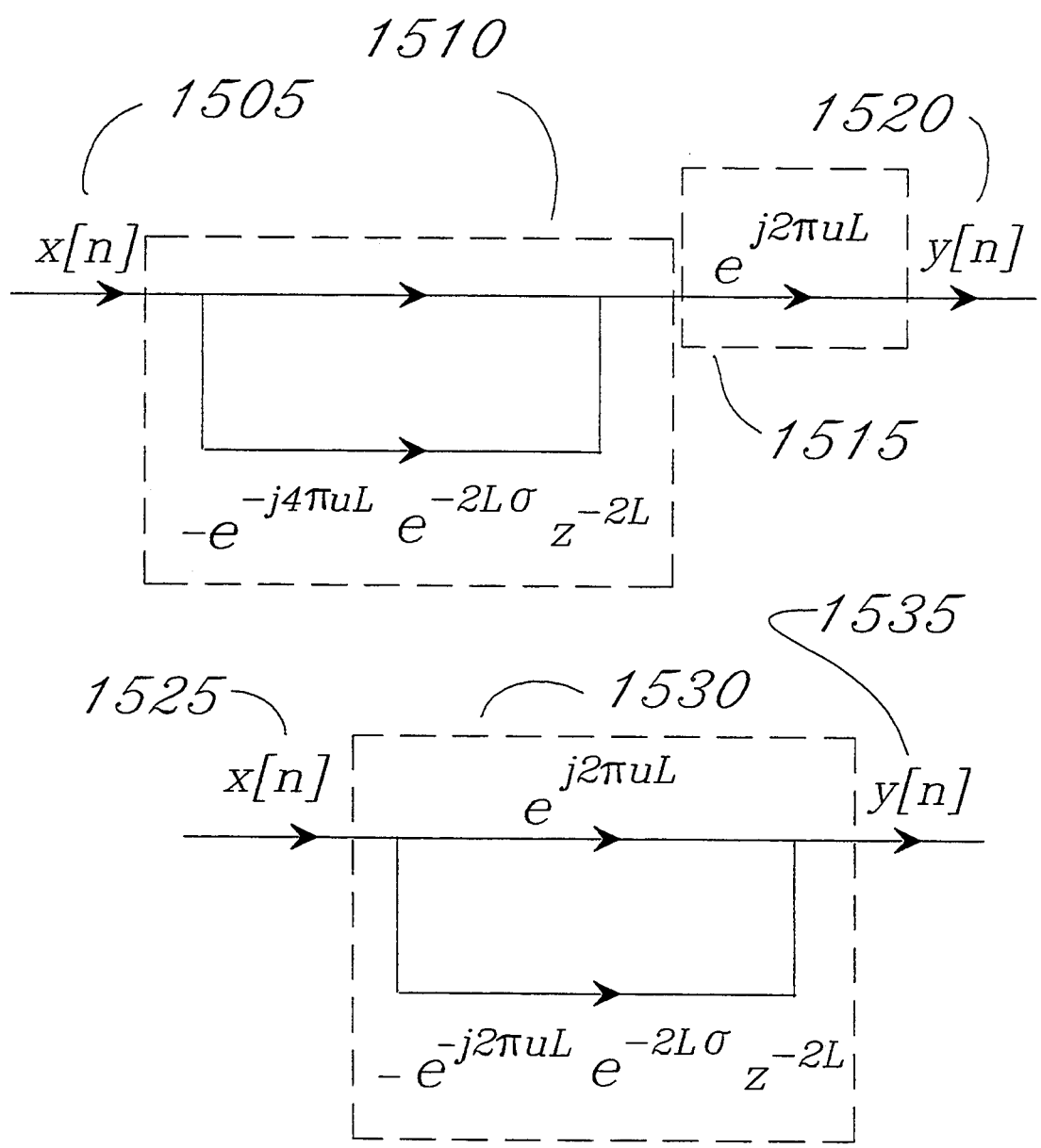
FIG. 15 is a schematic representation of two realizations of the weighted delay transfer function, D(z).

One embodiment of an architecture for this transfer function is shown at the top of FIG. 15. The input 1505 is placed through the delay circuitry 1510. It is then post multiplied by a complex weight 1515 to give the desired output 1520. This embodiment has the advantage of isolating the complex exponential 1515 which, when the spectrogram is desired, can be deleted. An alternate architecture for D(z) requiring fewer floating point operations (FLOPS) is shown at the bottom of FIG. 15. The input 1525 is fed through delay circuitry 1530 with different weights than before 1510 to achieve the desired output signal 1535.

Sliding window Fourier Transform and Spectrogram Architectures Using Modulated Windows. Given delay circuitry and the K filter 1440 in FIG. 14, circuitry for synthesis of the sliding window Fourier transform or spectrogram line based on the modulated window can be crafted. As with the previously discussed methods, example architectures will be presented whereby the spectrogram is generated or the sliding window Fourier transform is computed. As before, in any embodiment, use of end point correction is an option. The contribution of end point correction to the final result generally diminishes as L increases. Both serial and parallel implementation methods will be discussed and illustrated.

Figure 16:
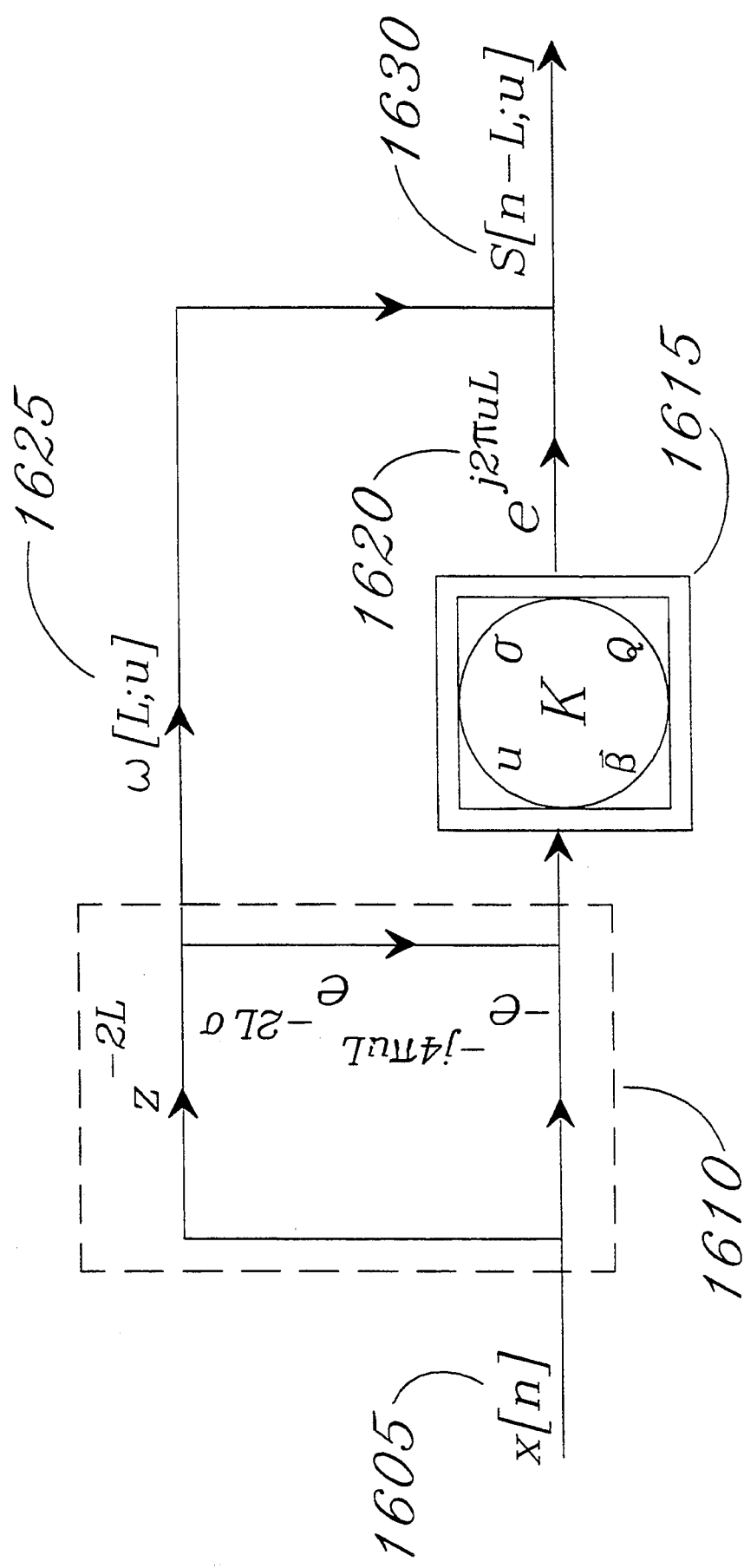
FIG. 16 is a schematic representation of a single modulated window for generation of the a sliding window Fourier transform frequency line.

An architecture for generating a single spectral line of a sliding window Fourier transform based of Eq. 54, is shown in FIG. 16. The input 1605 is fed to delay circuitry 1610. The output of the delay circuitry is fed to a K filter 1615, the output of which, in turn, is shifted in phase 1620. The end point correction factor 1625 is added to give the desired sliding window Fourier transform output 1630. One or more of the parameters of the circuitry (i.e. u, L, $\sigma$, $\vec{\beta}$ and Q) can be changed and the same 1605 or alternate input can be applied to generate a second output sliding window Fourier transform line.

Figure 17:
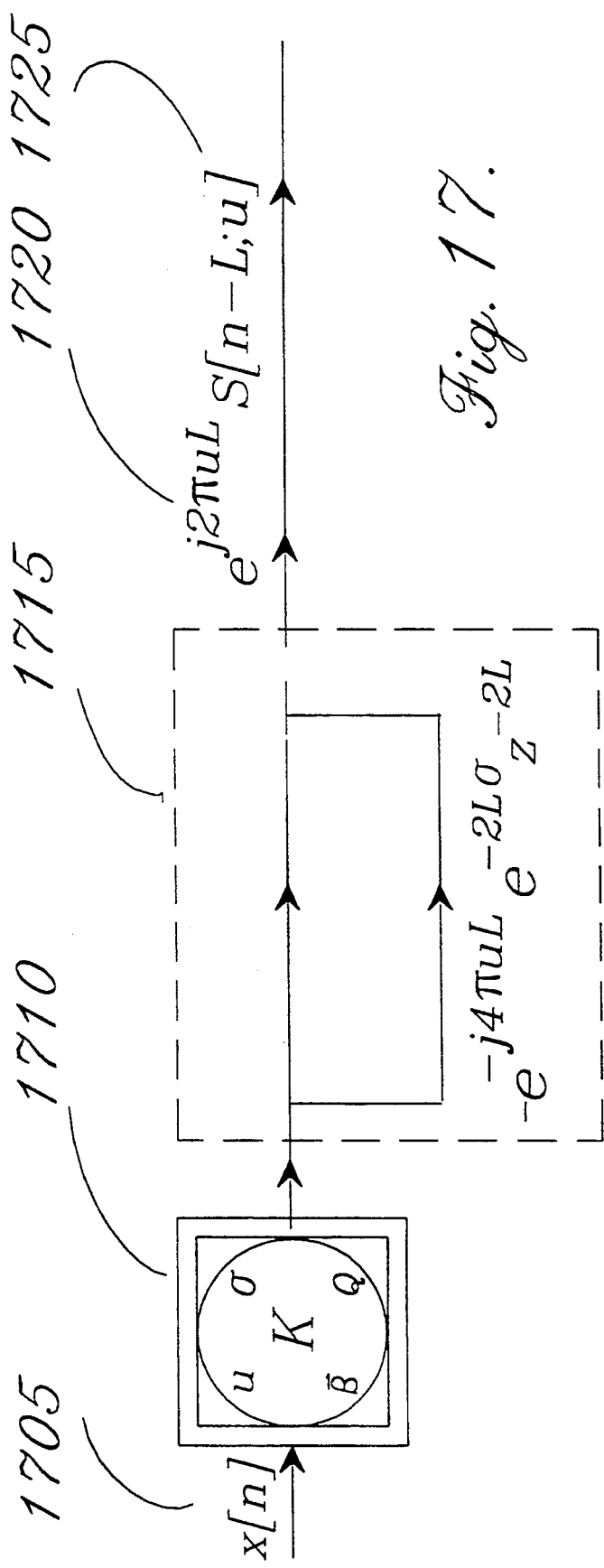
FIG. 17 is a schematic representation of an illustration of a single modulated window processor without end point correction for generating the real and imaginary parts of a spectrogram line. The squared magnitude of the spectrogram line can be generated with a slight architecture modification.
Figure 18:
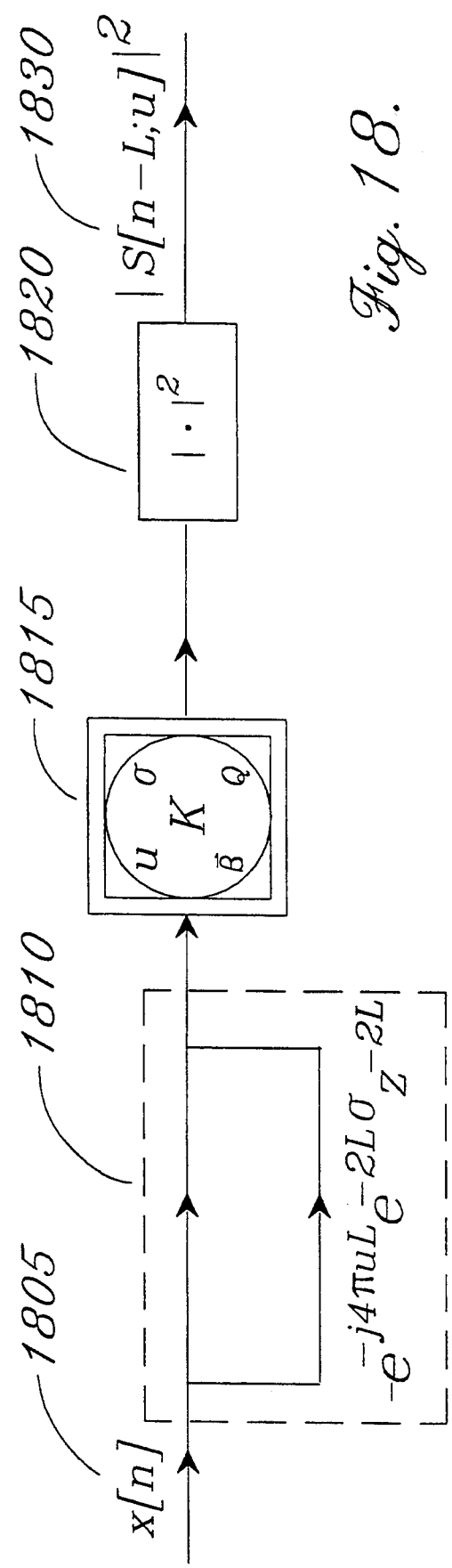
FIG. 18 is a schematic representation of circuitry for generating a spectrogram line without end point correction.

As is the case with other embodiments described herein, the architecture in FIG. 16 has a number of variations in detail design that are evident to one skilled in the art. The multiplication by the complex number 1620 in FIG. 16, for example, can be performed immediately prior to the K filter 1615 instead of directly after. Indeed, if end point correction is not used, the K filter 1616, delay circuitry 1610 and exponential multiply 1620 can be cascaded in any order desired. Such arbitrariness in the cascading of two or more linear time invariant filters is well known. One of these six orderings is shown in FIG. 17. The input 1705 is first fed into a K filter 1710 and then into the delay circuitry 1715. After post multiplication by a complex number 1720, the desired sliding window Fourier transform line 1725 is achieved (without end point correction). This embodiment has the advantage that $\Lambda$ filters with real inputs can be used if the processor input 1705 is real. Note also, that if the only the spectrogram line, $|S[n-L;u]|^2$, is desired (rather than the output shown 1725), then the complex sinusoid weighting 1720 can be omitted and replaced by a magnitude squared operation. A variation of such magnitude squared computation is shown in FIG. 18. A different cascading order, though, is used here. The input 1805 is placed first into the delay circuitry 1810 and is then fed into a K filter 1815. A magnitude squared operation 1820 is performed on the output of this filter to yield the desired spectrogram output line 1830 (without end point correction).

Figure 19:
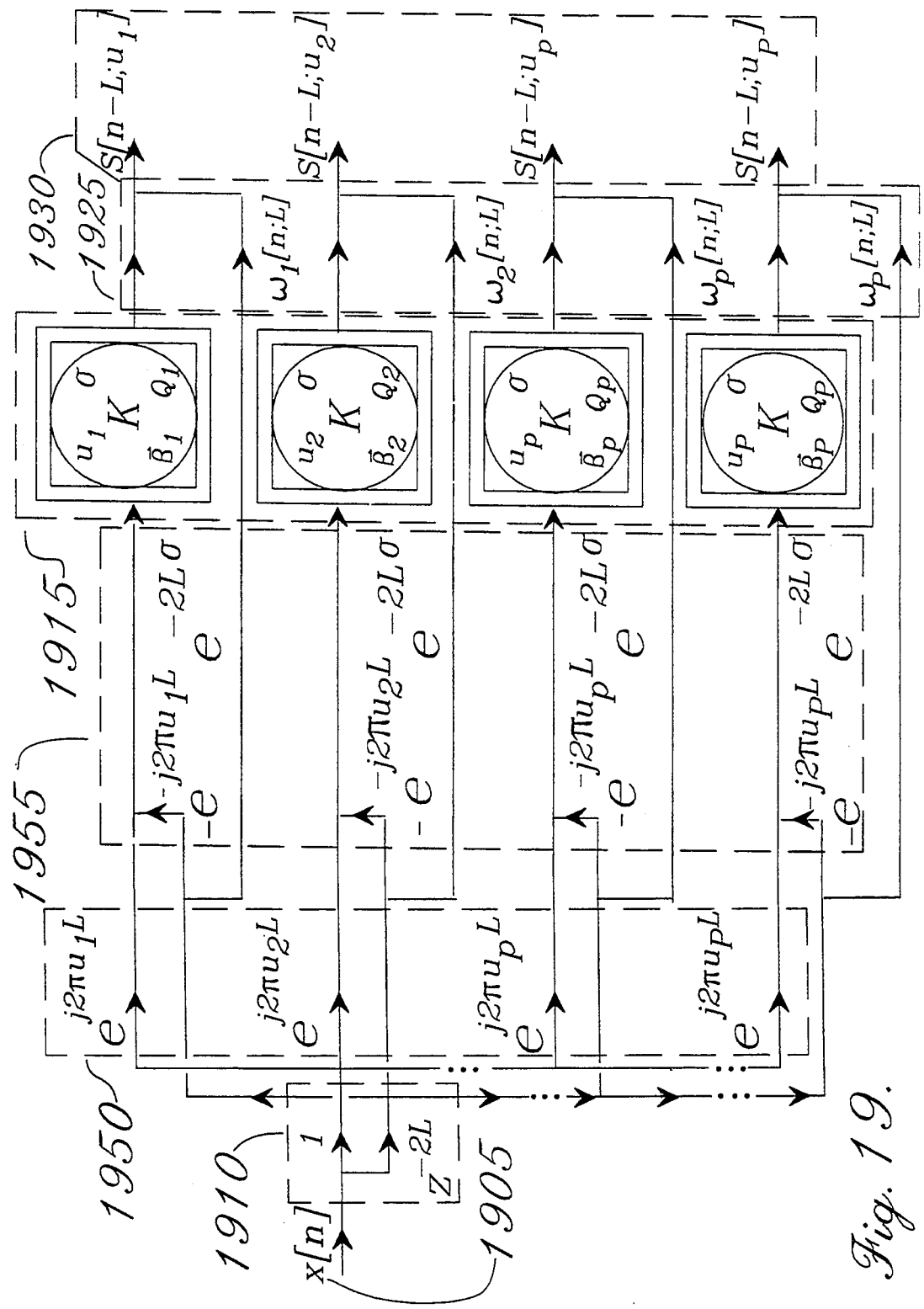
FIG. 19 is a schematic representation of a parallel modulated window based methods for generating sliding window Fourier transform lines with arbitrary frequency spacing.

A parallel architecture illustrating the method of generating sliding window Fourier transforms using modulated windows is shown in FIG. 19. Using Eq. 54 for $1 \leq p \leq P$, an architecture for the transfer functions is proposed $$\Omega(z;u_p)z^{-L} = [1 - e^{-j4\pi u_p L}e^{-2\sigma L}z^{-2L}]e^{j2\pi u_p L}$$
$$K(z;u_p) + \omega[L;u_p]z^{-2L} \quad (56)$$

where $\Omega(z;u_p)$ is the z transform of $\omega(z;u_p)$. The embodiment of this architecture, shown in FIG. 19, uses a single delay circuit 1910 to service all of the K filters 1915. For P spectral lines, there are P separate K filters the pth of which is tuned to frequency $\vec{u}_p$ and is of order $Q_p$ with Fourier coefficient vector $\vec{\beta}_p$. The input to each K filter is the sum of a weighted 1950 input 1905 and a weighted 1955 delay. The output of each K filter is added to the end point correction factor 1925 to generate the sliding window Fourier transform lines 1930.

Figure 20:
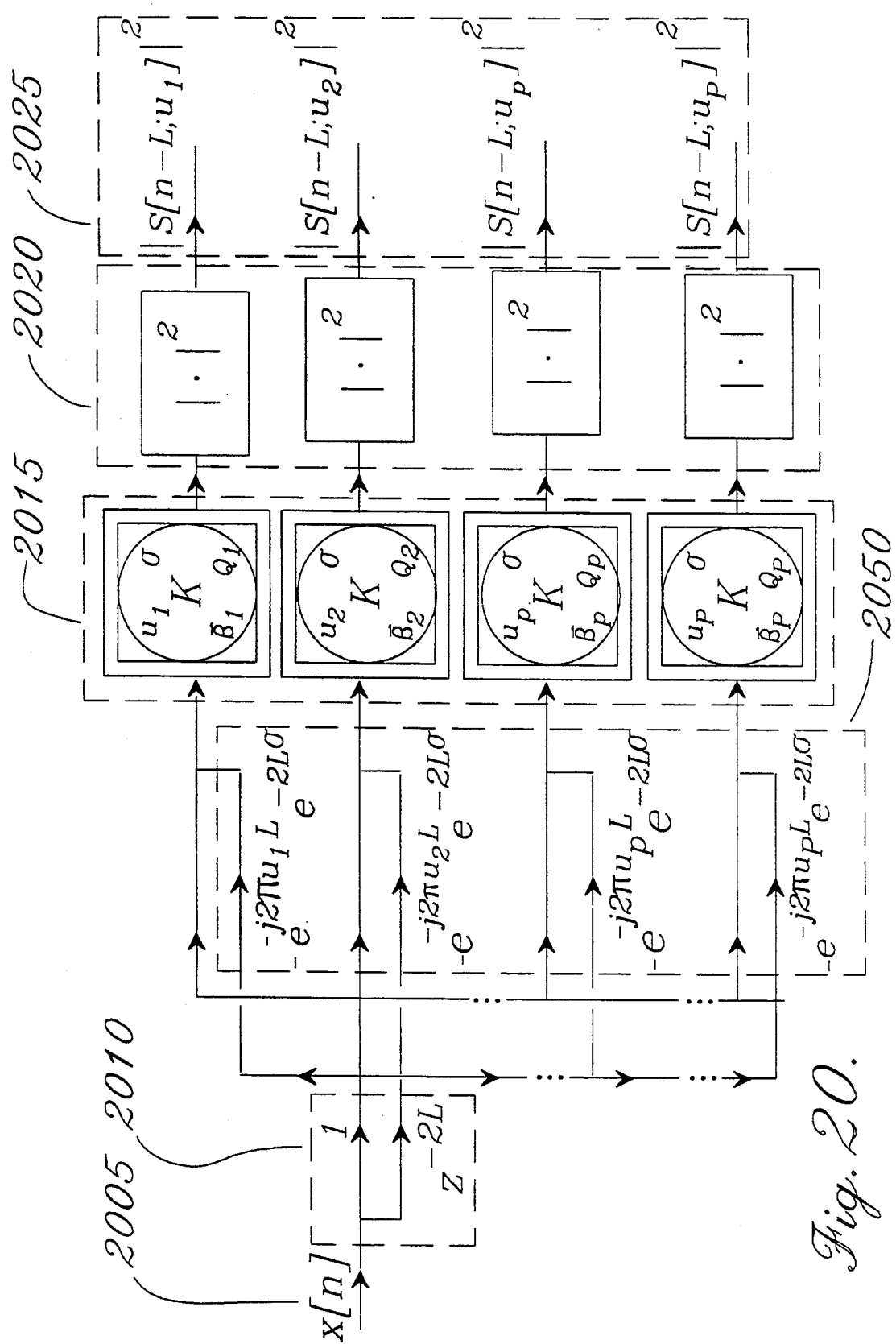
FIG. 20 is a schematic representation of a parallel modulated window based architecture without end point correction for generating spectrogram lines at arbitrary frequency spacings.

A variation on the parallel circuit can be made if only the spectrogram output is required. In such a scenario, if end point correction is not used, the complex sinusiod weights 1950 have no effect on the processor output and can therefore be deleted from the architecture. An embodiment of such a processor is shown in FIG. 20. The input 2005 is placed through delay circuitry 2010, the output of which, after being combined with the undelayed signal 2050, services the bank of K filters 2015. The output of each K filter is magnitude squared 2020 which gives the desired spectrogram output 2025.

Uniformly Spaced Frequency Bins Using Modulated Windows. When the frequency bins in the parallel architecture are spaced linearly as $$u_p = \frac{p}{2L} \quad (57)$$

then a computationally simplified parallel architecture can be realized. Equation 46 becomes $$H_q(z;u) = \quad (58)$$

$$\frac{1}{2}(-1)^{p+q}\beta_q e^{\sigma L}\left[\Lambda\left(z;\frac{p-q}{2L}\right) + \Lambda\left(z;\frac{p+q}{2L}\right)\right].$$

The q=0 case warrants special statement.

$$H_0(z;u) = (-1)^p \beta_0 e^{\sigma L} \Lambda\left(z;\frac{p}{2L}\right). \quad (59)$$

For linear frequency spacing (and Q>0), some of the same $\Lambda$ filters required to generate the line at, say, $u_p$, are also required to generate the frequency lines at $u_{p\pm 1}$. Indeed, one or more common $\Lambda$ filters are required up to and including the $u_{p\pm Q}$ frequency lines. The processing architecture is configured so that a $\Lambda$ filter can be used for a number of frequency lines in the sliding window Fourier transform therefore reducing the overall required computation.

Other computational aspects arise in this configuration. The multiplies in the delay circuitry all become real. The complex sinusoid, for example, becomes $\exp(j2\pi u_p L) = (-1)^p$ which is obviously computationally more simple to implement.

Figure 21:
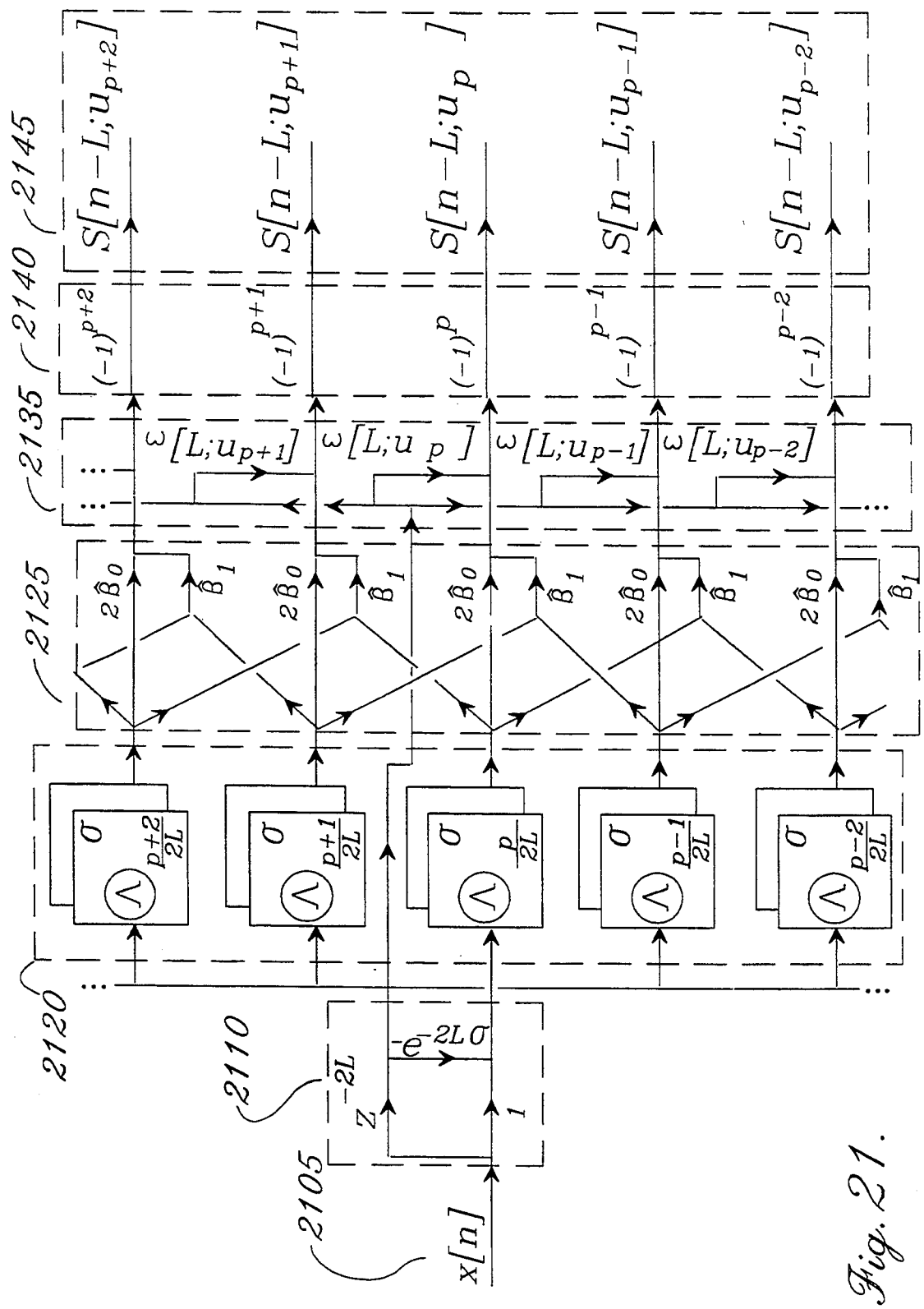
FIG. 21 is a schematic representation of a parallel modulated window based architecture for generating sliding window Fourier transform lines at equal interval frequency bin spacings for Q=1.

An embodiment for the bank of shared $\Lambda$ filters for generating sliding window Fourier transforms is illustrated FIG. 21 for Q=1. The input 2105 is fed into delay line circuitry 2110 which services the entire bank of $\Lambda$ filters 2120. For Q=1, each $\Lambda$ filter services three sliding window Fourier transform frequency lines. The output are weighted proportional to the Fourier series coefficients 2125 and are combined with the end point correction factors 2135. These sums are then weighted 2140 by $(-1)^p$ to generate sliding window Fourier transform frequency lines 2145. If, instead of weighting by $(-1)^p$, a magnitude squared operation is performed, then the output lines become the spectrogram lines.

The architecture in FIG. 21 can clearly be extended to larger values of Q using basically the same bank of $\Lambda$ filters. Additional $\Lambda$ filters would have to be added to contribute to the lower and higher spectral lines. Extending from Q=1 to Q=3, for example, would require the addition of two $\Lambda$ filters and the low frequency end and two at the high frequency end. In general, for P frequency lines, a total of P+2Q $\Lambda$ filters are required.

Figure 22:
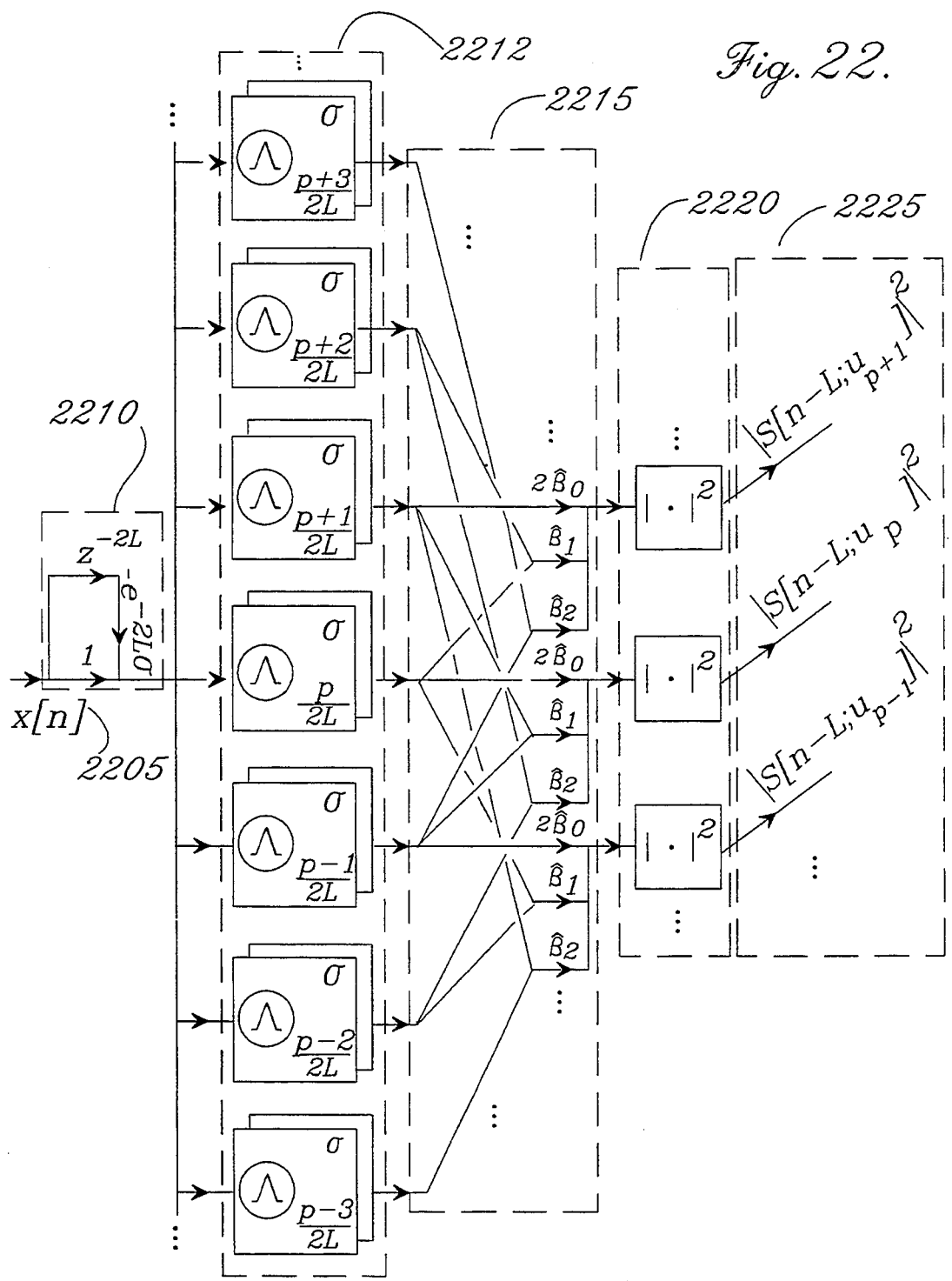
FIG. 22 is a schematic representation of a parallel modulated window based architecture for generating spectrogram lines at equal interval frequency bin spacings for Q=2 without end point correction.

Those Λ filters not at either end will contribute to a total of 2Q+1 frequency lines. Note that this architecture can also be implemented using FIR embodiments of the Λ filter-delay line circuitry combination. sliding window Fourier transform An embodiment for parallel generation of a spectrogram using a bank of Λ filters without end point correction for Q=2 (e.q. for Blackman windows) is shown in FIG. 22. The input 2205 is fed to delay circuitry 2210 the output of which serves the bank of Λ filters 2212. The outputs of the filter bank are weighted by Fourier coefficients, combined 2215, and magnitude squared 2220 to give the spectrogram frequency lines 2225. All of the fanouts from the bank of Λ filters are not shown. If, for example, there was to be a frequency line generated at $$u = \frac{p+2}{2L},$$

then the Λ filter in the bank 2212 parameterized by $$\frac{p}{2L}$$

would make a contribution. Note, also, that the value of Q can be allowed to vary form output line to output line as can the values in the $\bar{\beta}_p$. This same statement applies to the corresponding processor in FIG. 21 for the generation of the real and imaginary components of the sliding window Fourier transform. Note that this architecture can also be implemented using FIR embodiments of the Λ filter-delay line circuitry combination.

Implementation of Disjoint Unmodulated Windows Using a Single Delay Line. Parallel implementation of the circuitry in FIG. 1 using an unmodulated window, damped or undamped, as illustrated 750, 755 in FIG. 7 for the damped case, required a delay line for each sliding window Fourier transform frequency line. With the modulated window, a single delay line can serve the entire processor as is illustrated in FIGS. 19, 20, 21 and 22. In disjoint form, the unmodulated window can also be used to generate sliding window Fourier transform and spectrogram circuitry in parallel with the use of a single delay line. Discussions of this capability and corresponding illustrative architectures are the topics of this section.

From Eq. 34, $$S[n=L;u] = e^{-j2\pi(n-L)u}\{(x[n]e^{j2\pi nu}) * \hat{\omega}[n-L]\} \quad (60)$$

where $\hat{\omega}[n-L]$ is the shifted version of the damped window $\omega[n]$ in Eq. 29. The undamped case will not be treated separately since it a special case of the dampened architectures when $\sigma=0$. The window expression in Eq. 32 can be written as $$\hat{\omega}[n-L] = \hat{h}[n] * \{\delta[n] - e^{-2\sigma L}\delta[n-2L]\} + \hat{\omega}[L]\delta[n-2L] \quad (61)$$

Figure 23:
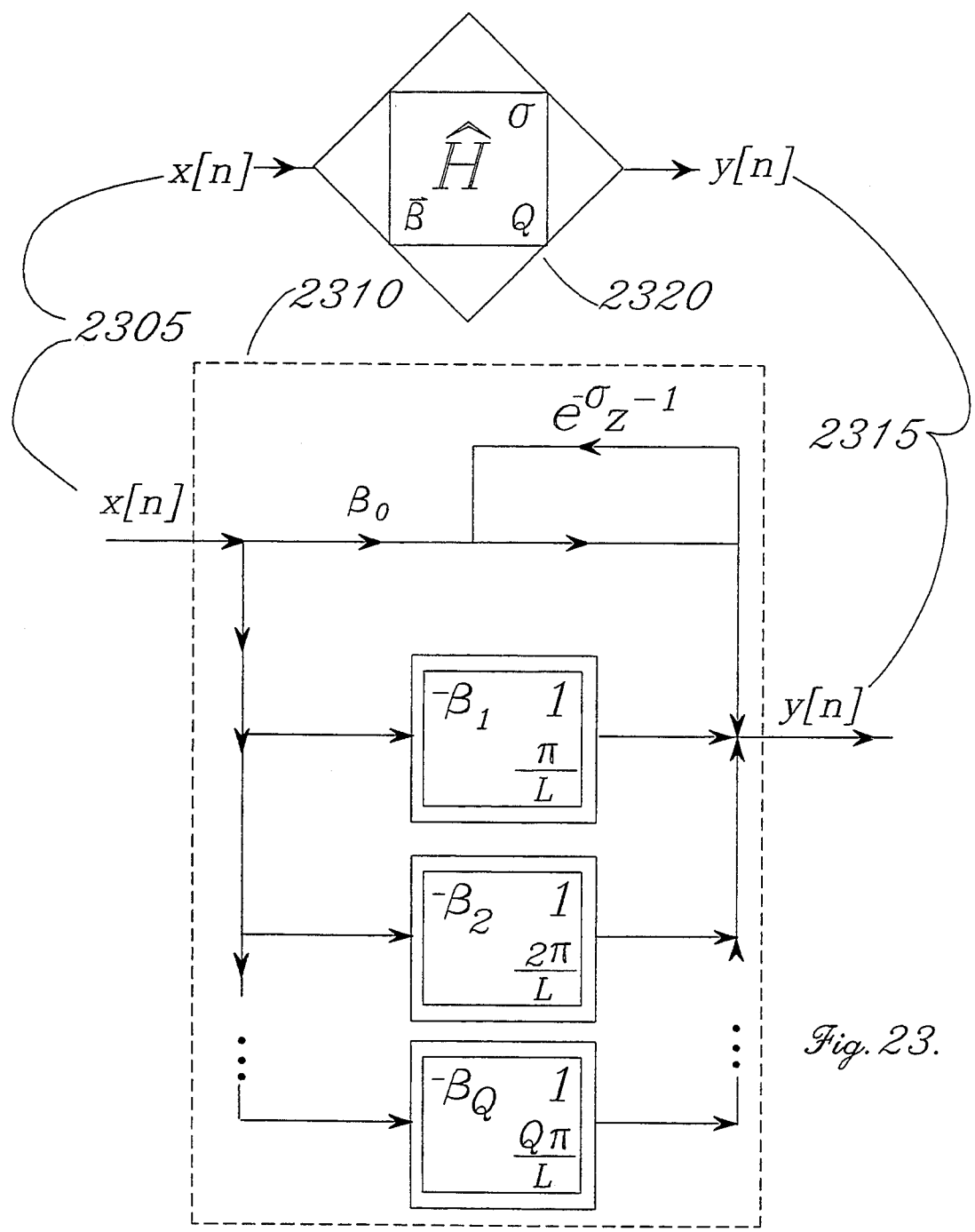
FIG. 23 is a schematic representation of circuitry for a damped resonant circuit.

The impulse response, $\hat{h}[n]$, is that of the damped resonant circuit and, for this discussion, is given by Eq. 35. For a given Q, a processor architecture with transfer function $$\hat{H}(z) = \sum_{k=0}^{\infty} \hat{h}[k]z^{-k} \quad (62)$$

is shown in FIG. 23. The input 2305 is fed to a digital filter 2310 the composite impulse response of which is $\hat{h}[n]$ to generate the desired output 2315. The damped resonant circuit will schematically be denoted by the appropriately parameterized diamond 2320 in FIG. 23.

Substitution of Eq. 61 into Eq. 60 followed by straightforward convolution algebra results in the expression $$S[n-L;u] = \hat{\omega}[L]x[n-2L]e^{-j2\pi Lu} + e^{-j2\pi(n-L)u} \\ \times [\hat{h}[n] * \{e^{j2\pi nu}(x[n] - e^{-2\sigma L}e^{-j4\pi uL}x[n-2L])\}] \quad (63)$$

Figure 24:
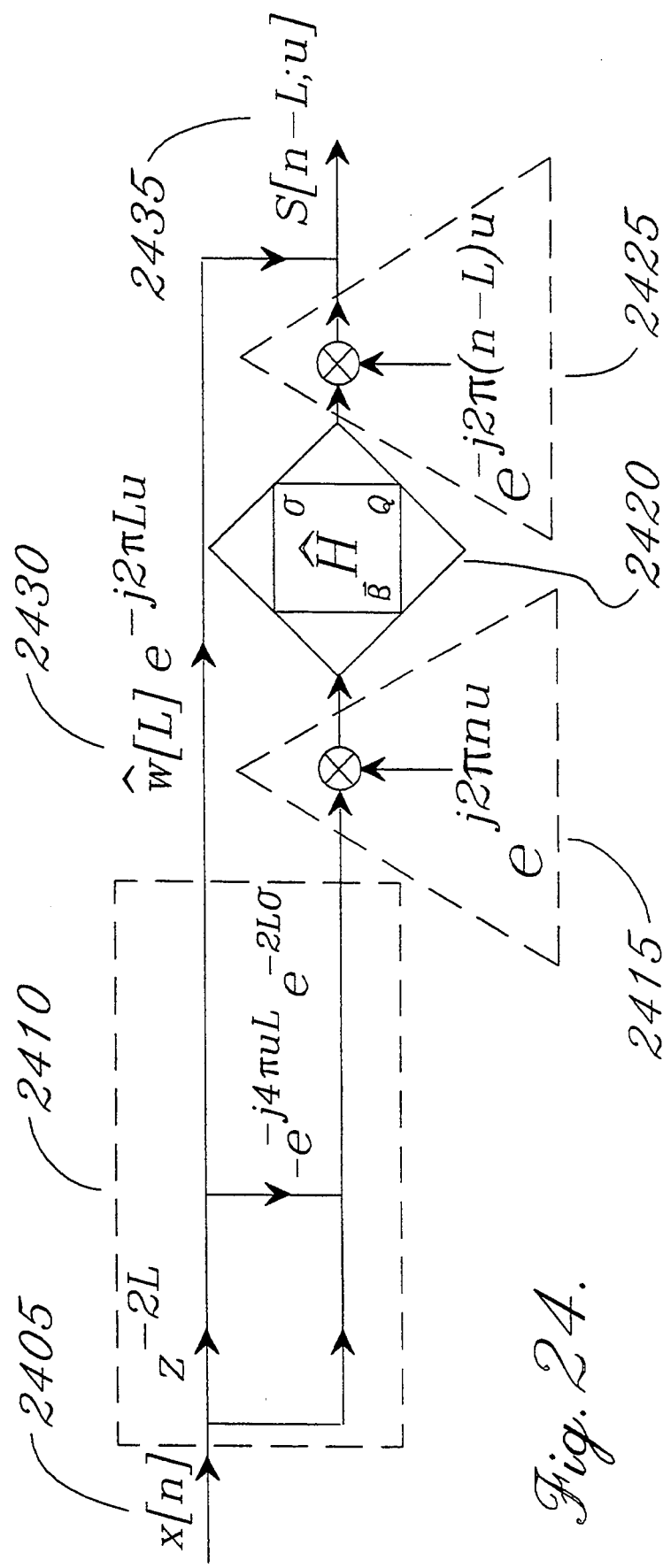
FIG. 24 is a schematic representation for the generation of the sliding window Fourier transform using a disjoint unmodulated window with the delay circuitry at the front end.

An architecture for generating a spectral line based on this expression is shown in FIG. 24. The input 2405 feeds delay circuitry 2410 the output of which is premultiplied by a temporally varying complex exponential 2415, passed through an $\hat{H}$ filter 2420 and is post multiplied by a temporally varying sinusoid 2425. This output is then added to the end point correction factor 2430 to give the real and imaginary components of the sliding window Fourier transform 2435. The exp(j2πLu) term in the post multiply 2425 term, exp[−j2π(n−L)u], can alternately be generated by a multiply at a number of other locations including before or after the $\hat{H}$ filter or the pre-multiply 2415. Note that in this embodiment, and in those to be described, that the disjoint unmodulated window does not appear in a lumped form as schematically depicted in FIG. 1. It's components (the $\hat{H}$ filter and the delay line) are not connected. This is the reason for the use of the word disjoint in the description of the window.

Figure 25:
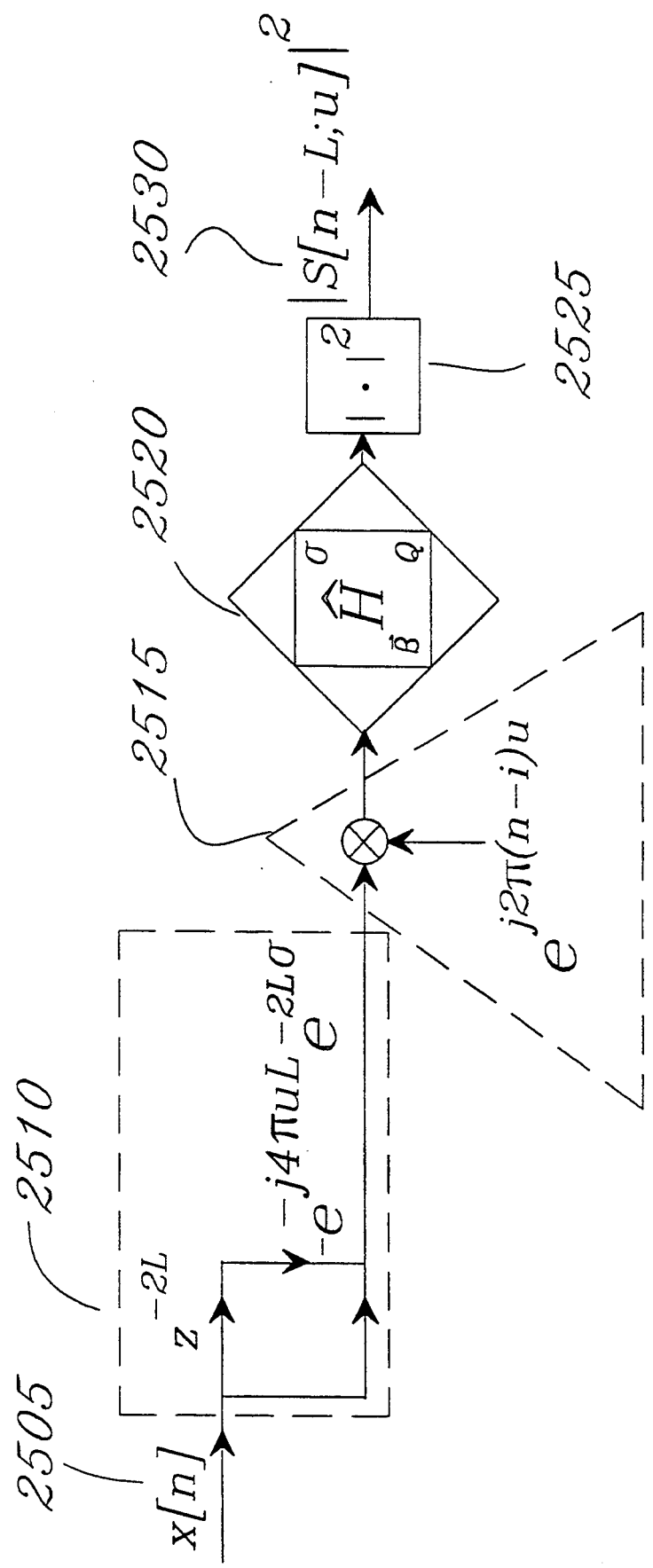
FIG. 25 is a schematic representation for the generating the a spectrogram line without end point correction using a disjoint unmodulated window with the delay circuitry in the front end.

As in previous cases, the sliding window Fourier transform processor in such embodiments can be modified to display the output spectrogram resulting in a reduction of the required number of FLOPS. Without end point correction, the squared magnitude of Eq. 63 can be written as $$|S[n-L;u]|^2 = |\hat{h}[n] * \{e^{j2\pi(n-i)u}(x[n] - e^{-2\sigma L} \\ -j4\pi uLx[n-2L])\}|^2 \quad (64)$$

where the effects of the arbitrarily chosen positive number, i, are totally eliminated by the magnitude squared operation. An embodiment of an architecture corresponding to Eq. 64 is shown in FIG. 25. The input 2505 is fed into weighted delay circuitry 2510, the output of which is multiplied by a time varying complex sinusiod 2515 and placed through an $\hat{H}$ filter 2520 and is magnitude squared 2525 to generate the desired squared magnitude output 2530.

As with other embodiments, the sliding window Fourier transform and spectrogram processors in FIGS. 24 and 25 may be sequentially fed signals to generate a number of sliding window Fourier transform or spectrogram lines or used to continually generate a single line of a sliding window Fourier transform or spectrogram output.

Figure 26:
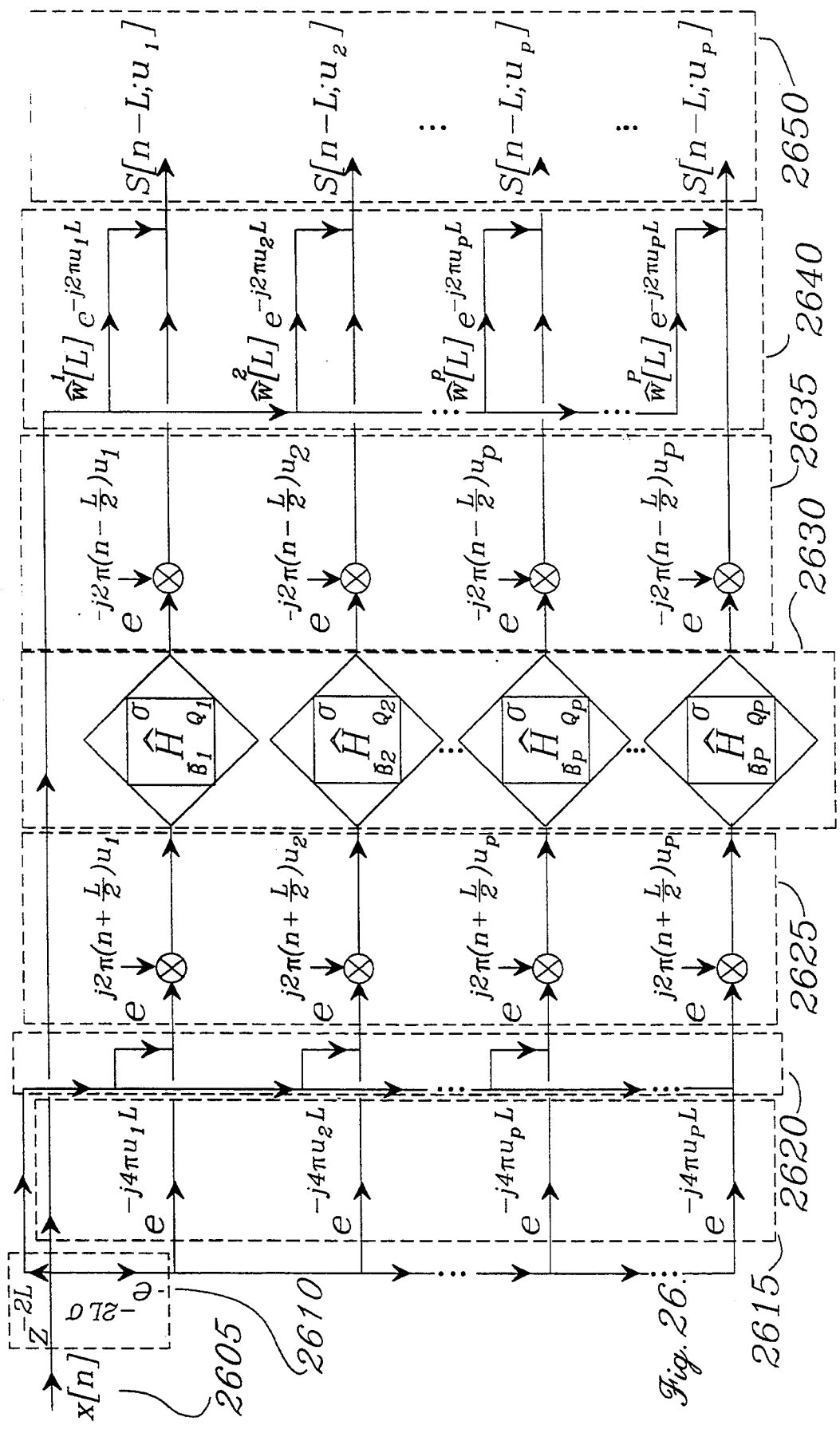
FIG. 26 is a schematic representation of a method for parallel generation of the sliding window Fourier transform at arbitrarily spaced frequency bins using a joint unmodulated window and a single delay line.

The parallel embodiments of the processor require only a single delay line. For $1 \leq p \leq P$, Eq. 63 can be replicated as $$S[n-L;u_p] = \hat{\omega}^p[L]x[n-2L]e^{-j2\pi Lu_p} + e^{-j2\pi(n-L)u_p} \\ \times [\hat{h}^p[n] * \{e^{j2\pi nu_p}(x[n] - e^{-2\sigma L}e^{-j4\pi u_pL}x[n-2L])\}] \quad (65)$$

where, although the variation is applicable to other embodiments, the notation here explicitly notes the allowance of the windows, $\hat{\omega}^p[n]$, and therefore corresponding impulse responses, $\hat{h}^p[n]$, to vary for varying p. One embodiment of the corresponding processor is shown in FIG. 26. The input 2605 is fed to delay circuitry 2610 which services the remainder of the processor. The delayed signal is weighted by complex phase terms 2615 and is recombined with the undelayed signal 2620. The combination is placed into a bank of pre-multipliers 2625 which service a bank of Ĥ filters 2630 and the outputs are post multiplied 2635 by time varying complex exponentials. The multiplier values of $\exp(\pm j2\pi(n\pm\frac{1}{2})u_p)$ were chosen here in part to illustrate the flexibility of placement of the term $\exp(j2\pi Lu)$ (in the post multiply 2425 in FIG. 24) in the processing architecture. The outputs of the post multipliers are added to the end point correction factor 2640, equal to $\omega^p[L]\exp(-j2\pi u_p L)$ for the pth stage, to give the real and imaginary components of the sliding window Fourier transform lines as output 2650.

Figure 27:
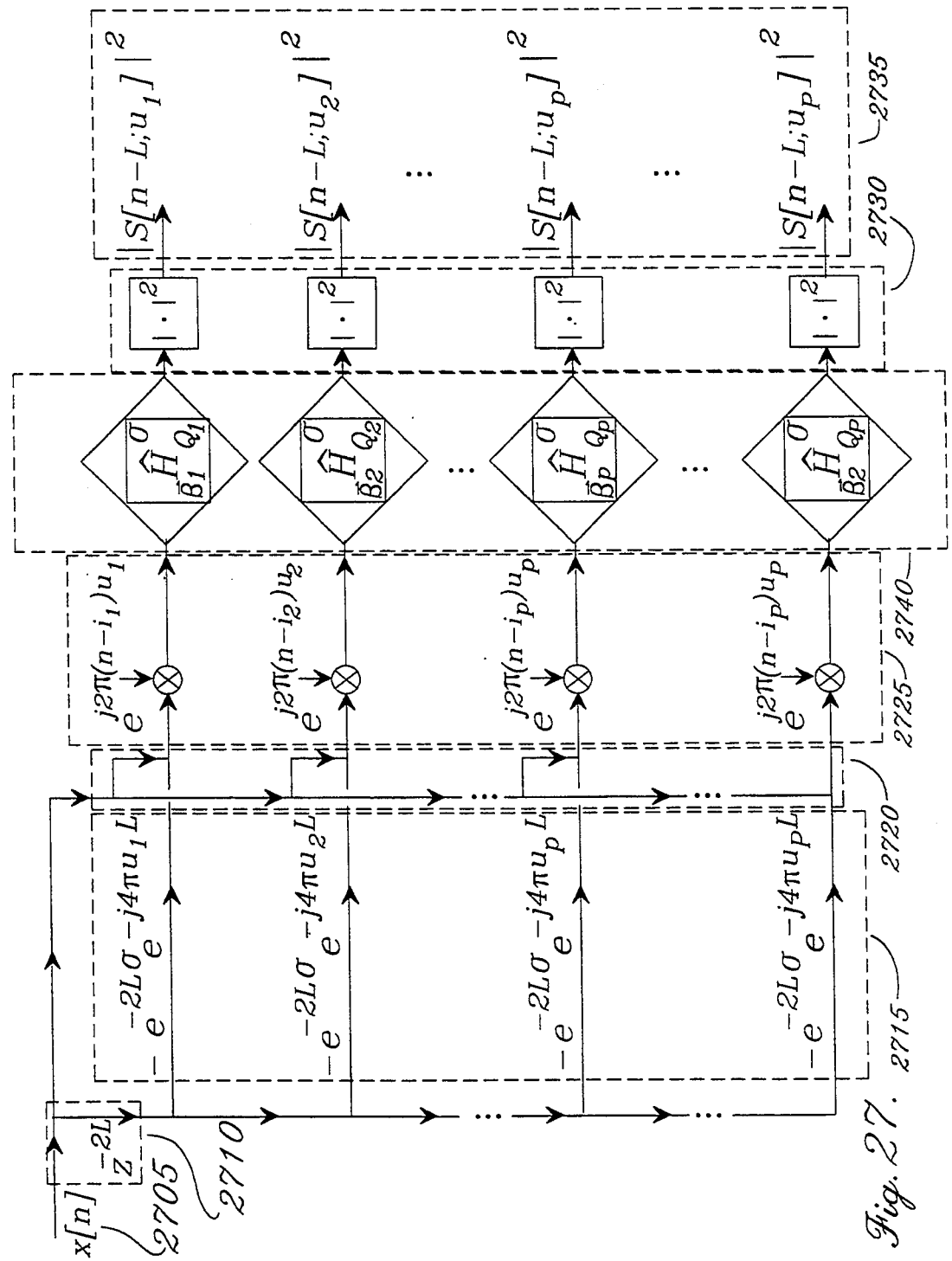
FIG. 27 is a schematic representation of circuitry for parallel generation of the spectrogram without end point correction at arbitrarily spaced frequency bins using a disjoint unmodulated window and a single delay line.

An architecture for generating the spectrogram lines based upon replication of the processor type illustrated in FIG. 25 is shown in FIG. 27. With reference to Eq. 64, the processor is computing $$|S[n-L;u_p]|^2 = |\hat{h}_p[n]*\{e^{j2\pi(n-ip)u_p}(x[n]-e^{-2\sigma L}e^{-j4\pi u_p^L}x[n-2L])\}|^2 \quad (66)$$

A single delay line is required for the entire processor. End point correction circuitry is not included. The input 2705 is fed into delay circuitry 2710 which serves the entire processor. The exponential term, $\exp(-2\sigma L)$, present in the delay circuitry 2610 of FIG. 26, is not included here. It is, rather, combined with the weighting factors 2715 of the delayed signal. The weighted delay signals are added 2720 to the original signal, fed into the pre-multipliers 2725 with arbitrary phase, $\}i_p|1\leq p\leq P\}$, which, in turn, are fed into a bank 2740 of Ĥ filters whose outputs are magnitude squared 2730. The result is spectrogram lines 2735.

Equally Spaced Frequency Lines Using Disjoint Unmodulated Windows and a single Delay Line. The computational requirements for generating sliding window Fourier transforms and spectrograms using disjoint unmodulated windows and a single delay line are less when the frequencies are integer multiples of the inverse of $$2L \left( \text{i.e. } u_p = \frac{p}{2L} \right).$$

It follows that $\exp(-j4\pi u_p L)=1$. Thus, the bank of complex multiples 2615 such as is required in FIG. 26 is not longer required. Furthermore, $\exp(\pm j2\pi Lu_p)=(=1)^p$ becomes a much easier number by which to multiple. In such cases, Eq. 63 becomes $$S[n-L;u_p]=(-1)^p\{\hat{\omega}^p[L]x[n-2L] + W_{2L}^{-np}[\hat{h}^p[n]*\{W_{2L}^{np}(x[n]-e^{-2\sigma L}x[n-2L])\}]\} \quad (67)$$

where the frequency lines are now parameterized and $$W_{2L}^j = e^{j\pi J/L}. \quad (68)$$

Figure 28:
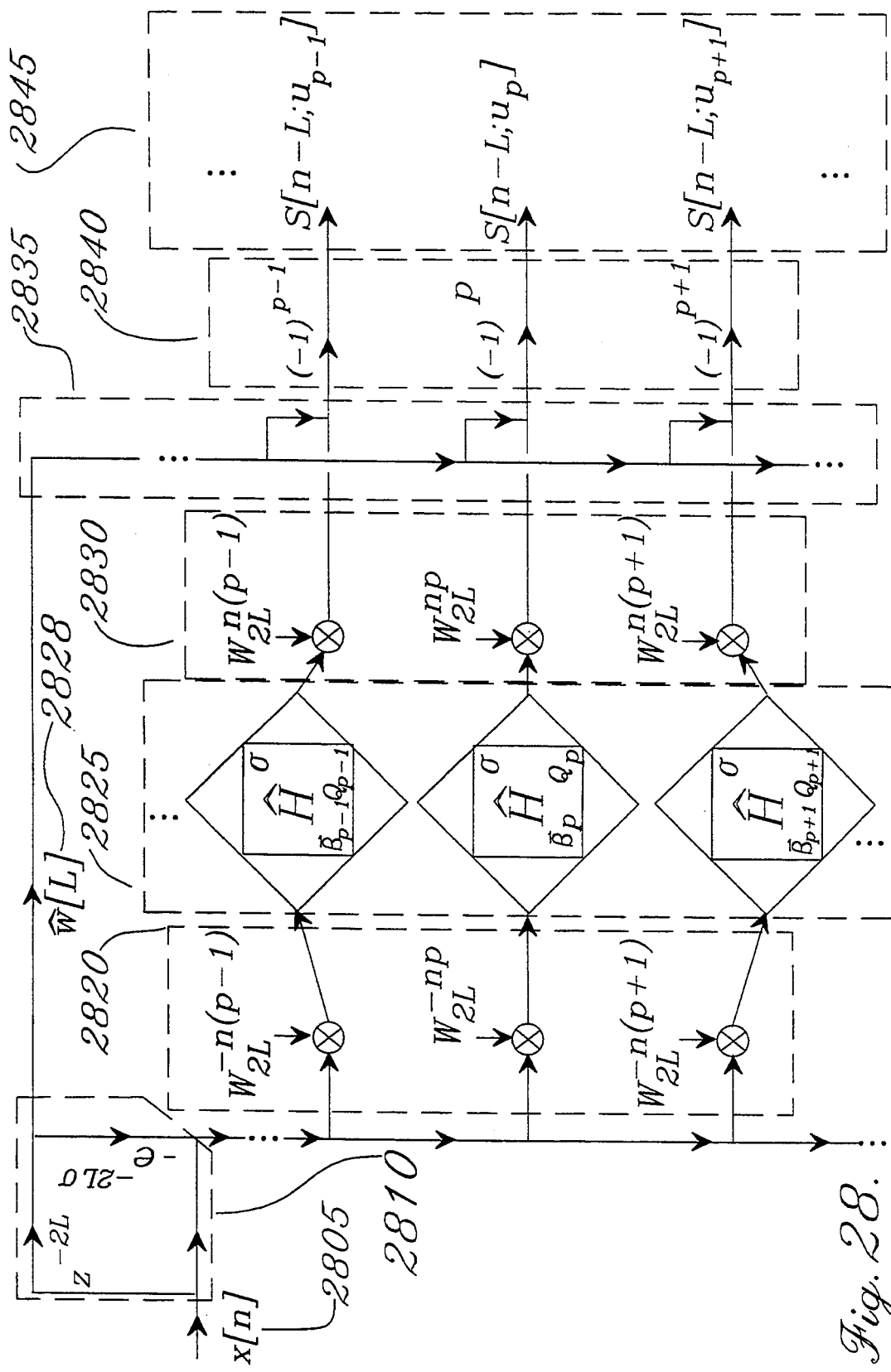
FIG. 28 is a schematic representation for the parallel generation of the sliding window Fourier transform components of a spectrogram when the frequency bins are $$u_p = \frac{p}{2L}$$

A corresponding architecture is illustrated in FIG. 28. The input 2805 feeds the delay circuitry 2810, the output of which services a number of pre-multipliers 2820. As before, the outputs of the pre-multipliers are fed to a bank of Ĥ filters 2825, the outputs of which are post multiplied by time-varying complex sinusoids 2830. These outputs are added 2835 to the end point correction factor 2828 and are then weighted 2840 by $(-1)^p$ to give the real and imaginary components of the sliding window Fourier transforms lines 2845. For equally spaced frequency lines, Λ filters in adjacent K filters can be shared, resulting in, for example, the circuitry in FIGS. 21 and 22 instead of those in FIGS. 19 and 20. Similar sharing of common component filters can similarly be performed on the circuitry in FIGS. 28 and 29, when the frequency bins are evenly spaced.

A single state of the circuitry in FIG. 28 can be used for sequential generation of sliding window Fourier transform lines.

A further computation reduction can be realized if only the spectrogram is required. The squared magnitude of Eq. 67 deleting end point correction is $$|S[n-L;u_p]|^2 = |\hat{h}^p[n] *\{W_{2L}^{np}(x[n]-e^{-2\sigma L}x[n-2L])\}|^2 \quad (69)$$

An illustration of a corresponding architecture for the parallel implementation in this case is shown in FIG. 29. The input signal 2905 is fed into delay circuitry 2910, the summed output of which feeds the rest of the processor. The summed output is pre-multiplied by time varying sinusoids 2915, passed through Ĥ filters 2920 and magnitude squared 2925. The result 2930 is spectrogram lines.

Output Time Decimation. All of the architectures thus far presented produce spectral lines at a rate identical to that of the input. The architectures can also be configured to generate output spectral lines as a decimated rate of, say, ever N input time units. All of the previous architectures can do this simply so by providing an output every N time units. Other architectures based on coherent cancelation using delay line circuitry that are more computationally efficient will not be discussed.

The causal form of the sliding window Fourier transform in Eq. 1 is rewritten as $$S[n-L;u] = \sum_{k=-L}^{L} x[n-L-k]\tilde{\omega}[k]e^{-j2\pi ku} \quad (70)$$

where the window is rewritten with a tilde to denote that it can be represented by the Szasz series $$\tilde{\omega}[k] = \sum_{k=-Q}^{Q} a_q e^{-s_q k} \quad (71)$$

where Q parameterizes the order of the series and the set of possibly complex Szasz series coefficients and exponential factors are respectively $\}a_q|Q\leq q\leq -Q\}$ and $\{s_q|Q\leq q\leq -Q\}$. Note that the duration of the window in Eq. 70 is truncated by the sum rather than explicitly in Eq. 71 by a rectangle function. The cosine series in Eq. 22 is a special case of $$\tilde{\omega}[k]\Pi\left[\frac{k}{2L}\right]$$

with a corresponding interpretation for the order Q. The series coefficients

TABLE 1

Hanning: $\phi(k) = \cos^2\left(\frac{\pi k}{2L}\right)$, Q = 1.

TABLE 1-continued

| q | $\alpha_q$ | $s_q$ |
|---|---|---|
| 1 | ¼ | $j\pi/L$ |
| 0 | ½ | 0 |
| −1 | ¼ | $-j\pi/L$ |

TABLE 2

Hamming: $\phi(k) = 0.54 + 0.46 \cos\left(\dfrac{\pi k}{L}\right)$, $Q = 1$.

| q | $\alpha_q$ | $s_q$ |
|---|---|---|
| 1 | 0.23 | $j\pi/L$ |
| 0 | 0.54 | 0 |
| −1 | 0.23 | $-j\pi/L$ | and exponential factors corresponding to Hanning, Hamming and Blackman windows are shown respectively in Tables 1, 2 and 3.

The decomposition of the sliding window Fourier transform line into components is $$S[n - L;u] = \sum_{q=-Q}^{Q} \alpha_q S_q[n - L;u] \tag{72}$$

where $$S_q[n - L;u] = \sum_{k=-L}^{L} x[n - L - k] e^{s_q k} e^{-j2\pi k u} \tag{73}$$

To illustrate how the rate of the spectral lines can be decimated, Eq. 73 is

TABLE 3

Blackman: $\phi(k) =$ $0.42 + 0.5 \cos\left(\dfrac{\pi k}{L}\right) + 0.08 \cos\left(\dfrac{2\pi k}{L}\right)$, $Q = 2$.

| q | $\alpha_q$ | $s_q$ |
|---|---|---|
| 2 | 0.04 | $j2\pi/L$ |
| 1 | 0.25 | $j\pi/L$ |
| 0 | 0.42 | 0 |
| −1 | 0.25 | $-j\pi/L$ |
| −2 | 0.04 | $-j2\pi/L$ | shifted by N time units.

$$S_q[n - N - L;u] = \sum_{k=-L}^{L} x[n - L - N - k] e^{s_q k} e^{-j2\pi k u} \tag{74}$$

$$= e^{-(s_q - j2\pi u)N} \sum_{k=-L+N}^{L+N} x[n - L - k] e^{s_q k} e^{-j2\pi k u}$$

The summand is the same as that in Eq. 73, but the summation limits are different. Note that $$\sum_{k=-L}^{L} = \sum_{k=-L+N}^{L+N} + \sum_{k=-L}^{-L+N-1} - \sum_{k=L+1}^{L+N} \tag{75}$$

Substitution into Eq. 73 followed by application of Eq. 74 gives the following recursion relation for the decimated spectrum output $$S_q[n - L;u] = e^{(s_q - j2\pi u)N} S[n - N - L;u] + S_N^{\pm}[n] \tag{76}$$

where $$S_N^{\pm}[n] = \left\{\sum_{k=-L}^{-L+N-1} - \sum_{k=L+1}^{L+N}\right\} x[n - L - k] e^{(s_q - j2\pi u)k}. \tag{77}$$

As with previous cases, the new sliding window Fourier transform value is obtained by the weighted superposition of the previous sliding window Fourier transforms value with contributions of data no longer in the window subtracted and newly introduced data contributions added. The adjustment terms corresponding to new and old data (i.e. the $$-\sum_{k=-L}^{-L+N-1} + \sum_{k=L+1}^{L+N}$$

term in Eq. 77) are, themselves, recognized as sliding window Fourier transforms. Evaluation of $S_N^{\pm}[n]$ using a standard FIR filter will first be described. Alternate architectures based on truncated resonant circuitry are then presented.

A standard FIR architecture for $S_N^{\pm}[n]$ is shown in FIG. 30. The input 3005 is introduced into a delay line 3010 with 2L+N unit delays. Only the first N−1 and last N−1 delays 3015, 3020 are tapped and weighted 3055. There are no taps in the middle 3025 of the delay line. The weight of tap from the kth unit delay, when present, is $$X_k = e^{s_q k} e^{-j2\pi u k} \tag{78}$$

A vector of these values is denoted by $\vec{X}$. The sum of the right hand taps is generated 3040 and inverted 3035 and is added to the sum 3030 of the left hand taps. Since interest is only in the output spectral line every N time units, the sum needs to be computed only once per N time units. The box 3060 around ↓ N is the schematic notation for downsampling by a factor of N. The output of this box is the desired output 3045. The processor for generation of $S_N^{\pm}[n]$ is schematically abstracted by an appropriately parameterized box 3050 inside of which is an encircled $S_N^{\pm}$.

Two other architectures for computing $S_N^{\pm}[n]$ in Eq. 77 are shown in FIG. 31. Either can be used as the unit 3050 in FIG. 30. A signal input 3105 3135 into either of the two processors will produce the same 3045 outputs 3130 3160 as when the input signal 3005 into the processor in FIG. 30.

The first processor 3110 makes use of the identity $$S_N^{\pm}[n] = S_N^+[n] - S_N^-[n] \tag{79}$$

where $$S_N^+[n] = \sum_{k=-L}^{-L+N-1} x[n - L - k] e^{(s_q - j2\pi u)k}. \tag{80}$$

and $$S_N^-[n] = \sum_{k=L+1}^{L+N} x[n - L - k] e^{(s_q - j2\pi u)k}. \tag{81}$$

It follows that $$S_N^-[n] = e^{(2L+1)(s_q - j2\pi u)} S_N^+[n - 2L - 1] \tag{82}$$

The architecture 3110 at the top of FIG. 31 follows. The input 3105 is fed into an FIR filter 3111, the output of which is downsampled 3114 to yield $S_n^-[n]$. This signal, at a clock rate equal to $$\frac{1}{N}^{th}$$

that of the input 3105, is fed to delay line circuitry 3116 that produces an output of $S_N^+[n]$ via Eq. 82 (The notation $z_N^{-1}$ denotes a delay of N time units). The terms are combined to give the sliding window Fourier transform output 3130. A second embodiment 3140 that is a variation on this approach simply interchanges the order of the delay circuitry 3142 and the FIR filter 3144. The downsampler 3146 is now at the output. For the same input 2135, the same output 3160 is generated.

An IIR filter 3170 that is an alternate architecture to compute $S_N^+[n]$ is also shown in FIG. 31. This processor can be substituted for the FIR filters 3111 3144. The output 3180 is set to zero and N iterations over the appropriate interval of the input 3175 will produce an output of $S_N^+[n]$. The output is again set to zero and the filter awaits the next applicable set of N input points, etc.

Given an architecture to compute $S_N^\pm[n]$ 3050, the spectral line given in the recursive relation in Eq. 76 can be generated using the architecture shown if FIG. 32. The previous output 3210 of the processor, $S_q[n-L-N;u]$, is made available through a delay 3220. This output is added to $S_N^\pm[n]$ which is generated by the circuitry 3230 shown. This sum is weighted 3235 to give the desired spectral line output component 3215. This processor is schematically abstracted with an appropriately parameterized bold circle 3250 inside of which is a boxed S.

The sum in Eq. 72 can be implemented by connecting $2Q+1$ of the $S_q$ processors in parallel. An example for $Q=1$ (e.g. Hanning and Hamming windows) is illustrated in FIG. 33. The input 3305 is fed to a bank 3310 of $2Q+1=3$ filters corresponding, from top to bottom, to $q=1,0,-1$. the qth filter is parameterized by a given u and $\vec{X}_q$ (i.e. the parameter q is used in the vector). The outputs of the filters are weighted by the corresponding $a_q$ coefficients 3315 and are summed to give the desired decimated sliding window Fourier transform output 3320. Alternately, the weighting by the $a_q$ coefficients can be done prior to rather than after the filter bank operation. If the spectrogram is required, then the output 3320 can be subjected to a magnitude squared operation. Note also, as with previous embodiments, the delay circuitry common to each of the S filters can be factored so that a single delay line services the entire bank.

In many cases of interest (e.g. Hamming, Hanning and Blackman), the $a_q$ coefficients are even. In other words, $a_q=a_{-q}$. In such cases, the outputs of the qth and $-q$th filters can be added prior to weighting by $a_q$ thereby saving Q multiply operations. This is illustrated in FIG. 34 for $Q=2$ (e.g. Blackman). The input 3405 is fed to a bank 3410 of $2Q+1=5$ filters parameterized by u and $\vec{X}_q$. The outputs of filters corresponding to $q>0$ are added to the $-q$th filter output 3420. These terms are weighted by the $a_q$ coefficients 3425. The results are added 3430 to produce the desired sliding window transform output 3435. As before, the delay circuitry common to each of the S filters can be factored so that a single delay line services the entire bank.

As in previous architectures, the embodiments of the sliding window Fourier transform architectures illustrated in FIGS. 33 and 34 and their variations can be used sequentially or can be replicated spatially to generate output frequency lines in parallel. As before, the window shape can be varied from frequency line to frequency lines and the frequency bins can be placed with arbitrary spacing.

Note that use of a single circuit of the type described in this section (e.g. in FIG. 33 or 34) parameterized by $u=0$ is an unmodulated window that generates a decimated sliding window operation.

Equal Spaced Frequency Bins and Decimation. As was the case with the $\Lambda$ filters, parallel embodiments of architectures for the decimated sliding window Fourier transform or spectrogram can be configured to share subprocessors when the spacing between frequencies is chosen to be uniform. Specifically, let $u=p\Delta$ where $\Delta$ is the uniform spacing. Furthermore, let $s_q=-\sigma+j2\pi q\Delta$. As before, $\sigma$ is a damping factor and can be set to zero for the undamped case. Under these conditions, Eq. 73 becomes $$S_q[n-L;u] = \sum_{k=-L}^{L} x[n-L-k]e^{-\sigma k}e^{-j2\pi(p-q)k\Delta} \quad (83)$$

$$\equiv \Xi[n-L;p-q]$$

The utility of the redefinition of this Szasz component of the sliding window Fourier transform as a $\Xi$ (xi—pronounced see) filter will become evident shortly. The following recursion can be established from Eq. 83.

$$\Xi[n-L;p] = e^{-\sigma N}e^{-j2\pi pN\Delta}\Xi[n-L-N;p] + \quad (84)$$
$$\Xi_N^\pm[n;p]$$

where $$\Xi_N^\pm[n;p] = \quad (85)$$

$$\left(\sum_{k=-L+N-1}^{L} - \sum_{k=L+1}^{L+N}\right) x[n-L-k]e^{-\sigma k}e^{-j2\pi pk\Delta}$$

An architecture for generating the recursion for the $\Xi$ filter in Eq. 84 is illustrated in FIG. 35. The input 3505 is input into an appropriately parameterized $\Xi_N^\pm$ filter 3510 which is exactly the same as the $S_N^\pm$ filter 3230 in FIG. 32 when $$X_k = e^{-\sigma k}e^{-j2\pi pk\Delta}. \quad (86)$$

is used. The output of the $\Xi_N^\pm$ filter is fed into an IIR filter 3520 which generates the desired output 3525 by computational evaluation of the recursion in Eq. 84. The schematic representation 3530 of this circuitry is shown as two intersecting rectangles, appropriately parameterized, with a $\Xi$ written in the center. When replicated in a bank 3610 3710, such as illustrated in FIGS. 36 and 37, the delay line may be factored from each $\Xi$ filter so that a single delay line feeds the entire bank.

A bank of $\Xi$ filters can be used to efficiently generate spectral lines in parallel when the frequency bins are evenly spaced. For a given Q, the generation of the spectral line at $u=p\Delta$ uses $2Q+1$ of the $\Xi$ filters parametered by p on the interval $-Q\leq p\leq Q$. The frequency line at $u=(p+1)\Delta$ uses $\Xi$ filters in the interval $-Q+1\leq p\leq Q+1$. There is only one $\Xi$ filter that was not used in u=pΔ sliding window Fourier transform line that is not used here. As illustrated in FIG. 36 for Q=2, a single Ξ filter can therefore contribute to the output of a number of frequency lines. Here, the input 3605 is fed to a bank 3610 of Ξ filters, the outputs of which are weighted by desired Szasz series coefficients and combined 3615 to generate the spectral line outputs 3620 in parallel. Note that the requirement that the frequency lines be equally spaced does not dictate that the windows be the same for each frequency line. Note that, due to the linear time invariance of the circuitry, the interconnect circuitry 3615 can be placed before the Ξ filter bank 3610 without affecting the result 3620.

A simplified embodiment of the architecture illustrated in FIG. 36 is possible when the $a_q$ coefficients are even functions of q, i.e. $a_q = a_{-q}$. This is illustrated in FIG. 37 for Q=1. The input 3705 is again applied to the Ξ filter bank 3710. The outputs at either side of a desired frequency line, now, however, are added prior to being weighted by $a_1$. For Q=2, the outputs two filters removed would also be added prior to weighting by $a_2$, etc. The results of these weighted combinations are added 3715 to generate the output spectral lines in parallel 3720. As before, the interconnect circuitry 3715 can be placed prior to the Ξ filter bank 3710 without effecting the output 3720.

Although no specifically indicated in FIGS. 36 and 37, the windows can be varied from one frequency line to the next by controlling the number and value of the $a_q$ coefficients contributing to a frequency line. Note also in FIGS. 36 and 37 that the placing of the interconnect circuitry prior to the Ξ filter bank requires a higher clock rate in the interconnect circuitry.

Architecture Variations. In this section, some of the other architecture variations applicable to the implementation of the DSP processing methods described in this document are discussed.

There can exist a number of implementations of digital circuitry for a given impulse response. One can, for example, combine the q=0,1 stages 920, 925 in FIG. 9 by writing the z transform transfer function equations for the q=0 stage 920 and the q=1 stage 925 and combine them with a common denominator. The resulting equation can be implemented in the Direct for II method described by Oppenheim, Willsky and Young, Signals and Systems, (Prentice Hall, New Jersey, 1983). The resulting circuitry will be different than that in FIG. 9, yet the input-output relationship will be identical. Indeed, similar procedures can be applied to combine the delay, end point correction and resonant circuitry. Such design variations are well known to those well versed in the art.

As has been noted, linear time invariant components in series within a circuit can be interchanged in order without changing the composite response. In FIG. 14, for example, the coefficient multiplication 1415 can be done after the Λ filter bank 1420 rather than before, as is shown. Similarly, the series combination of $h_2[n]$ followed by the delay, $-z^{-6}$ at the top of the processor 220 in FIG. 2 can be reversed without affecting the composite impulse response 230 of the entire processor 220. Such commutative aspects of digital filters are well known to those skilled in the art.

Figure 5:
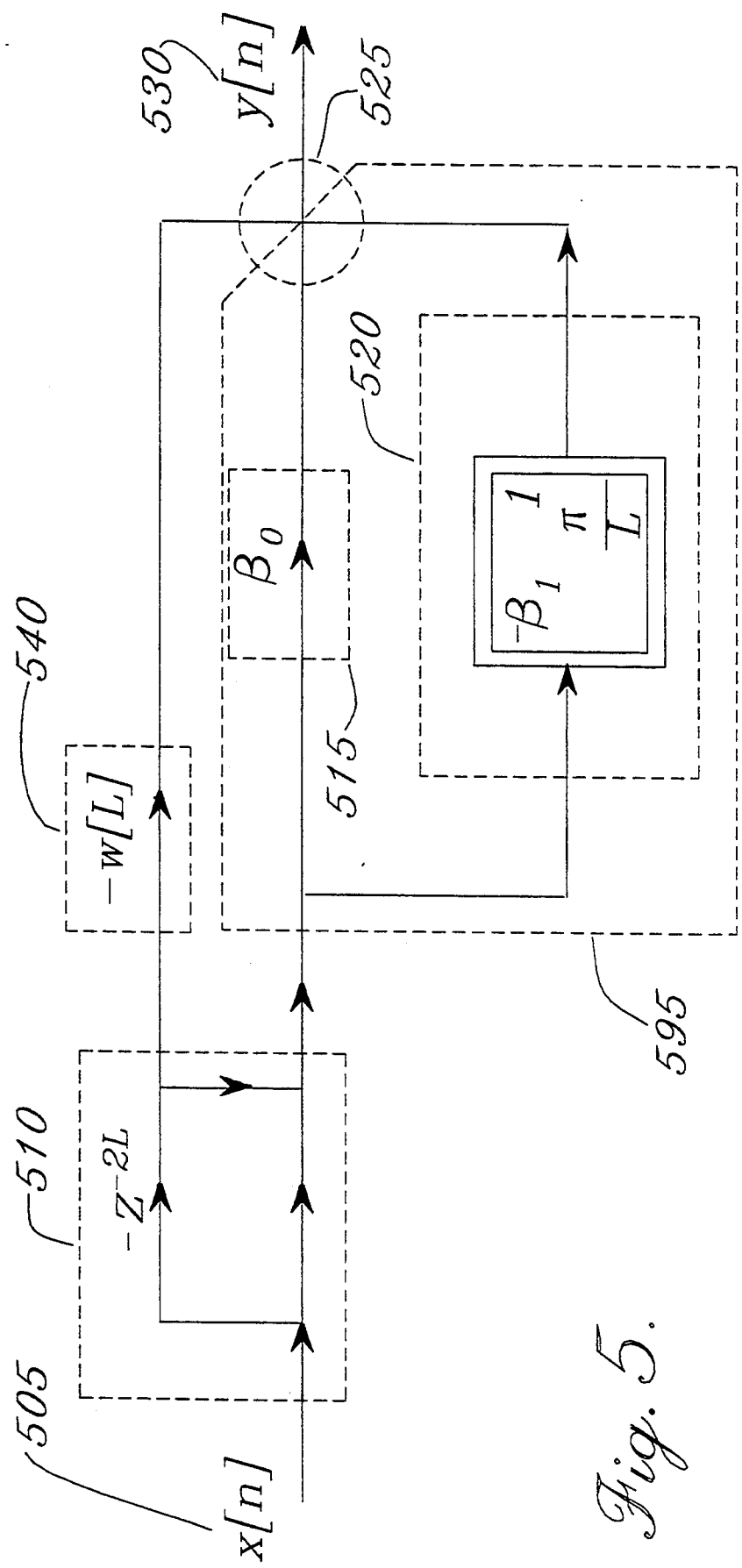
FIG. 5 is a schematic representation of periodic resonant and delay circuitry to generate a class of sliding windowed Fourier transforms, including Hanning and Hamming windowed transforms, with end point correction.

In many cases of application, only a proportional value of a sliding window Fourier transform, spectrogram or window is required. In such cases, for example, all of the values of the $\beta_q$'s can be weighted by some appropriately chosen value. In FIG. 5, for example, the weight $\beta_0$ in the q=0 stage 515, for example, can be replaced by one if the value of $\beta_1$ in the q=1 stage is replaced by $\beta_1/\beta_0$ and the end point correction weight 540 is changed from $-\omega[L]$ to $-\omega[L]\beta_0$. The output 530 would then be changed from y[n] to y[n]/$\beta_0$. The resulting filter used, for example, in the two unmodulated window sliding window Fourier transform processors in FIG. 1, would result in outputs of S[n−L;u]/$\beta_0$ instead of S[n−L;u] 135 and |S[n−L;u]/$\beta_0$|² instead of |S[n−L;u]|² 165. Thus, by allowing proportional outputs, a multiply is saved. Such is also the case with the processor in FIG. 33. From Tables 1 and 2, the Szasz series coefficients on Hamming and Hanning embodiments of this architecture obey the symmetry $a_1 = a_{-1}$. Therefore, replacing both $a_{\pm 1}$ by 1 and $a_0$ by $a_0/a_1$ will yield an output of S[n−L;u]/$a_1$ instead of the output shown 3320. Similar scalings and variations in other architectures described in this patent will be apparent to those well skilled in the art.

Sliding window Fourier Transform and Spectrogram Variations. There exists numerous variations of the basic definition of the sliding window Fourier transform on Eq. 1. Using the sine transform instead of the Fourier transform gives $$S_S[n;u] = \sum_{k=-L}^{L} \omega[k]x[n-k]\sin(2\pi ku) \qquad (87)$$

Using the cosine transform gives $$S_C[n;u] = \sum_{k=-L}^{L} \omega[k]x[n-k]\cos(2\pi ku) \qquad (88)$$

Clearly, for real inputs, $$S[n;u] = S_C[n;u] + jS_S[n;u] \qquad (89)$$

and either the sine or cosine transform spectrogram can be obtained by looking at the imaginary or real part of the circuitry output for a sliding window Fourier transform. Similarly, using a Hartley transform, $$S_H[n;u] = \sum_{k=-L}^{L} \omega[k]x[n-k]\text{cas}(2\pi ku) \qquad (90)$$

where $$\text{cas}(\rho) = \cos(\rho) + \sin(\rho). \qquad (91)$$

Clearly, $$S_H[n;u] = S_C[n;u] + S_S[n;u] \qquad (92)$$

can also be generated by combining the real and imaginary outputs of any sliding window Fourier transform processor thus far described. Any person skilled in the art can straightforwardly apply the method described herein to generate these closely related Fourier-based variation definitions of the sliding window Fourier transforms. Evaluation of the squared magnitude of Eqs. 87, 88 or 90 results in corresponding generalized spectrograms. The spectrogram results from squaring the magnitude of Eqs. 89. Any person skilled in the art can straightforwardly apply the methods described herein to generate these closely related Fourier-based variation definitions of the spectrogram.

One dimensional windows can be extended to higher dimension using an outer product, rotation or projection. Two dimensional windows are used, for example, in image processing. The method for designing windows described thus far can be extended to windows in higher dimensions by those skilled in the art.

Applications. Time-frequency representations are used in a number of applications. Sliding window Fourier transforms and spectrograms computed using the truncated resonant circuit approach described in this document are applicable in many of these cases. They include use 1. as a means of representing, displaying, monitoring or otherwise characterizing signals originating from waves including but not limited to electromagnetic, acoustic, electronic (e.g. voltage, current and power) and biological waves;
2. as a method of computing sliding window Fourier transforms, spectrograms or other signal processing operations using sliding windows in software simulations and emulations;
3. as a method of computing sliding window Fourier transforms, spectrograms or other signal processing operations that use sliding windows using computational hardware; and
4. as a method of signal representation in pattern recognition procedures including but not limited to use for fault monitoring, as a template for matched filtering or as training data in a classification or regression machine such as a layered perception artificial neural network.

While the preferred embodiments of the invention have been illustrated and described, variations will be apparent to those skilled in the art. Accordingly, the scope of the invention is to be determined by reference to the following claims.

The embodiments of the invention in which as exclusive property or privilege is claimed are defined as follows:

1. An apparatus for realizing tapered sliding windows and similar finite duration impulse responses, comprising:
   means for receiving a signal input; and
   a composite filter for generating an impulse response of finite duration, comprising:
   first means for generating a first causal impulse response output other than a constant or a single exponential from said signal input means; and
   second means for generating an inverted second causal impulse response output other than a constant or single exponential from said signal input means with a weighted time delay period, said second generating means being connected to said first generating means such that said second causal impulse response is coherently canceled at and beyond said weighted time delay period whereby said composite impulse response output is generated that is equal to said first causal impulse response output up to but not including said weighted time delay period and is zero thereafter.

2. The apparatus of claim 1, wherein said two or more composite infinite impulse response filters are connected in cascade or parallel to generate an impulse response of finite duration.

3. The apparatus of claim 2, further comprising means for generating an end point correction to an output of said two or more connected composite filters.

4. An apparatus for generating tapered sliding windows and similar finite duration impulse responses, comprising:
   means for receiving a signal input; and
   a composite filter with an impulse response of finite duration, comprising:
   means for generating a causal impulse response output other than a constant or single exponential from said signal input means; and
   means for generating an inverted, weighted time delay output of said causal impulse response output for a predetermined period of time, said weighted time delay output generating means being connected to said causal impulse response output generating means such that said inverted, weighted time delay output cancels said causal impulse response output after said predetermined period of time to generate a composite impulse response output equal to that of the causal impulse response output up to but not including the predetermined period of time and than is zero thereafter.

5. The apparatus of claim 4, wherein said causal impulse response output generating means comprises a resonant circuit.

6. The apparatus of claim 5, wherein said inverted, weighted time delay output generating means comprises an inverted, weighted delay line circuitry means that generates a weighted delay line that is additively joined to said casual impulse response output, and further wherein said predetermined period of time is selected to be a period of time sufficient to cause coherent cancellation of said causal impulse response output beyond said predetermined period of time.

7. The apparatus of claim 5, further comprising means for generating an end point correction to said composite impulse response output.

8. The apparatus of claim 4, further comprising two or more composite infinite impulse response filters connected in cascade or parallel to generate a filter with an impulse response of finite duration.

9. The apparatus of claim 8, further comprising means for generating an end point correction to said plurality of windows.

10. The apparatus of claim 5, further comprising a plurality of composite infinite impulse response filters wherein said resonant circuit is synthesized.

11. The apparatus of claim 4, comprising a plurality of composite filters in a filter bank.

12. The apparatus of claim 11, wherein said composite infinite impulse response filter comprises a lambda filter, the outputs of which are weighted and summed in accordance to the desired Fourier synthesis of said windows and one lambda filter services a plurality of signal input receiving means.

13. The apparatus of claim 4, further comprising means for decimating the output thereof, such that decimation downsampling is at least two input time units, and further wherein a contribution common to a sliding window Fourier transform or spectrogram in two adjacent decimated time intervals is updated through a combination delay circuitry and resonant circuitry.

14. The apparatus of claim 13, wherein a parallel combination of infinite impulse response filters synthesizes said resonant circuit, each of said infinite impulse response filters having a response of a predetermined Szasz series component corresponding to a predetermined impulse response.

15. A method for generating tapered sliding windows and similar finite duration impulse responses, comprising the steps of:

receiving an input signal;

generating a first causal impulse response output other than a constant or a single exponential from said signal input;

generating an inverted second causal impulse response output other than a constant or single exponential from said signal input with a weighted time delay period of a predetermined period of time;

coherently canceling said second causal impulse response output at and beyond said predetermined time delay period by combining said second causal impulse response output with said first causal impulse response output such that a composite impulse response output is generated that is equal to said first causal impulse response output up to but not including the predetermined period of time, and is thereafter zero.

16. The method of claim 15, wherein the step of generating a first causal impulse response output further comprises the step of generating a plurality of causal impulse response outputs and said step of generating said second causal impulse response output further includes coherently canceling said plurality of first causal impulse response outputs with said single means for generating an inverted second causal impulse response output with a weighted time delay period.

17. The method of claim 15, further comprising the step of generating an end point correction to said composite impulse response output.

18. A method for generating tapered sliding windows and similar impulse responses, such as tapered sliding window Fourier transforms, comprising the steps of:

receiving an input signal;

generating a causal impulse response output other than a constant or a single exponential from said input signal;

generating an inverted, weighted time delay output from said composite causal impulse with a weighted delay line;

connecting said inverted, weighted time delay output with said causal impulse response output such that said inverted, weighted time delay output cancels said causal impulse response output after said predetermined period of time to generate a composite impulse response output that is equal to the causal impulse response output up to but not including the predetermined period of time and is zero thereafter.

19. The apparatus of claim 18, wherein said two or more composite infinite impulse response filters are connected in cascade or parallel to generate an impulse response of finite duration.

20. The method of claim 18, wherein said step of generating a causal impulse response output and said step of generating an inverted, weighted time delay output for a predetermined period of time are repeated to form a plurality of windows.

21. The method of claim 20, further comprising the step of using a single means for generating an inverted, weighted time delay output to service a bank of lambda filters to thereby generate modulated sliding window Fourier transforms and spectrograms at equally-spaced frequency intervals.

* * * * *